(12) United States Patent
Kim et al.

(10) Patent No.: US 12,349,533 B2
(45) Date of Patent: Jul. 1, 2025

(54) LIGHT-EMITTING DEVICE INCLUDING INORGANIC MIXED LAYER AND ELECTRONIC APPARATUS INCLUDING THE SAME

(71) Applicant: Samsung Display Co., Ltd., Yongin-si (KR)

(72) Inventors: Dongchan Kim, Yongin-si (KR); Donghui Lee, Yongin-si (KR); Chulsoon Lee, Yongin-si (KR); Haemyeong Lee, Yongin-si (KR); Wonsuk Han, Yongin-si (KR); Yoonseok Ka, Yongin-si (KR); Jiyoung Moon, Yongin-si (KR); Jihwan Yoon, Yongin-si (KR); Heechang Yoon, Yongin-si (KR); Jihye Lee, Yongin-si (KR); Hakchoong Lee, Yongin-si (KR); Yoonhyeung Cho, Yongin-si (KR); Myungsuk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 413 days.

(21) Appl. No.: 17/450,820

(22) Filed: Oct. 13, 2021

(65) Prior Publication Data
US 2022/0149310 A1    May 12, 2022

(30) Foreign Application Priority Data

Nov. 10, 2020 (KR) ................ 10-2020-0149593

(51) Int. Cl.
*H10K 50/15* (2023.01)
*H10K 50/16* (2023.01)
(Continued)

(52) U.S. Cl.
CPC ............ *H10K 50/15* (2023.02); *H10K 50/16* (2023.02); *H10K 50/171* (2023.02); *H10K 59/12* (2023.02); *H10K 59/38* (2023.02)

(58) Field of Classification Search
CPC ........ H10K 19/00; H10K 50/00; H10K 59/00; H10K 85/00; H10K 50/13; H10K 59/32;
(Continued)

(56) References Cited

U.S. PATENT DOCUMENTS 6,111,274 A * 8/2000 Arai ..................... H10H 20/822
                                                        257/E33.044
6,200,695 B1 * 3/2001 Arai ....................... H10K 50/17
                                                              313/506
(Continued)

FOREIGN PATENT DOCUMENTS

CN    113517415 A  * 10/2021  ........... H01L 27/323
JP    2003-187982 A    7/2003
(Continued)

OTHER PUBLICATIONS

Hongsheng Yang et al., Efficient charge generation layer for tandem OLEDs: Bi-layered MoO3/ZnO-based oxide semiconductor, Organic Electronics, 2017, pp. 133-138, vol. 46, Elsevier B.V.

*Primary Examiner* — Bryan R Junge
*Assistant Examiner* — Jeremy Daniel Watts
(74) *Attorney, Agent, or Firm* — Womble Bond Dickinson (US) LLP

(57) ABSTRACT

A light-emitting device and an electronic apparatus including the same are provided. The light-emitting device includes: a first electrode; a second electrode facing the first electrode; m emission units stacked between the first electrode and the second electrode and including an emission layer; and m−1 charge generation layers each between two neighboring emission units from among the m emission units, wherein m is an integer of 2 or more, at least one of
(Continued)

the m emission units includes an inorganic mixed layer between the first electrode and the emission layer, and the inorganic mixed layer includes an inorganic insulating material and an inorganic semiconductor material.

20 Claims, 5 Drawing Sheets

(51) Int. Cl.
  *H10K 50/17* (2023.01)
  *H10K 59/12* (2023.01)
  *H10K 59/38* (2023.01)
(58) Field of Classification Search
  CPC ...... H10K 50/156; H10K 59/10; H10K 59/38; H10K 2102/00; H10K 50/155; H10K 50/17; H10K 50/865; H10K 50/115; H10K 2102/331; H10K 50/16; H10K 50/171; H10K 59/12; H10K 59/35; H10K 50/19; H10K 2102/3026; H10K 50/828; H10K 85/1135; H10K 85/151; H10K 2102/3031; H10K 50/816; H10K 50/166; H10K 59/60; H10K 71/30; H10K 30/82; H10K 30/865; H10K 99/00; H10K 30/35; H10K 19/20; H10K 2102/301; H10K 59/8731; H10K 30/352; H10K 59/80517; H10K 59/70; H10K 30/85; H10K 30/86; H10K 50/131; H10K 50/15–157; C09K 11/08; C09K 11/7705; H01L 2924/057; H01L 27/1225; H01L 2924/12041; H01L 33/26; H01L 25/0756; H01L 25/00; H01L 21/02488; H01L 21/02455; H01L 21/02469; H01L 21/02441; H01L 25/0657; H01L 29/517; H01L 21/02104; H01L 21/02365; H01L 2224/24145; H01L 29/408; H01L 31/0264; H01L 21/471; H01L 25/117; H01L 21/76832; H01L 23/49894; H01L 21/28568; H01L 23/53295; C08K 5/3475

See application file for complete search history.

(56) References Cited

U.S. PATENT DOCUMENTS

| | | | |
|---|---|---|---|
| 6,893,744 B2 | 5/2005 | Kim et al. | |
| 8,343,639 B2 | 1/2013 | Seo et al. | |
| 8,563,144 B2 | 10/2013 | Kim et al. | |
| 9,431,614 B2 | 8/2016 | Seo et al. | |
| 10,483,327 B2 | 11/2019 | Kim et al. | |
| 2002/0045066 A1* | 4/2002 | Beierlein | H10K 50/826 428/917 |
| 2003/0107042 A1 | 6/2003 | Chang et al. | |
| 2007/0221945 A1* | 9/2007 | Honda | H10K 59/179 257/102 |
| 2008/0185957 A1* | 8/2008 | Kato | H10K 50/14 313/503 |
| 2014/0001457 A1 | 1/2014 | Endo | |
| 2017/0162816 A1* | 6/2017 | Kim | H10K 50/13 |
| 2017/0186988 A1* | 6/2017 | Kim | H10K 59/1213 |
| 2018/0269265 A1 | 9/2018 | Kim et al. | |
| 2020/0006715 A1 | 1/2020 | Lee et al. | |
| 2020/0243788 A1 | 7/2020 | Seo et al. | |
| 2021/0104707 A1 | 4/2021 | Kim et al. | |
| 2021/0273181 A1 | 9/2021 | Kim et al. | |
| 2023/0157048 A1* | 5/2023 | Naka | H01L 33/14 257/40 |
| 2023/0371334 A1* | 11/2023 | Levermore | H10K 59/32 |

FOREIGN PATENT DOCUMENTS

| | | |
|---|---|---|
| JP | 2012-195054 A | 10/2012 |
| KR | 10-2011-0063749 A | 6/2011 |
| KR | 10-2013-0069235 A | 6/2013 |
| KR | 10-2017-0049766 A | 5/2017 |
| KR | 10-2017-0109113 A | 9/2017 |
| KR | 10-2018-0081646 A | 7/2018 |
| KR | 10-2018-0105293 A | 9/2018 |
| KR | 10-2021-0041160 A | 4/2021 |
| KR | 10-2021-0109686 A | 9/2021 |

* cited by examiner

LIGHT-EMITTING DEVICE INCLUDING INORGANIC MIXED LAYER AND ELECTRONIC APPARATUS INCLUDING THE SAME

CROSS-REFERENCE TO RELATED APPLICATION

This application claims priority to and the benefit of Korean Patent Application No. 10-2020-0149593, filed on Nov. 10, 2020, in the Korean Intellectual Property Office, the entire content of which is hereby incorporated by reference.

BACKGROUND

1. Field

One or more embodiments relate to a light-emitting device and an electronic apparatus including the same.

2. Description of Related Art

Light-emitting devices are devices that convert electrical energy into light energy. Light-emitting devices include organic light-emitting devices, quantum dot light-emitting devices, and/or the like.

Organic light-emitting devices are self-emissive devices that have wide viewing angles, high contrasts, short response times, and/or excellent characteristics in terms of luminance, driving voltage, and/or response speed, and/or produce full-color images. Quantum dot light-emitting devices have high color purity and high luminescence efficiency and produce full-color images.

The light-emitting devices may have a structure in which a first electrode is arranged on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as the holes and the electrons, recombine in the emission layer to produce excitons. These excitons transition from an excited state to a ground state, to thereby generate light.

SUMMARY

Aspects according to one or more embodiments are directed toward a light-emitting device capable of effectively adjusting hole injection and an electronic apparatus including the same.

Additional aspects will be set forth in part in the description which follows and, in part, will be apparent from the description, or may be learned by practice of the presented embodiments of the disclosure.

According to an embodiment, a light-emitting device includes: a first electrode; a second electrode facing the first electrode; m emission units sequentially stacked between the first electrode and the second electrode in an order from a 1st emission unit to an $m^{th}$ mission unit and each of the m emission units including an emission layer; and m−1 charge generation layers each between two neighboring emission units from among the m emission units, wherein m is an integer of 2 or more, at least one selected from the m emission units (i.e., at least one emission unit selected from the m emission units) includes an inorganic mixed layer between the first electrode and the emission layer, and the inorganic mixed layer includes an inorganic insulating material and an inorganic semiconductor material.

In an embodiment, the first electrode may be an anode, the second electrode may be a cathode, and a first emission unit, closest to the first electrode from among the m emission units, may include the inorganic mixed layer.

In an embodiment, the first electrode may be an anode, the second electrode may be a cathode, a first emission unit closest to the first electrode from among the m emission units may include a first emission layer and a first hole transport region between the first electrode and the first emission layer, and the first hole transport region may include the inorganic mixed layer.

In the embodiment, the inorganic mixed layer may be in direct contact with the first electrode.

In an embodiment, the first hole transport region may further include a first hole transport layer and a second hole transport layer, which are between the first emission layer and the inorganic mixed layer, and the second hole transport layer may be located between the first hole transport layer and the first emission layer.

In an embodiment, the first electrode may be an anode, the second electrode may be a cathode, and an $n^{th}$ emission unit (wherein n is an integer satisfying $1 < n \leq m$) from among them emission units may include the inorganic mixed layer.

In an embodiment, the first electrode may be an anode, the second electrode may be a cathode, an $n^{th}$ emission unit (wherein n is an integer satisfying $1 < n \leq m$) from among the m emission units may include an $n^{th}$ emission layer and an $n^{th}$ hole transport region between the first electrode and the $n^{th}$ emission layer, and the $n^{th}$ hole transport region may include the inorganic mixed layer.

In an embodiment, the inorganic insulating material may include a halide of an alkali metal, a halide of an alkaline earth metal, a halide of a lanthanide metal (III), a halide of a Group 13 post-transition metal, or any combination thereof.

In an embodiment, the inorganic insulating material may include a fluoride of an alkali metal, a chloride of an alkali metal, a bromide of an alkali metal, an iodide of an alkali metal, a fluoride of an alkaline earth metal, a chloride of an alkaline earth metal, a bromide of an alkaline earth metal, an iodide of an alkaline earth metal, a fluoride of a lanthanide metal (III), a chloride of a lanthanide metal (III), a bromide of a lanthanide metal (III), an iodide of a lanthanide metal (III), a fluoride of a Group 13 post-transition metal, a chloride of a Group 13 post-transition metal, a bromide of a Group 13 post-transition metal, an iodide of a Group 13 post-transition metal, or any combination thereof.

In an embodiment, the inorganic semiconductor material may include a halide of a transition metal; a halide of a Group 14, Group 15, or Group 16 post-transition metal; a halide of a lanthanide metal (II); tellurium (Te); a telluride of a transition metal; a telluride of a post-transition metal; a telluride of a lanthanide metal (II); selenium (Se); a selenide of a transition metal; a selenide of a post-transition metal; a selenide of a lanthanide metal (II); or any combination thereof.

In an embodiment, a volume ratio of the inorganic insulating material to the inorganic semiconductor material may be in a range of about 99:1 to about 50:50.

In an embodiment, a thickness of the inorganic mixed layer may be in a range of about 1 Å to about 200 Å.

In an embodiment, the m−1 charge generation layers may each include an n-type charge generation layer and a p-type charge generation layer, the n-type charge generation layer may include a first material and a second material, the first material may include an electron transporting organic compound, and the second material may include an alkali metal, an alkaline earth metal, a lanthanide metal, a transition metal, a post-transition metal, or any combination thereof.

In an embodiment, the m−1 charge generation layers may each include an n-type charge generation layer and a p-type charge generation layer, the p-type charge generation layer may include a third material and a fourth material, the third material may include a hole transporting organic compound, and the fourth material may include a post-transition metal, an inorganic semiconductor material, a charge-generation material, or any combination thereof.

In an embodiment, the first electrode may be an anode, the second electrode may be a cathode, the m emission units may each further include a hole transport region between the first electrode and the emission layer and an electron transport region between the emission layer and the second electrode, the hole transport regions of the m emission units may each include a hole injection layer, a hole transport layer, an emission auxiliary layer, an electron blocking layer, or any combination thereof, and the electron transport regions of the m emission units may each include a buffer layer, a hole blocking layer, an electron control layer, an electron transport layer, an electron injection layer, or any combination thereof.

In an embodiment, at least one of the hole transport regions of the m emission units may include a hole injection layer, and the hole injection layer may include a hole transporting organic compound or may include a hole transporting organic compound and an inorganic semiconductor material.

In an embodiment, m is 4, the m emission units may include a first emission unit, a second emission unit, a third emission unit, and a fourth emission unit, which are sequentially stacked in a direction from the first electrode to the second electrode, three emission units from among the first to fourth emission units may each emit a first-color light, a remaining emission unit may emit a second-color light, and the first-color light and the second-color light may have different maximum emission wavelengths.

According to another embodiment, an electronic apparatus may include the light-emitting device.

In an embodiment, the electronic apparatus may further include a thin-film transistor, the thin-film transistor may include a source electrode and a drain electrode, and the first electrode of the light-emitting device may be in electrical connection with at least one selected from the source electrode and the drain electrode of the thin-film transistor.

In an embodiment, the electronic apparatus may further include a color filter and/or a color conversion layer, each located on a path of light to be emitted from the light-emitting device.

BRIEF DESCRIPTION OF THE DRAWINGS

The above and other aspects, features, and enhancements of certain embodiments of the disclosure will be more apparent from the following description taken in conjunction with the accompanying drawing, in which.

DETAILED DESCRIPTION

Figure 1:
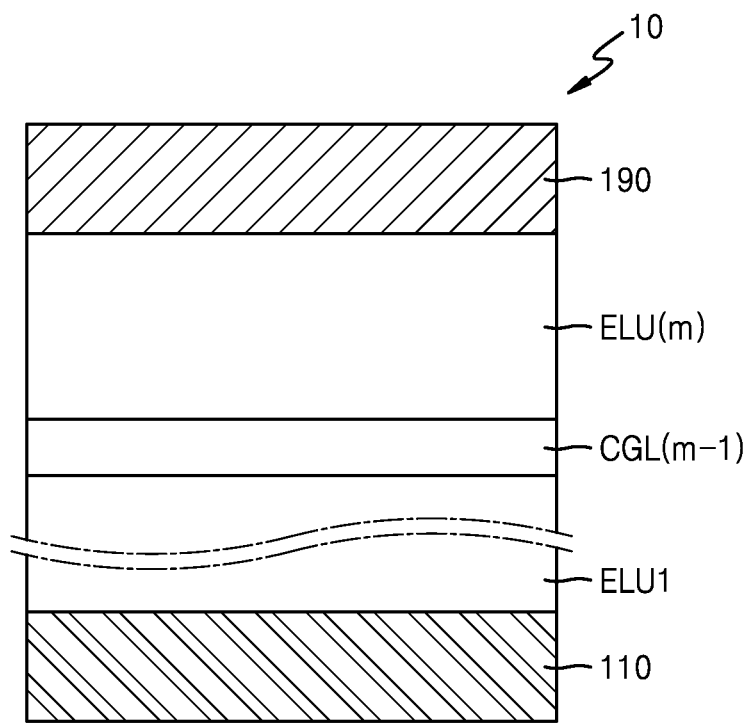
FIG. 1 is a schematic cross-sectional view of a light-emitting device according to an embodiment of the present disclosure.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc., may be used herein to describe various suitable components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" as used herein specify the presence of stated features or elements, but do not preclude the presence or addition of one or more other features or elements.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

It will be understood that when a layer, region, or component is referred to as being "connected to" another layer, region, or component, the layer, region, or component may be directly connected to the other layer, region, or component, or indirectly connected to the other layer, region, or component as intervening layer, region, or component is present. For example, it will be understood that when a layer, region, or component is referred to as being "electrically connected to" another layer, region, or component, the layer, region, or component may be directly electrically connected to the other layer, region, or component, or indirectly electrically connected to the other layer, region, or component as interventing layer, region, or component is present.

The term "interlayer" as used herein refers to a single layer and/or all of a plurality of layers located between a first electrode and a second electrode of a light-emitting device. A material included in the "interlayer" may be an organic material and/or an inorganic material.

The expression "(an interlayer) includes at least one compound represented by Formula 1" as used herein may include a case in which "(an interlayer) includes identical compounds represented by Formula 1" and a case in which "(an organic layer) includes two or more different compounds represented by Formula 1".

The term "Group" as used herein refers to a group on the IUPAC Periodic Table of Elements.

The term "alkali metal" as used herein refers to a Group 1 element. In more detail, an alkali metal may be lithium (Li), sodium (Na), potassium (K), rubidium (Rb), and/or cesium (Cs).

The term "alkaline earth metal" as used herein refers to a Group 2 element. In an embodiment, an alkaline earth metal may be magnesium (Mg), calcium (Ca), strontium (Sr), and/or barium (Ba).

The term "lanthanide metal" as used herein refers to lanthanum and an element of the lanthanum Group in the Periodic Table of Elements. In an embodiment, a lanthanide metal may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and/or lutetium (Lu).

The term "transition metal" as used herein refers to an element that belongs to Period 4 to Period 7 and an element that belongs to Group 3 to Group 12. In an embodiment, a transition metal may be titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), and/or cadmium (Cd).

The term "post-transition metal" as used herein refers to a metal element that belongs to Period 4 to Period 7 and concurrently (or simultaneously) belongs to Group 13 to Group 17. In an embodiment, a post-transition metal may be aluminum (Al), gallium (Ga), indium (In), thallium (Tl), tin (Sn), lead (Pb), bismuth (Bi), and/or polonium (Po).

The term "halogen" as used herein refers to a Group 17 element. In an embodiment, a halogen may be fluorine (F), chlorine (Cl), bromine (Br), and/or iodine (I).

The term "halide of an alkali metal" as used herein refers to a compound in which an alkali metal and a halogen atom are ionically bonded. In an embodiment, a halide of an alkali metal may include NaI, KI, RbI, CsI, NaCl, KCl, RbCl, CsCl, NaF, KF, RbF, CsF, or any combination thereof.

The term "halide of an alkaline earth metal" as used herein refers to a compound in which an alkali metal and a halogen atom are ionically bonded. In an embodiment, a halide of an alkaline earth metal may include $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, or any combination thereof.

The term "halide of a lanthanide metal" as used herein refers to a compound in which a lanthanide metal atom and a halogen atom are ionically bonded and/or covalently bonded. In an embodiment, a halide of a lanthanide metal may include $EuI_2$, $YbI_2$, $SmI_2$, $TmI_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

The term "halide of a transition metal" as used herein refers to a compound in which a transition metal atom and a halogen atom are ionically bonded and/or covalently bonded. In an embodiment, a halide of a transition metal may include AgI, CuI, $NiI_2$, $CoI_2$, or any combination thereof.

The term "halide of a post-transition metal" as used herein refers to a compound in which a post-transition metal atom and a halogen atom are ionically bonded and/or covalently bonded. In an embodiment, a halide of a post-transition metal may include $AlF_3$, $BiI_a$, $PbI_2$, $SnI_2$, or any combination thereof.

The term "telluride of a lanthanide metal" as used herein refers to a compound in which a lanthanide metal atom and tellurium (Te) are ionically bonded, covalently bonded, and/or metallically bonded. In an embodiment, a telluride of a lanthanide metal may include EuTe, YbTe, SmTe, TmTe, or any combination thereof.

The term "telluride of a transition metal" as used herein refers to a compound in which a transition metal atom and tellurium are ionically bonded, covalently bonded, and/or metallically bonded. In an embodiment, a telluride of a transition metal may include ZnTe, CoTe, or any combination thereof.

The term "telluride of a post-transition metal" as used herein refers to a compound in which a post-transition metal atom and tellurium are ionically bonded, covalently bonded, and/or metallically bonded. In an embodiment, a telluride of a post-transition metal may include $Bi_2Te_3$.

The term "selenide of a lanthanide metal" as used herein refers to a compound in which a lanthanide metal atom and selenium (Se) are ionically bonded, covalently bonded, and/or metallically bonded. In an embodiment, a selenide of a lanthanide metal may include EuSe, YbSe, SmSe, TmSe, or any combination thereof.

The term "selenide of a transition metal" as used herein refers to a compound in which a transition metal atom and selenium are ionically bonded, covalently bonded, and/or metallically bonded. In an embodiment, a selenide of a transition metal may include ZnSe, CoSe, or any combination thereof.

The term "selenide of a post-transition metal" as used herein refers to a compound in which a post-transition metal atom and selenium are ionically bonded, covalently bonded, and/or metallically bonded. In an embodiment, a selenide of a post-transition metal may include $Bi_2Se_3$.

According to an embodiment, a light-emitting device includes: a first electrode; a second electrode facing the first electrode; m emission units stacked between the first electrode and the second electrode and including an emission layer; and m−1 charge generation layers each between two neighboring emission units from among the m emission units, wherein m is an integer of 2 or more, at least one of the m emission units (i.e., at least one emission unit from among the m emission units) includes an inorganic mixed layer between the first electrode and the emission layer, and the inorganic mixed layer includes an inorganic insulating material and an inorganic semiconductor material.

Hereinafter, a structure of each of light-emitting devices 10 and 20 according to embodiments and a method of manufacturing the same will be described in connection with FIGS. 1 and 2.

FIG. 1 is a schematic cross-sectional view of the light-emitting device 10 according to an embodiment. The light-emitting device 10 includes a first electrode 110; a second electrode 190 facing the first electrode 110; m emission units ELU stacked between the first electrode 110 and the second electrode 190 and including an emission layer; m−1 charge generation layers CGL each between two neighboring emission units from among the m emission units ELU, wherein at least one emission unit of the m emission units ELU may include an inorganic mixed layer between the first electrode 110 and the emission layer, and the inorganic mixed layer may include an inorganic insulating material and an inorganic semiconductor material. That is, the inorganic mixed layer may include an inorganic insulating material mixed with an inorganic semiconductor material.

First Electrode 110

In FIG. 1, a substrate may be additionally located under the first electrode 110 or above the second electrode 190. As the substrate, a glass substrate or a plastic substrate may be utilized. In an embodiment, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be utilized as the material for forming the first electrode.

The first electrode 110 may have a single-layer structure consisting of a single layer or a multilayer structure including a plurality of layers. For example, the first electrode 110 may have a three-layered structure of ITO/Ag/ITO.

Emission Unit ELU

The m emission units ELU are located on the first electrode 110.

The term "emission unit" is not particularly limited as long as it is capable of emitting light (e.g., has a function of emitting light). In an embodiment, the emission unit (e.g., each emission unit) may include one or more emission layers. When needed, the emission unit may further include a functional layer other than the emission layer.

An emission unit closest to the first electrode 110 from among the m emission units ELU is referred to as a first emission unit ELU1, an emission unit farthest from the first electrode 110 is referred to as an $m^{th}$ emission unit ELU (m), and the first emission unit ELU1 to the $m^{th}$ emission unit ELU(m) are sequentially located (e.g. sequentially stacked from the first electrode 110 in the order of $1^{st}$ emission unit to $m^{th}$ emission unit). An $n^{th}$ emission unit is arranged $n^{th}$ from the first electrode from among the m emission units, wherein n is an integer satisfying 1<n≤m. In other words, an $n^{th}$ emission unit is disposed on an $n-1^{th}$ emission unit.

In some embodiments, each of the m emission units ELU may further include an electron transport region and/or a hole transport region.

The number of the emission units, that is, m, may vary according to the purpose, and the upper limit of the number is not particularly limited. In an embodiment, the light-emitting device may include two, three, four, or five emission units.

In an embodiment, m may be two, three, or four, but embodiments of the present disclosure are not limited thereto.

At least one of them emission units ELU (i.e., at least one emission unit from among the m emission units) may include an inorganic mixed layer between the first electrode 110 and the respective emission layer, and the inorganic mixed layer may include an inorganic insulating material and an inorganic semiconductor material. That is, the inorganic mixed layer may include an inorganic insulating material mixed with an inorganic semiconductor material.

In some embodiments, at least one emission unit of them emission units ELU may include a hole transport region between the first electrode 110 and the respective emission layer, and the inorganic mixed layer may be included in the hole transport region.

The hole transport region may include, for example, a hole injection layer, a hole transport layer, an electron blocking layer, or any combination thereof.

In an embodiment, the inorganic mixed layer may be a layer closest to the first electrode 110 from among layer(s) included in the hole transport region. In an embodiment, the inorganic mixed layer may act as a hole injection layer in the hole transport region.

In an embodiment, the inorganic mixed layer may be located closest to the first electrode 110 from among layer(s) included in the hole transport region, and the hole transport region may further include a hole transport layer between the respective emission layer and the inorganic mixed layer. The hole transport layer may be one or more (e.g., a single layer or a plurality of layers).

In an embodiment, the first electrode 110 may be an anode, the second electrode 190 may be a cathode, and the first emission unit ELU1 may include the inorganic mixed layer.

In an embodiment, the first electrode 110 may be an anode, the second electrode 190 may be a cathode, the first emission unit ELU1 may include a first emission layer and a first hole transport region between the first electrode 110 and the first emission layer, and the first hole transport region may include the inorganic mixed layer.

In an embodiment, the inorganic mixed layer may be in direct contact with the first electrode 110.

In an embodiment, the first hole transport region may further include a hole transport layer between the first emission layer and the inorganic mixed layer. The hole transport layer may be one or more (e.g., a single layer or a plurality of layers).

In an embodiment, the first hole transport region may further include a first hole transport layer and a second hole transport layer, which are between the first emission layer and the inorganic mixed layer, and the second hole transport layer may be located between the first hole transport layer and the first emission layer.

In an embodiment, the first hole transport layer and the second hole transport layer may each independently include a hole transporting organic compound. In an embodiment, the first hole transport layer and the second hole transport layer may each independently include a hole transporting organic compound and may each independently not include an inorganic material. The hole transporting organic compound included in the first hole transport layer and the second hole transport layer may include a material that may be utilized in a hole transport region described below.

Figure 2:
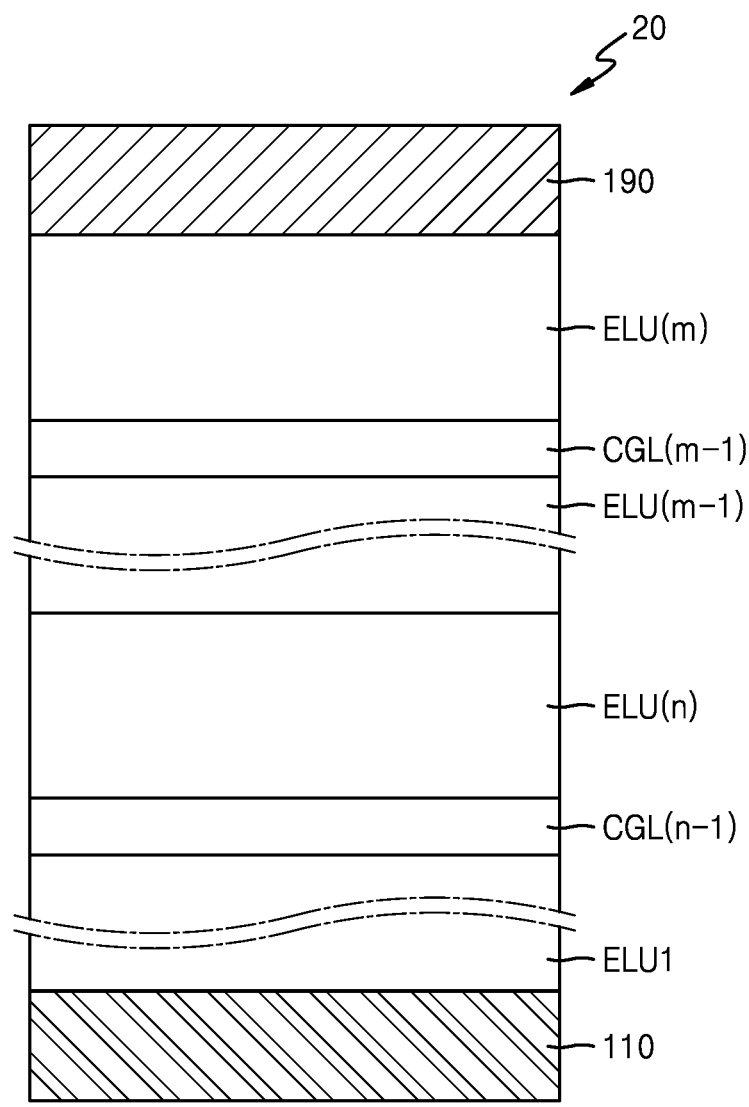
FIG. 2 is a schematic cross-sectional view of a light-emitting device according to an embodiment of the present disclosure.

FIG. 2 is a schematic cross-sectional view of the light-emitting device 20 according to an embodiment.

In the light-emitting device 20, the first electrode 110 may be an anode, the second electrode 190 may be a cathode, and an $n^{th}$ emission unit ELU(n) (wherein n is an integer satisfying $1<n\leq m$) may include the inorganic mixed layer.

In FIG. 2, ELU(m) and ELU(n) are shown as separate layers. However, when m=n, it should be easily understood by those skilled in the art that ELU(n) and ELU(m) are the same layer.

In an embodiment, the $n^{th}$ emission unit ELU(n) may include an $n^{th}$ emission layer and an $n^{th}$ hole transport region between the first electrode 110 and the $n^{th}$ emission layer, and the $n^{th}$ hole transport region may include the inorganic mixed layer.

In an embodiment, the inorganic mixed layer may be in direct contact with an $n-1^{th}$ charge generation layer CGL (n−1) between the $n^{th}$ emission unit ELU(n) and an $n-1^{th}$ emission unit.

In an embodiment, the $n^{th}$ hole transport region may further include a hole transport layer between the $n^{th}$ emission layer and the inorganic mixed layer. The hole transport layer may be one or more (e.g., a single layer or a plurality of layers).

In an embodiment, the $n^{th}$ hole transport region may further include a first hole transport layer and a second hole transport layer, which are located between the $n^{th}$ emission layer and the inorganic mixed layer, and the second hole transport layer may be located between the first hole transport layer and the $n^{th}$ emission layer. In an embodiment, the first hole transport layer and the second hole transport layer may each independently include a hole transporting organic compound. In an embodiment, the first hole transport layer and the second hole transport layer may each independently include a hole transporting organic compound and may each independently not include an inorganic material. The hole transporting organic compound included in the first hole transport layer and the second hole transport layer may include a material that may be utilized in a hole transport region described below.

In a light-emitting device according to an embodiment, m may be 3. That is, the light-emitting device may include a first emission unit, a second emission unit, and a third emission unit, which are sequentially stacked in a direction from the first electrode 110 to the second electrode 190.

Light emitted from each of the first emission unit to the third emission unit may have maximum emission wavelengths that are identical to or different from each other.

In an embodiment, each of the first emission unit to the third emission unit may emit a first-color light. The first-color light may be, for example, blue light, but embodiments of the present disclosure are not limited thereto.

In a light-emitting device according to an embodiment, m may be 4. That is, the light-emitting device may include a first emission unit, a second emission unit, a third emission unit, and a fourth emission unit, which are sequentially stacked in a direction from the first electrode 110 to the second electrode 190.

Light emitted from each of the first to fourth emission units may have maximum emission wavelengths that are identical to or different from each other.

In an embodiment, three emission units from among the first to fourth emission units may emit a first-color light, the other (e.g., the remaining emission unit from among the first to fourth emission units) may emit a second-color light, and the first-color light and the second-color light may have different maximum emission wavelengths. In an embodiment, the first-color light may be blue light, and the second-color light may be green light, but embodiments of the present disclosure are not limited thereto.

In an embodiment, the three emission units emitting the first-color light may include a first emitting material, a second emitting material, and a third emitting material, respectively, and the first emitting material, the second emitting material, and the third emitting material may be identical to or different from each other.

Inorganic Mixed Layer

The inorganic mixed layer (e.g., the mixed inorganic layer) may include an inorganic insulating material and an inorganic semiconductor material.

The inorganic mixed layer may not include an organic material. In an embodiment, the inorganic mixed layer may consist of the inorganic insulating material and the inorganic semiconductor material.

The term "inorganic insulating material" refers to any inorganic material having a band gap of 4 eV or more. In an embodiment, the inorganic insulating material may include a halide of an alkali metal, a halide of an alkaline earth metal, a halide of a lanthanide metal (III), a halide of a Group 13 post-transition metal, or any combination thereof.

The Group 13 post-transition metal may include aluminum (Al), gallium (Ga), indium (In), and/or thallium (Tl).

In an embodiment, the inorganic insulating material may include a fluoride of an alkali metal, a chloride of an alkali metal, a bromide of an alkali metal, an iodide of an alkali metal, a fluoride of an alkaline earth metal, a chloride of an alkaline earth metal, a bromide of an alkaline earth metal, an iodide of an alkaline earth metal, a fluoride of a lanthanide metal (III), a chloride of a lanthanide metal (III), a bromide of a lanthanide metal (III), an iodide of a lanthanide metal (III), a fluoride of a Group 13 post-transition metal, a chloride of a Group 13 post-transition metal, a bromide of a Group 13 post-transition metal, an iodide of a Group 13 post-transition metal, or any combination thereof.

In an embodiment, the inorganic insulating material may include NaF, KF, RbF, CsF, NaCl, KCl, RbCl, CsCl, NaI, KI, RbI, CsI, $MgF_2$, $CaF_2$, $SrF_2$, $BaF_2$, $MgCl_2$, $CaCl_2$, $SrCl_2$, $BaCl_2$, $MgI_2$, $CaI_2$, $SrI_2$, $BaI_2$, $EuF_3$, $YbF_3$, $SmF_3$, $TmF_3$, $EuCl_3$, $YbCl_3$, $SmCl_3$, $TmCl_3$, $EuI_3$, $YbI_3$, $SmI_3$, $TmI_3$, $AlF_3$, $GaF_3$, $InF_3$, $AlCl_3$, $GaCl_3$, $InCl_3$, $AlI_3$, $GaI_3$, $InI_3$, or any combination thereof.

The term "inorganic semiconductor material" refers to any inorganic material having a band gap of less than 4 eV. In an embodiment, the inorganic semiconductor material may include a halide of a transition metal, a halide of a Group 14, Group 15, or Group 16 post-transition metal, a halide of a lanthanide metal (II), tellurium (Te), a telluride of a transition metal, a telluride of a post-transition metal, a telluride of a lanthanide metal (II), selenium (Se), a selenide of a transition metal, a selenide of a post-transition metal, a selenide of a lanthanide metal (II), or any combination thereof.

The Group 14, Group 15, and Group 16 post-transition metal may include tin (Sn), lead (Pb), bismuth (Bi), and/or polonium (Po).

In an embodiment, the inorganic semiconductor material may include $EuI_2$, $YbI_2$, $SmI_2$, $TmI_2$, AgI, CuI, $NiI_2$, $CoI_2$, $BiI_3$, $PbI_2$, $SnI_2$, $BiF_3$, Te, ZnTe, CoTe, $Bi_2Te_3$, EuTe, YbTe, SmTe, TmTe, Se, ZnSe, CoSe, $Bi_2Se_3$, EuSe, YbSe, SmSe, TmSe, or any combination thereof.

The inorganic semiconductor material may be homogeneously or non-homogeneously dispersed in the inorganic mixed layer.

In an embodiment, a volume of the inorganic insulating material in the inorganic mixed layer may be equal to or greater than a volume of the inorganic semiconductor material in the inorganic mixed layer.

In an embodiment, a volume ratio of the inorganic insulating material to the inorganic semiconductor material in the inorganic mixed layer may be in a range of about 99:1 to about 50:50, but embodiments of the present disclosure are not limited thereto.

When a volume ratio of the inorganic semiconductor material in the inorganic mixed layer increases, an amount of holes injected into an emission layer included in the emission unit may increase. Accordingly, by adjusting a volume ratio of the inorganic insulating material to the inorganic semiconductor material in the inorganic mixed layer, the amount of holes injected may be efficiently adjusted.

In an embodiment, a thickness of the inorganic mixed layer may be in a range of about 1 Å to about 200 Å. In an embodiment, a thickness of the inorganic mixed layer may be in a range of about 2 Å to about 50 Å, but embodiments of the present disclosure are not limited thereto. When the thickness of the inorganic mixed layer is within these ranges, satisfactory hole injection characteristics may be obtained without a substantial increase in driving voltage, and an amount of holes injected may be micro-adjusted according to a volume ratio of the inorganic semiconductor material.

Figure 3A:
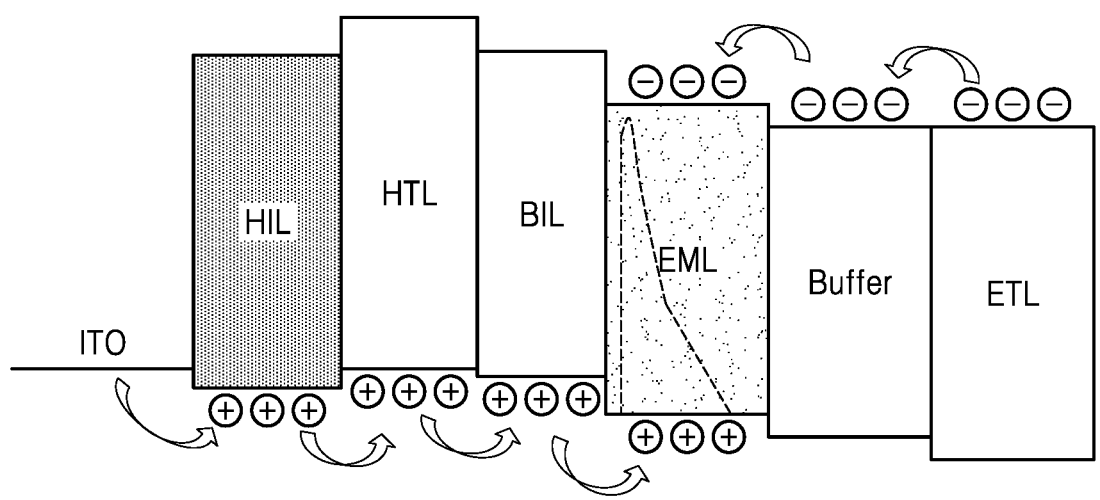
FIG. 3A schematically illustrates a part of an energy diagram of a light-emitting device of the related art.
Figure 3B:
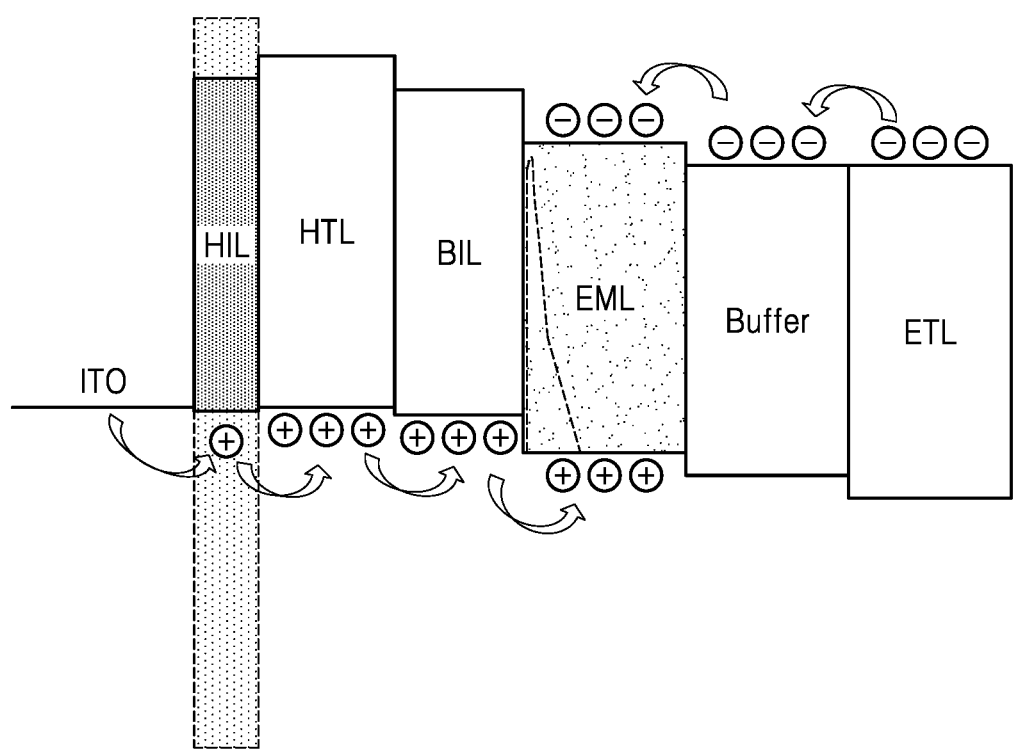
FIG. 3B schematically illustrates a part of an energy diagram of a light-emitting device according to an embodiment of the present disclosure.

FIGS. 3A and 3B are drawings of a part of an energy diagram of a light-emitting device of the related art and a part of an energy diagram of a light-emitting device according to an embodiment of the present disclosure.

Referring to FIG. 3A, the light-emitting device of the related art has utilized a hole injection layer including an organic material doped with a p-dopant between an ITO anode and a hole transport layer, in order to solve an increase in driving voltage according to an increase in driving time, that is, a progressive increase in driving voltage. In this case, because an amount of holes injected into an emission layer increases, an emission zone is largely formed in the emission layer. Accordingly, a density of a triplet exciton in the emission zone decreases, and thus, fluorescence emission efficiency according to a triplet-triplet fusion (TTF) mechanism of the triplet exciton may be low.

In contrast, as the light-emitting device shown in FIG. 3B, when an inorganic insulating material (shown with a dotted line) is included in a hole injection layer, the hole injection layer may be formed to be thin to have a thickness of several nanometers, and holes may be injected into an emission layer according to a tunneling effect. Accordingly, without utilizing a p-dopant as in the light-emitting device of the related art, effective hole injection is possible while solving the issues of a progressive increase in driving voltage. However, in a case where the hole injection layer includes (e.g., consists of) an inorganic insulating material, because holes are injected due to a tunneling effect, when a thickness of the hole injection layer is greater than a critical thickness for smooth tunneling, an amount of holes being injected into the emission layer may decrease. Accordingly, an exciton concentration increases at an interface between the emission layer and a hole transport layer such that exciton recombination efficiency and triplet-triplet fusion (TTF) probability increases, and thus, luminescence efficiency may increase. However, due to a high exciton density and an excess electron concentration, a material utilized to form the neighboring hole transport layer may be negatively ionized, and the negatively ionized material may be easily deteriorated due to light emission of excitons such that stability and lifespan of the light-emitting device may decrease.

In order to solve the above-described problem, in the light-emitting device according to an embodiment of FIG. 3B, an inorganic semiconductor material (shown with a solid line) is mixed with an inorganic insulating material (shown with a dotted line) to thereby easily adjust hole injection. In an embodiment, the inorganic semiconductor material may be doped with the inorganic insulating material. Hole injection may be improved by aligning a highest occupied molecular orbital (HOMO) energy level of the inorganic semiconductor material between a Fermi level for determining a work function of an anode and a HOMO energy level of the hole transport layer. Accordingly, compared to a case where only an inorganic insulating material is utilized for the hole injection layer, hole injection may be effectively performed even when the hole injection layer has a relatively thick thickness. Thus, lifespan of the light-emitting device may be improved. Furthermore, because a hole injection amount decreases compared to the light-emitting device of the related art, which includes a hole injection layer doped with a p-dopant, an emission zone may be formed relatively narrow in the emission layer. Accordingly, a density of a triplet exciton in the emission zone increases, and thus, fluorescence emission efficiency according to a TTF mechanism may be improved. In addition, an amount of holes injected may be micro-adjusted by adjusting an amount of the inorganic semiconductor material in the hole injection layer.

Furthermore, due to Fowler-Nordheim (F-N) tunneling, deterioration of an organic material and an inorganic material is reduced or prevented at an interface between an anode and a hole injection layer and an interface between a hole injection layer and a hole transport layer. Thus, lifespan of the light-emitting device may be improved.

Here, although the light-emitting device of the related art and the light-emitting device according to an embodiment of the present disclosure were compared with each other with reference to FIGS. 3A and 3B, the above description does not limit the principle of the present disclosure, but is an example for explaining the principle of the present disclosure, and the principle of the present disclosure is not limited by the above description.

Charge Generation Layer CGL

In an embodiment, the charge generation layer(s) CGL may each include an n-type charge generation layer and a p-type charge generation layer.

The charge generation layer CGL generates a charge or separates the charge into a hole and an electron, and provides the electron to one of the two neighboring emission units (that is, the charge generation layer CGL acts as a cathode to this emission unit), and provides the hole to the other emission unit (that is, the charge generation layer CGL acts as (e.g., is) an anode to the other emission unit). The charge generation layer CGL is not directly connected to an electrode, and is placed to separate neighboring emission units. An organic light-emitting device including m emission units includes m−1 charge generation layers. Each of the m−1 charge generation layers includes one n-type charge generation layer and one p-type charge generation layer, and thus, the organic light-emitting device including the m−1 charge generation layers includes m−1 n-type charge generation layers and m−1 p-type charge generation layers.

The term "n-type" as used herein refers to n-type semiconductor characteristics, that is, the characteristics of injecting or transporting electrons. The term "p-type" as used herein refers to p-type semiconductor characteristics, that is, the characteristics of injecting or transporting holes.

In an embodiment, the n-type charge generation layer may be located between the first electrode 110 and the p-type charge generation layer.

The n-type charge generation layer may supply electrons to an emission unit neighboring (e.g., located closer) to the first electrode 110, and the p-type charge generation layer may supply holes to an emission unit neighboring (e.g., located closer) to the second electrode 190. Accordingly, the luminescence efficiency of the light-emitting device 10 including a plurality of emission units may be further increased, and the driving voltage thereof may be reduced.

The p-type charge generation layer and the n-type charge generation layer may be in direct contact with each other to form an NP junction (e.g., p-n junction), and thus, holes and electrons may be generated between the n-type charge generation layer and the p-type charge generation layer. The p-type charge generation layer may transfer the generated holes to a neighboring emission unit, and the n-type charge generation layer may transfer the generated electrons to a neighboring emission unit.

In an embodiment, the n-type charge generation layer may include a first material and a second material, the first material may include an electron transporting organic compound, and the second material may include an alkali metal, an alkaline earth metal, a lanthanide metal, a transition metal, a post-transition metal, or any combination thereof.

In an embodiment, the electron transporting organic compound may include materials that may be utilized in an electron transport region described below.

In an embodiment, the second material may include lithium (Li), sodium (Na), ytterbium (Yb), samarium (Sm), europium (Eu), terbium (Tb), holmium (Ho), dysprosium (Dy), or any combination thereof.

In an embodiment, the second material may be lithium (Li) and/or ytterbium (Yb).

In an embodiment, a volume of the first material in the n-type charge generation layer may be greater than a volume of the second material in the n-type charge generation layer. In an embodiment, a volume ratio of the first material to the second material included in the n-type charge generation layer may be in a range of about 99:1 to about 95:5.

The n-type charge generation layer may be in direct contact with an electron transport region of a neighboring emission unit. In an embodiment, an n-type charge generation layer included in an $n^{th}$ charge generation layer may be in direct contact with an electron injection layer or an electron transport layer included in an $n^{th}$ emission unit.

In an embodiment, the p-type charge generation layer may include a third material and a fourth material, the third material may include a hole transporting organic compound, and the fourth material may include a post-transition metal, an inorganic semiconductor material as described above, a charge-generation material, or any combination thereof.

In an embodiment, the hole transporting organic compound may include materials that may be utilized in a hole transport region described below.

An inorganic semiconductor material that may be included in the p-type charge generation layer is the same as described above.

In an embodiment, an inorganic semiconductor material included in the p-type charge generation may be identical to or different from an inorganic semiconductor material included in the inorganic mixed layer.

A charge-generation material that may be included in the p-type charge generation layer may be the same as described in connection with a charge-generation material that may be utilized in a hole transport region described below, for example, a p-dopant.

In an embodiment, the fourth material may include Bi, $BiI_3$, $Bi_2Te_3$, CuI, or any combination thereof.

In an embodiment, a volume of the third material in the p-type charge generation layer may be greater than a volume of the fourth material in the p-type charge generation layer. In an embodiment, a volume ratio of the third material to the fourth material included in the p-type charge generation layer may be in a range of about 99:1 to about 80:20.

The p-type charge generation layer may be in direct contact with a hole transport region of a neighboring emission unit. In an embodiment, a p-type charge generation layer included in an $n^{th}$ charge generation layer may be in direct contact with a hole injection layer or a hole transport layer included in an n+1 emission unit.

Hole Transport Region

Each of the m emission units may include a hole transport region between the first electrode and the respective emission layer.

In an embodiment, at least one of the m hole transport regions (i.e., at least one hole transport region from among the m hole transport regions) may include an inorganic mixed layer including an inorganic insulating material and an inorganic semiconductor material.

The hole transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, constituting layers are stacked sequentially from the first electrode 110 in the respective stated order.

In an embodiment, at least one of a plurality of hole transport regions may include a hole injection layer, and the hole injection layer may be the inorganic mixed layer described above. In an embodiment, at least one of a plurality of hole transport regions may include the inorganic mixed layer, and may further include an organic hole injection layer between the inorganic mixed layer and the emission layer (e.g., the respective emission layer). The organic hole injection layer may include an organic compound or may include an organic compound and an inorganic compound.

The hole transport region may include a hole transporting organic compound.

In an embodiment, the hole transport region may include a compound represented by Formula 201, a compound represented by Formula 202, or any combination thereof:

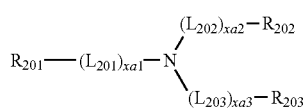

Formula 201

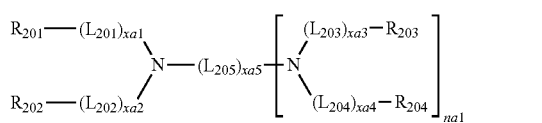

Formula 202

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer selected from 0 to 5, xa5 may be an integer selected from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (for example, a carbazole group and/or the like) unsubstituted or substituted with at least one $R_{10a}$ (for example, see Compound HT16 and/or the like), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer selected from 1 to 4.

In one or more embodiments, each of Formulae 201 and 202 may include at least one of the groups represented by Formulae CY201 to CY217.

CY201

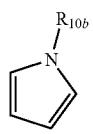

CY202

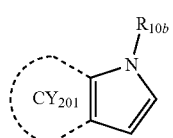

CY203

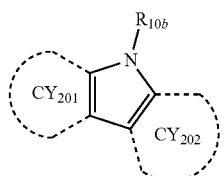

CY204

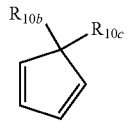

CY205

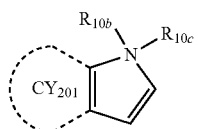

CY206

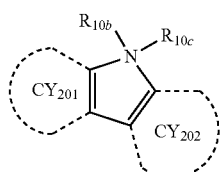

CY207

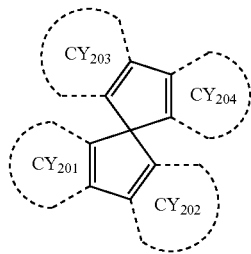

CY208

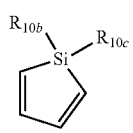

CY209

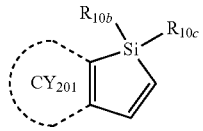

CY210

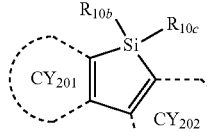

CY211

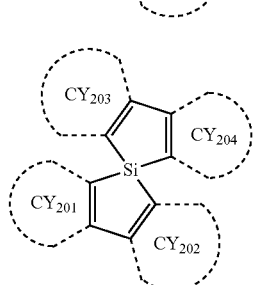

-continued

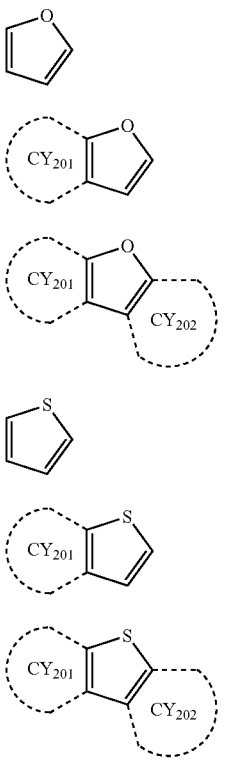

CY212

CY213

CY214

CY215

CY216

CY217

In Formulae CY201 to CY217, $R_{10b}$ and $R_{10c}$, may each independently be the same as described in connection with $R_{10a}$, and ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with at least one $R_{10a}$ as used herein.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203. That is, each of Formulae 201 and 202 may not include any of the groups represented by Formulae CY201 to CY203.

In one or more embodiments, each of Formulae 201 and 202 may not include a group represented by one of Formulae CY201 to CY203 (i.e., each of Formulae 201 and 202 may not include any of the groups represented by Formulae CY201 to CY203), and may include at least one of the groups represented by Formulae CY204 to CY217.

In an embodiment, each of Formulae 201 and 202 may not include a group represented by one of Formulae CY201 to CY217. That is, each of Formulae 201 and 202 may not include any of the groups represented by Formulae CY201 to CY217.

In an embodiment, the hole transport region may include one of Compounds HT1 to HT44, m-MTDATA, TDATA, 2-TNATA, NPB(NPD), β—NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

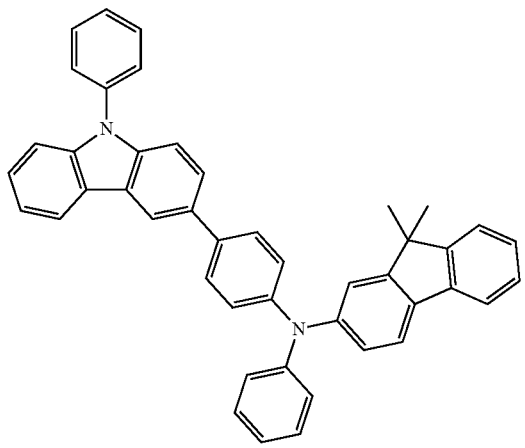

HT2

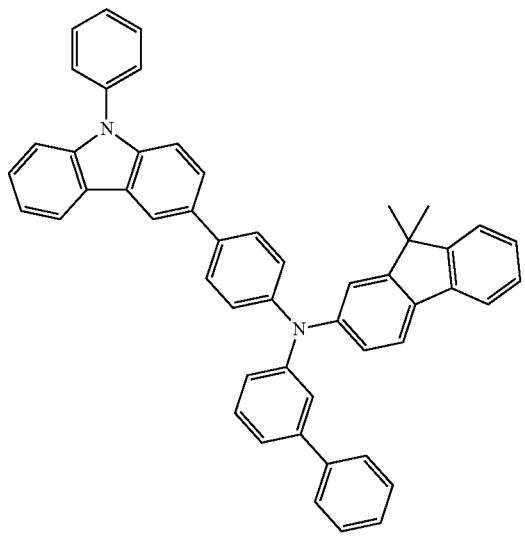

-continued
HT3
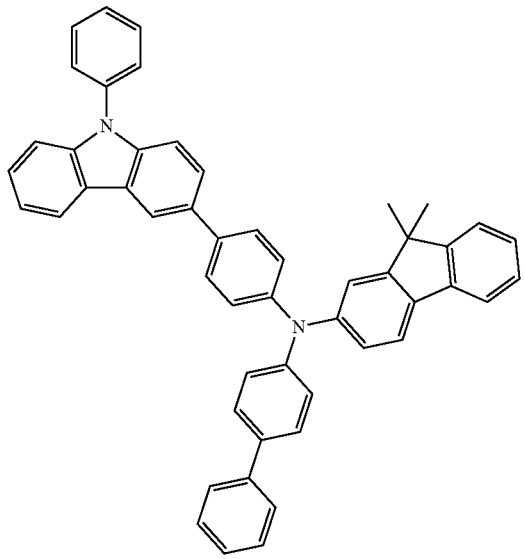
HT4
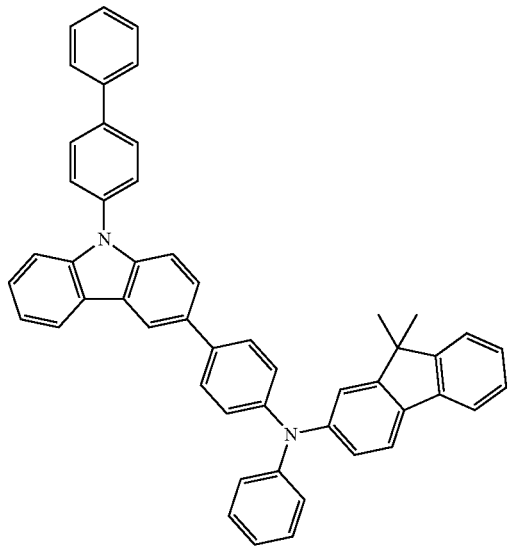
HT5
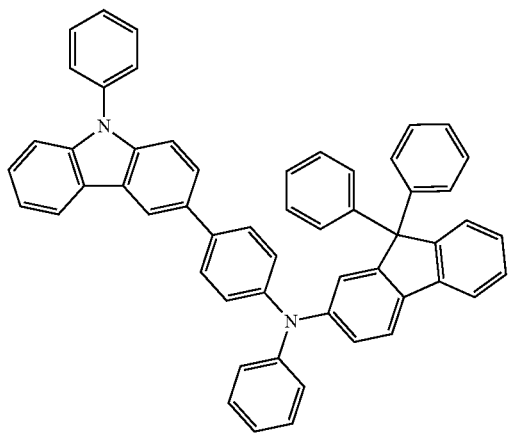
HT6
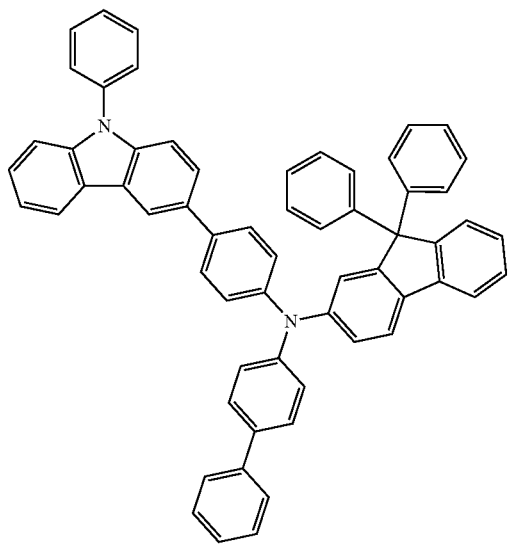
HT7
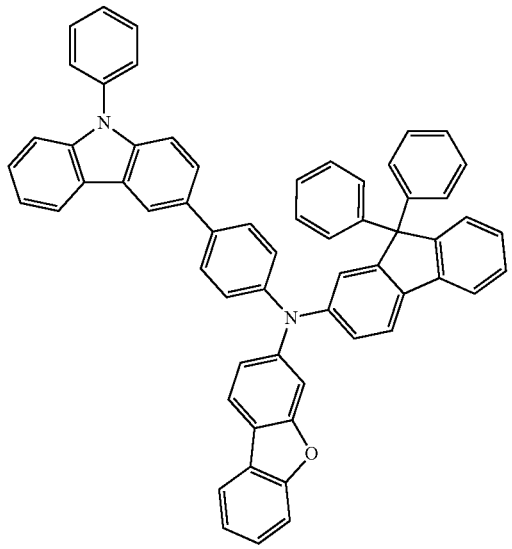
HT8
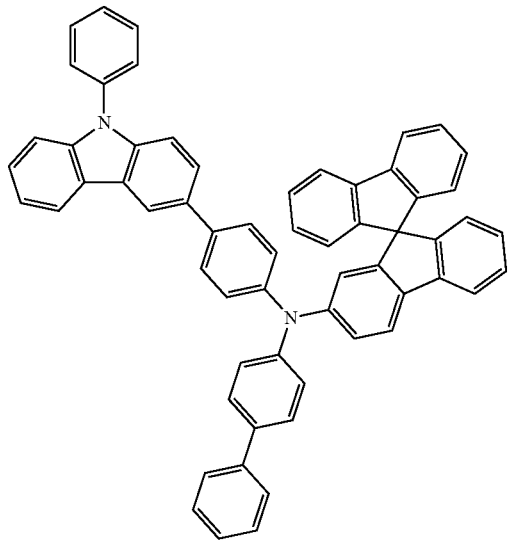

-continued
HT9
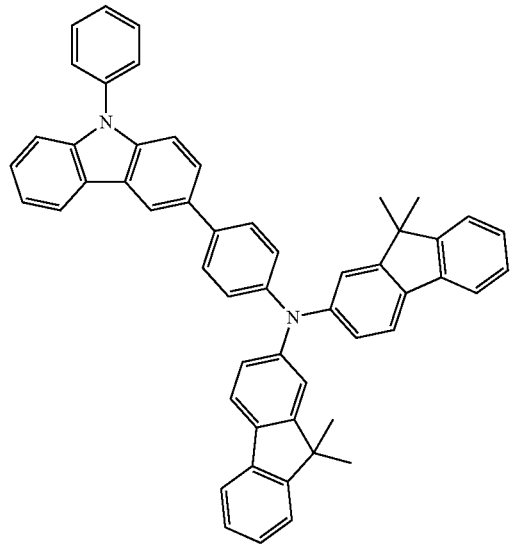
HT10
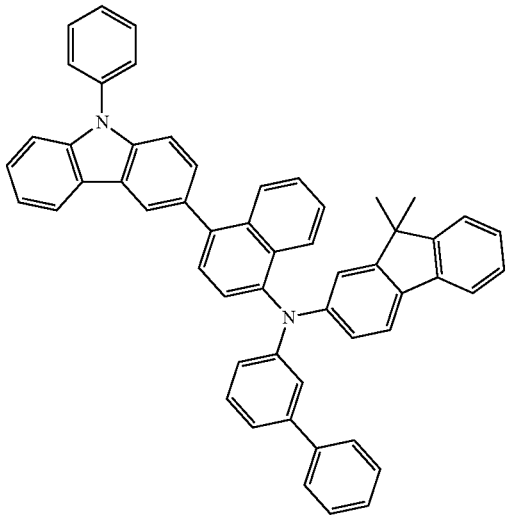
HT11
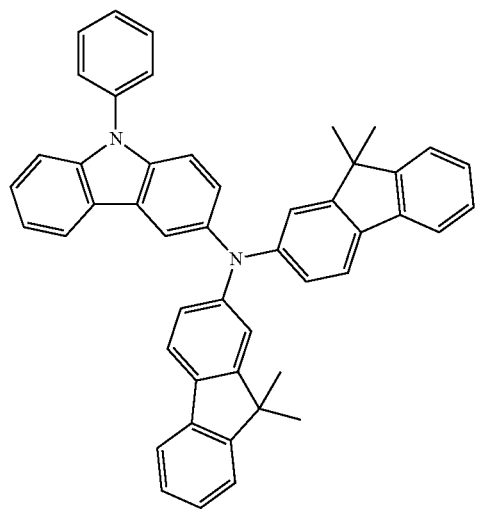
HT12
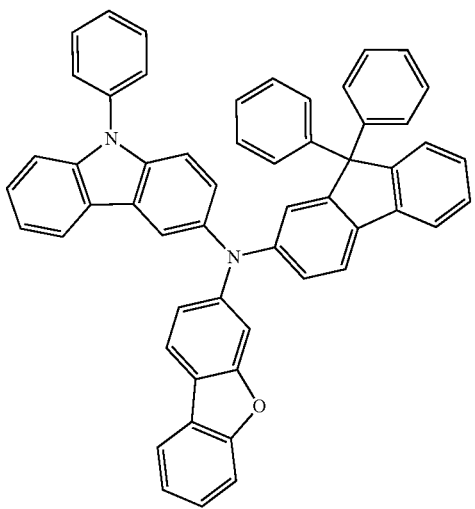
HT13
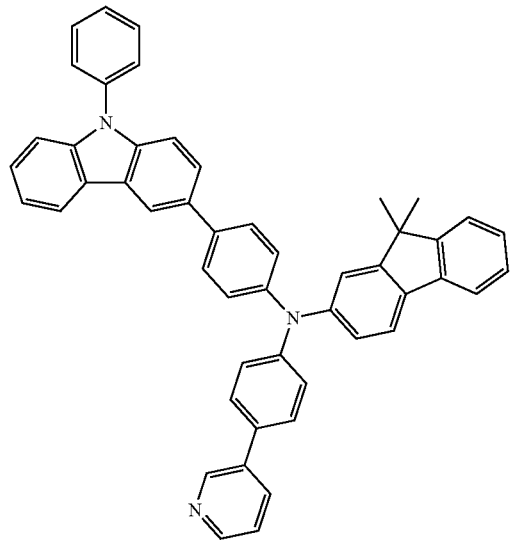
HT14
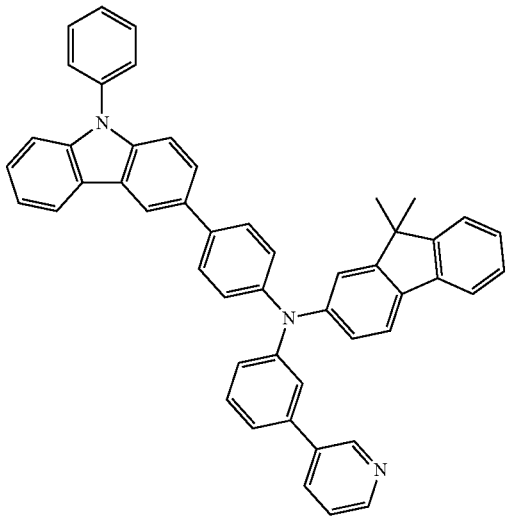

-continued
HT15
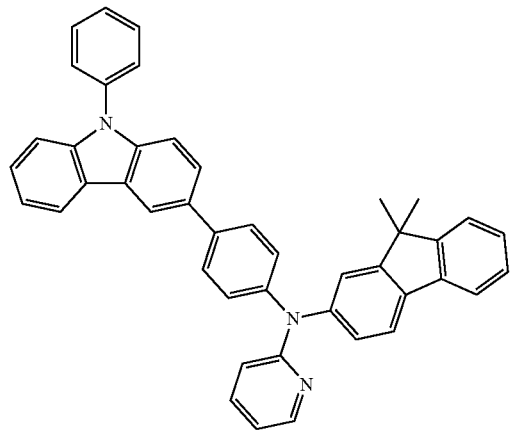
HT16
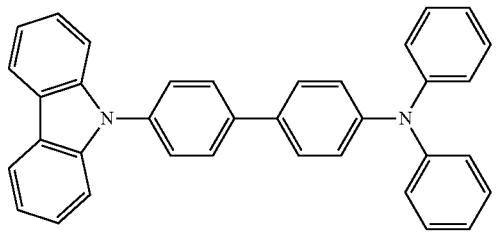
HT17
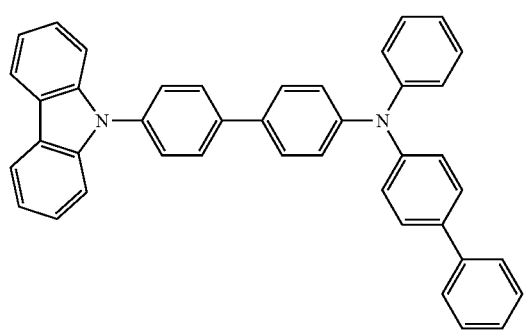
HT18
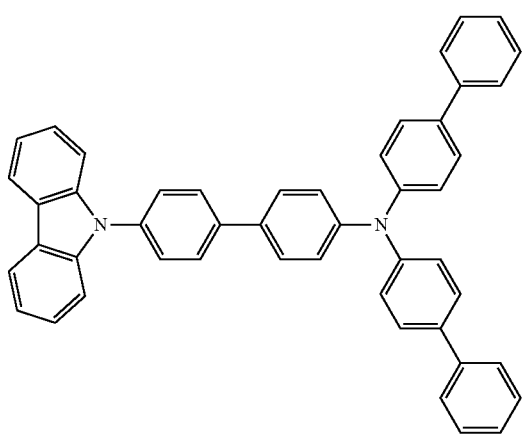
HT19
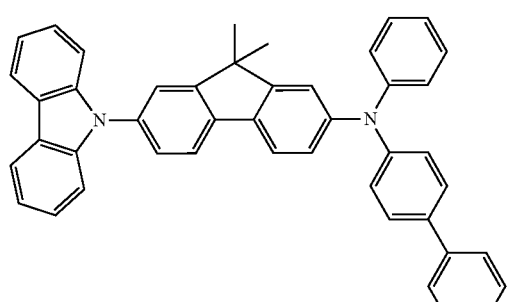
HT20
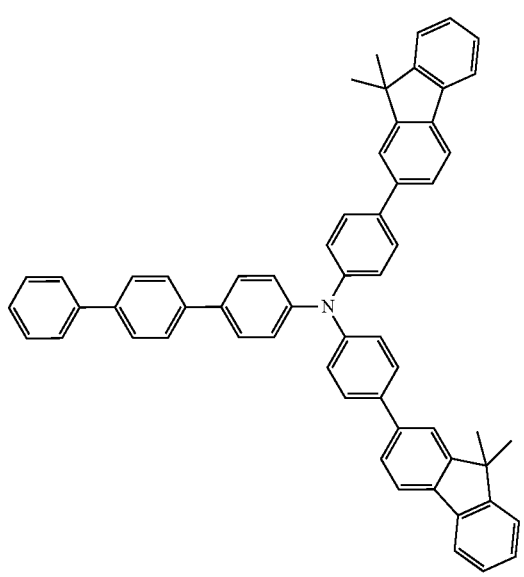

-continued
HT21
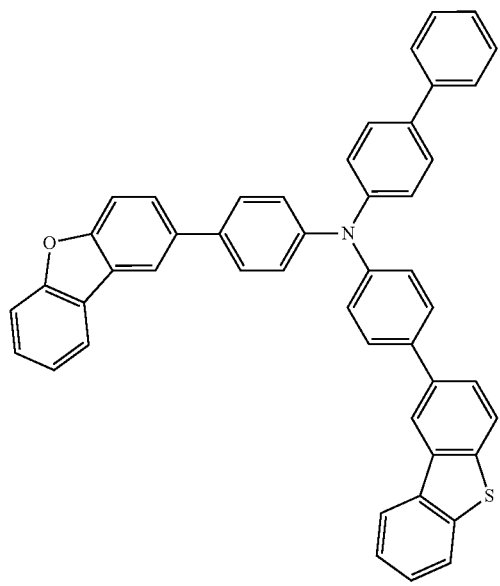
HT22
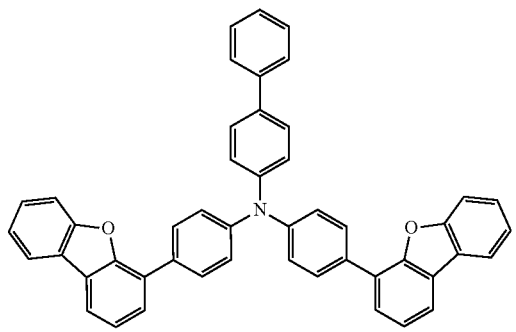
HT23
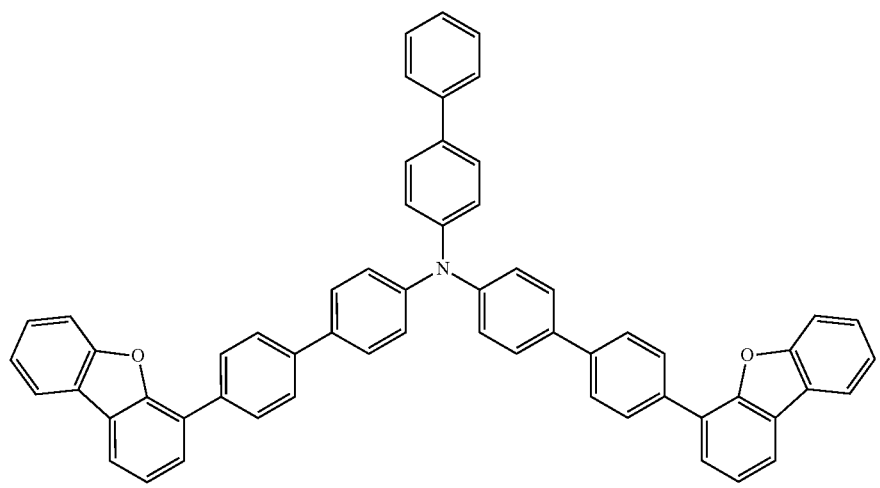
HT24
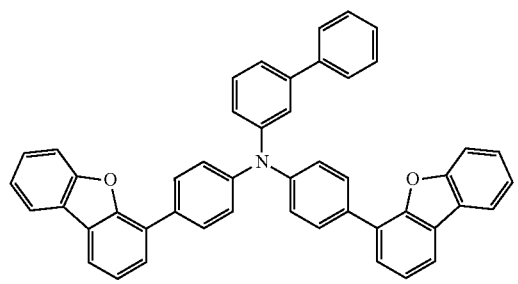
HT25
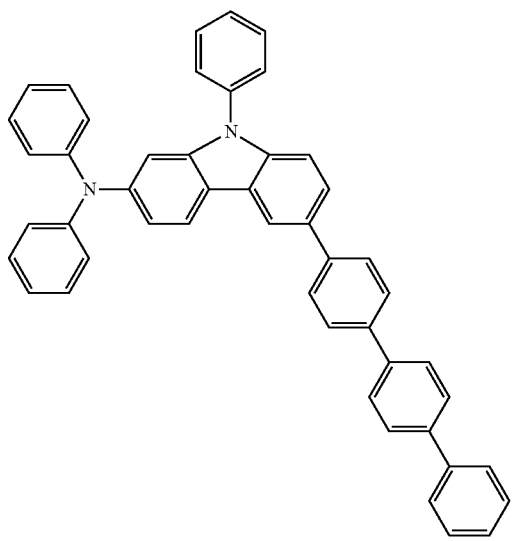

-continued
HT26
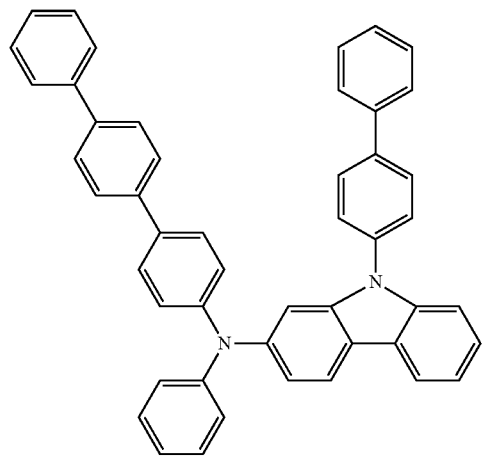
HT27
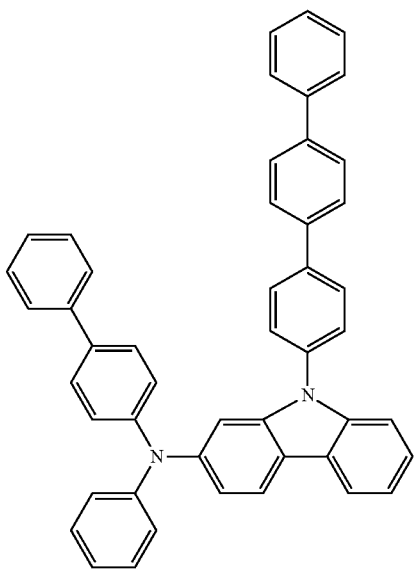
HT28
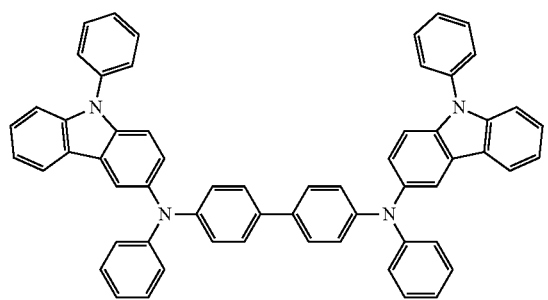
HT29
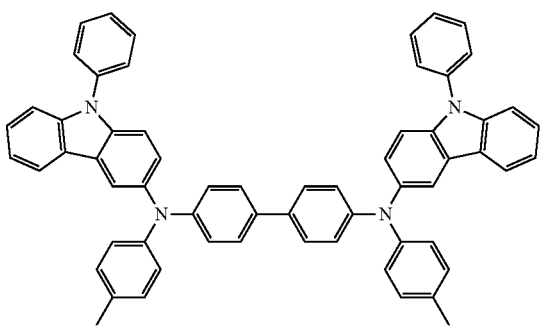
HT30
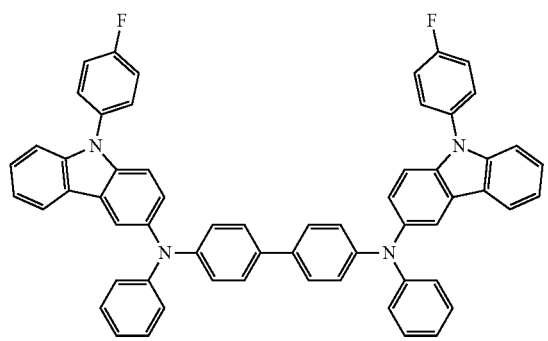
HT31
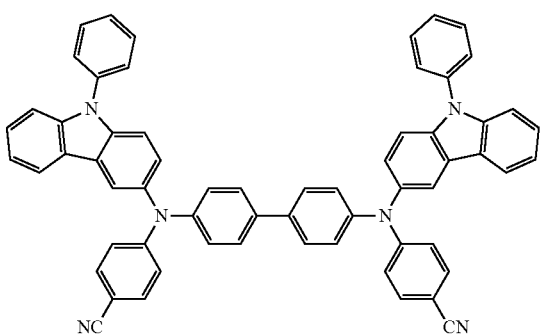

-continued
HT32
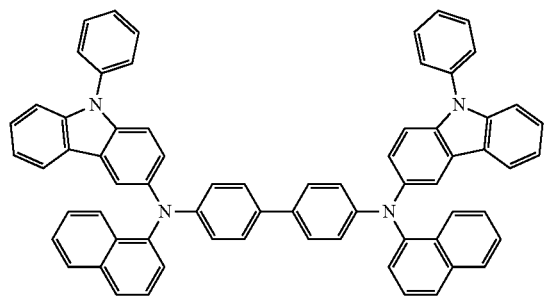
HT33
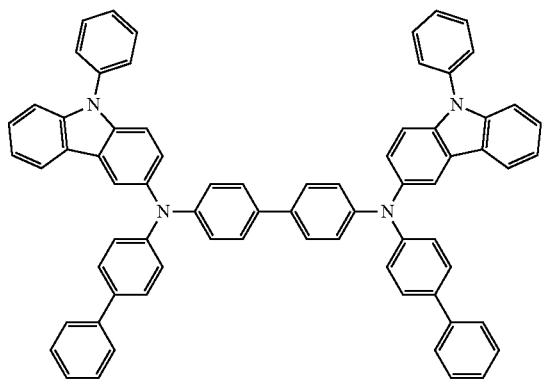
HT34
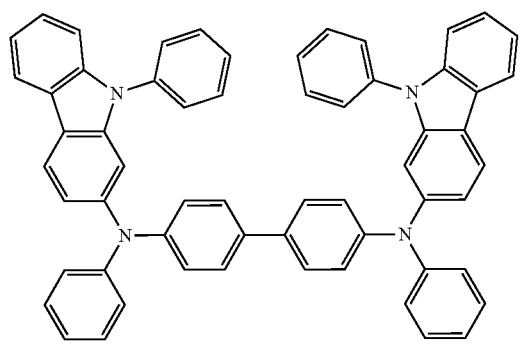
HT35
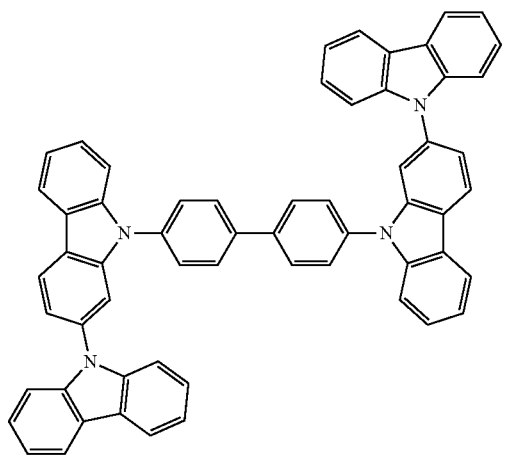
HT36
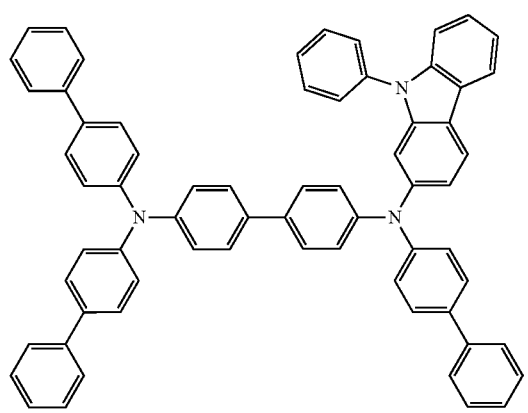
HT37
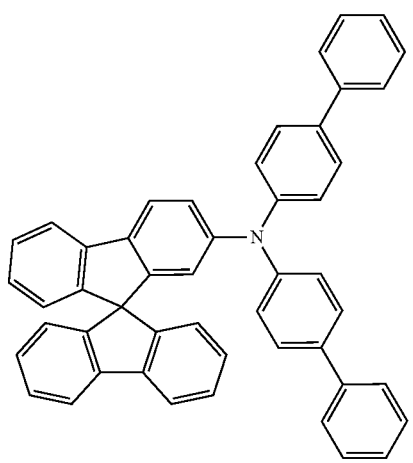

-continued
HT38
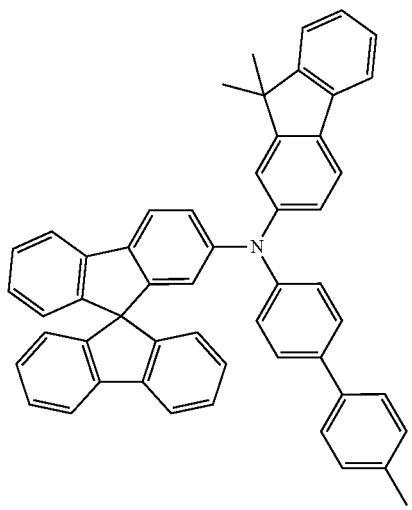
HT39
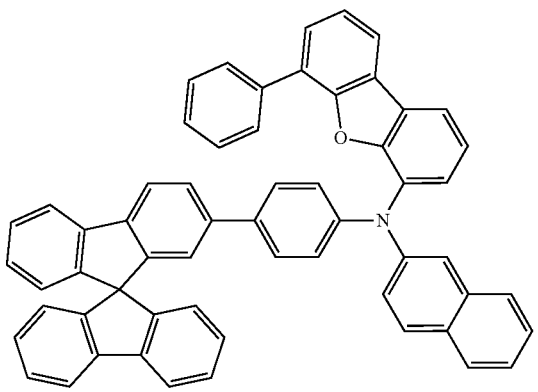
HT40
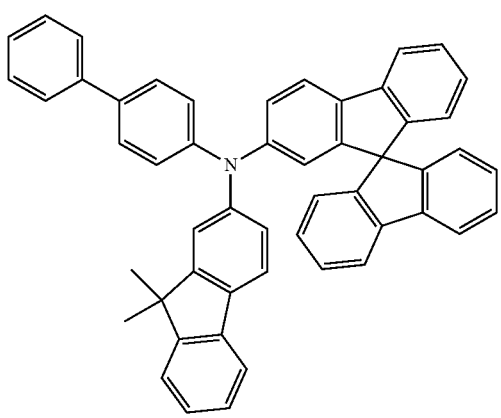
HT41
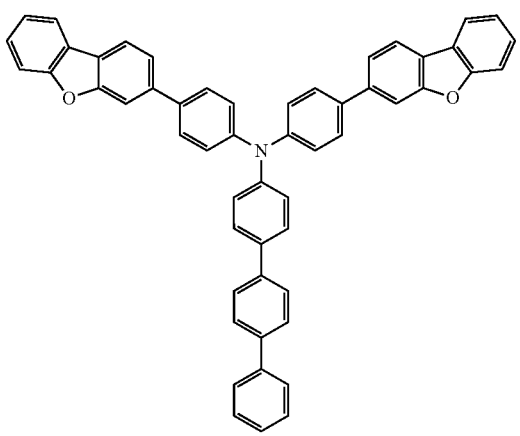
HT42
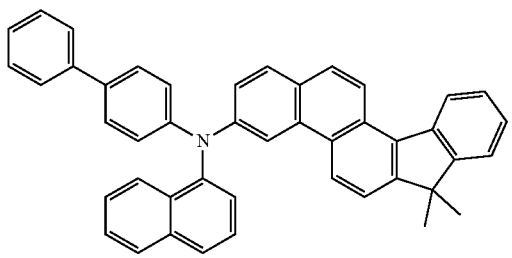
HT43
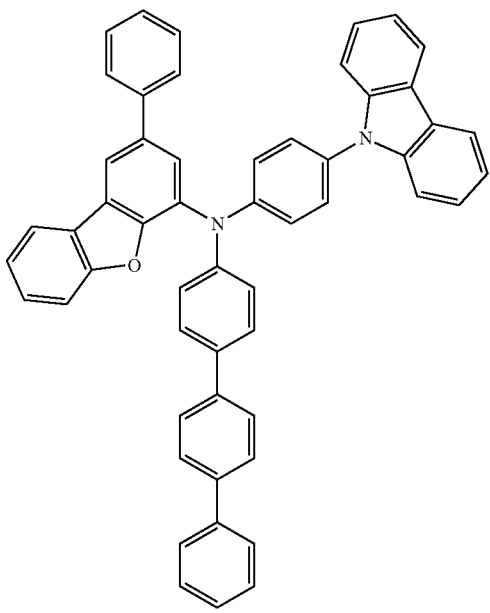

-continued
HT44
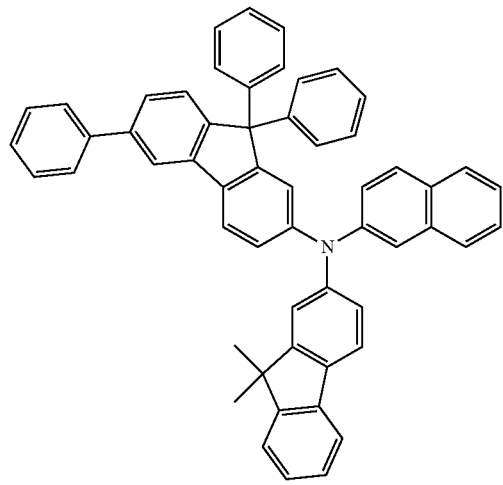
TDATA
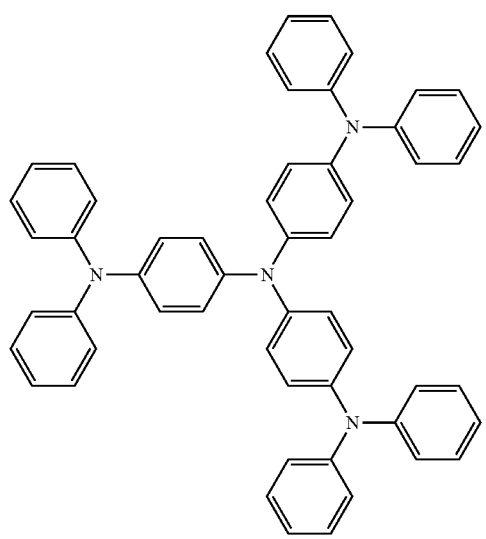
NPB
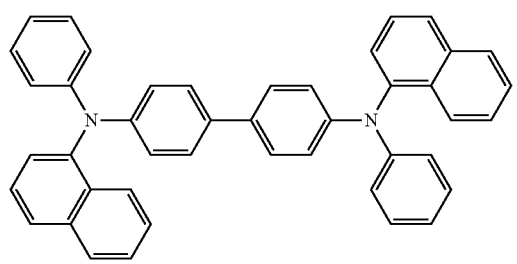
TPD
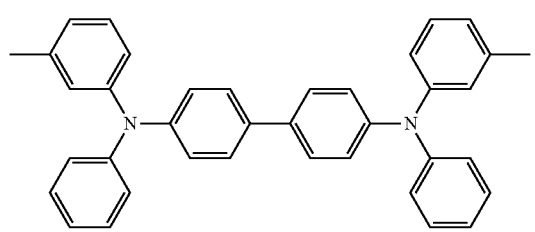
m-MTDATA
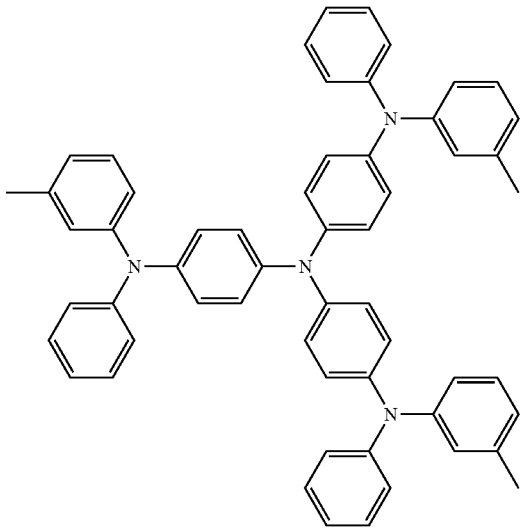
2-TNATA
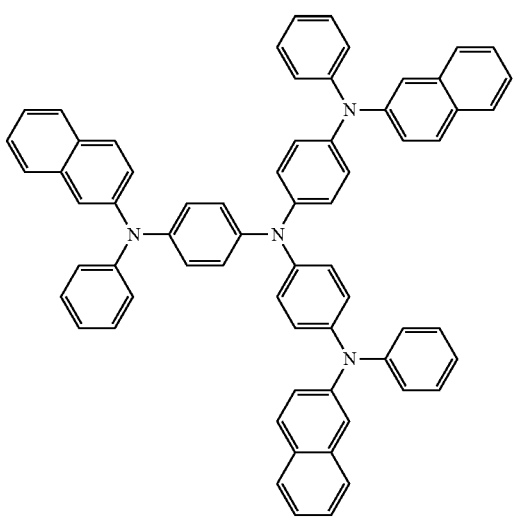
β-NPB
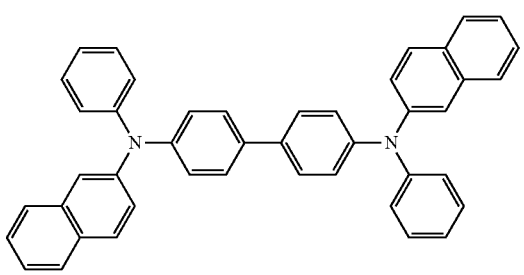
Spiro-TPD
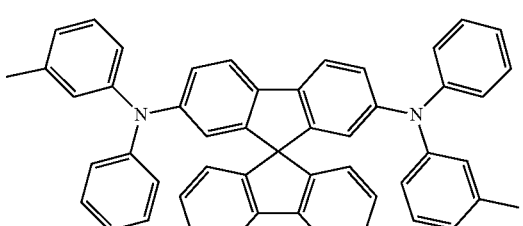

Spiro-NPB

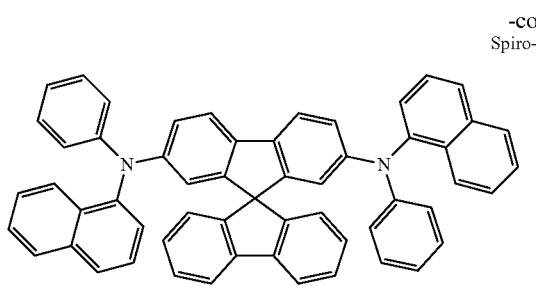

methylated-NPB

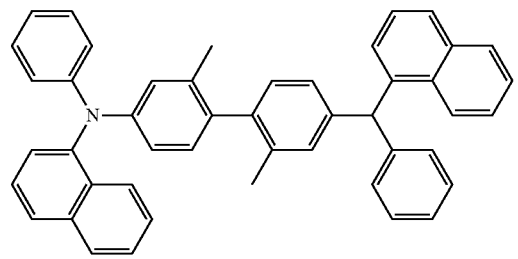

TAPC

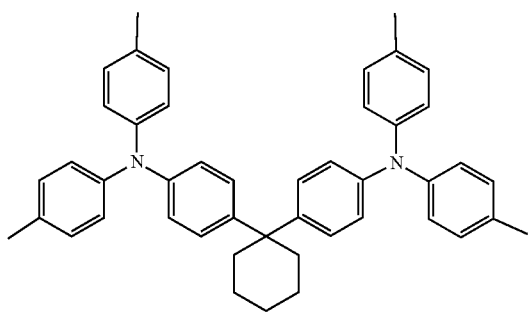

HMTPD

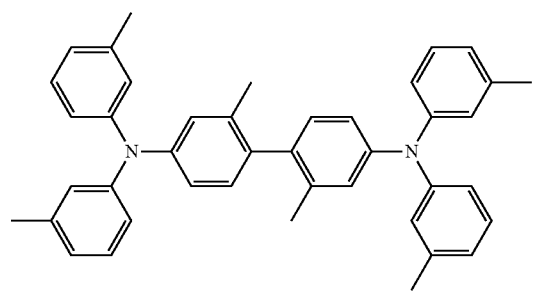

In an embodiment, the light-emitting device 10 or 20 may include a hole injection layer located between the first electrode 110 and the first emission layer and/or located between the n−1$^{th}$ charge generation layer CGL(n−1) and the n$^{th}$ emission layer.

The hole injection layer may include a hole transporting organic compound or may include a hole transporting organic compound and an inorganic semiconductor material. The hole transporting organic compound and the inorganic semiconductor material may each independently be the same as described above.

When the hole injection layer includes a hole transporting organic compound and an inorganic semiconductor material, a volume ratio of the hole transporting organic compound to the inorganic semiconductor material may be in a range of about 99:1 to about 80:20.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted from the emission layer, and the electron blocking layer may block the flow of electrons from an electron transport region. The emission auxiliary layer and the electron blocking layer may include the materials as described above.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of the charge-generation material).

The charge-generation material may be, for example, a p-dopant.

In an embodiment, a lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Non-limiting examples of the quinone derivative may include TCNQ, F4-TCNQ, etc.

Non-limiting examples of the cyano group-containing compound may include HAT-CN, NDP-9, a compound represented by Formula 221 below, etc.

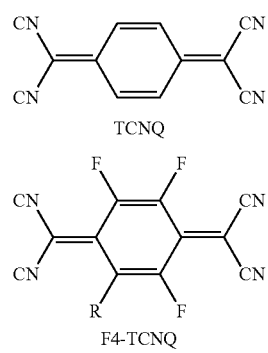

TCNQ

F4-TCNQ

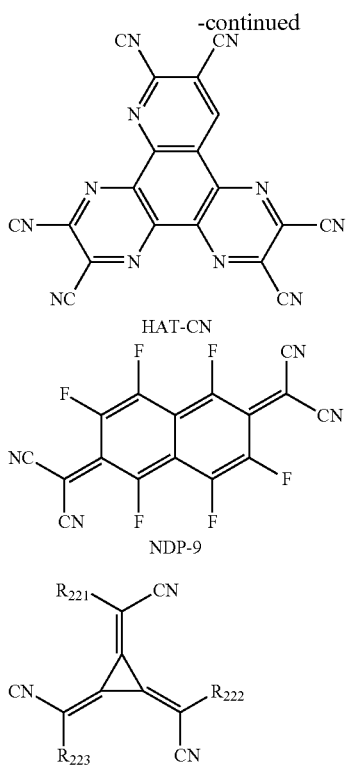

HAT-CN

NDP-9

Formula 222

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Non-limiting examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and/or a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Non-limiting examples of the metalloid may include silicon (Si), antimony (Sb), and/or tellurium (Te).

Non-limiting examples of the non-metal may include oxygen (O) and/or halogen (for example, F, Cl, Br, I, etc.).

In an embodiment, non-limiting examples of the compound containing element EL1 and element EL2 may include a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, or any combination thereof.

Non-limiting examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (for example, MoO, $Mo_2O_3$, $MoO_2$, $MoO_3$, $Mo_2O_5$, etc.), and/or rhenium oxide (for example, $ReO_3$, etc.).

Non-limiting examples of the metal halide may include an alkali metal halide, an alkaline earth metal halide, a transition metal halide, a post-transition metal halide, and/or a lanthanide metal halide.

Non-limiting examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Non-limiting examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Non-limiting examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and/or gold halide (for example, AuF, AuCl, AuBr, AuI, etc.).

Non-limiting examples of the post-transition metal halide may include zinc halide (for example, $ZnF_2$, $ZnCl_2$, $ZnBr_2$, $ZnI_2$, etc.), indium halide (for example, $InI_3$, etc.), and/or tin halide (for example, $SnI_2$, etc.).

Non-limiting examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and/or $SmI_3$.

Non-limiting examples of the metalloid halide may include antimony halide (for example, $SbCl_5$, etc.).

Non-limiting examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and/or a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer

Each of the m emission units ELU includes an emission layer. Each of the m emission units ELU may include one emission layer or two or more emission layers.

A plurality of emission layers of the m emission units ELU may each emit light of the same color or may each emit light of different colors. In an embodiment, each of the plurality of emission layers may emit blue light, but embodiments of the present disclosure are not limited thereto.

The emission layer may include a host and a dopant. The dopant may include a phosphorescent dopant, a fluorescent dopant, or any combination thereof.

An amount of the dopant in the emission layer may be from (e.g., in a range of) about 0.01 parts by weight to about 15 parts by weight based on 100 parts by weight of the host.

In one or more embodiments, the emission layer may include a quantum dot.

In an embodiment, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within these ranges, excellent or desired light-emission characteristics may be obtained without a substantial increase in driving voltage.

Host

The host may include a compound represented by Formula 301 below:

$$[Ar_{301}]_{xb11}-[(L_{301})_{xb1}-R_{301}]_{xb21} \quad \text{Formula 301}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer selected from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer selected from 1 to 5, and $Q_{301}$ to $Q_{303}$ may each independently be the same as described in connection with $Q_1$.

For example, when xb11 in Formula 301 is 2 or more, two or more of $Ar_{301}(s)$ may be linked to each other via a single bond.

In an embodiment, the host may include a compound represented by Formula 301-1, a compound represented by Formula 301-2, or any combination thereof:

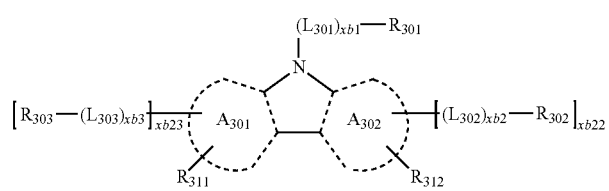

Formula 301-1

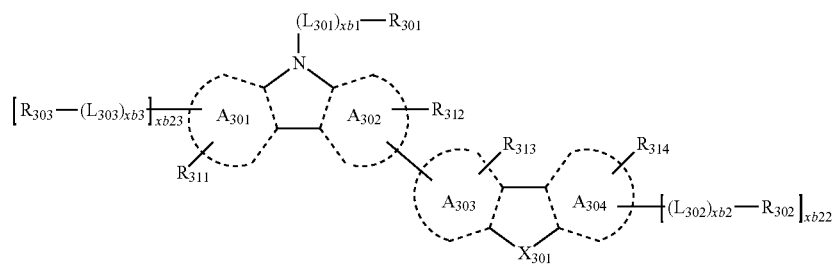

Formula 301-2

In Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each independently be the same as described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In an embodiment, the host may include an alkaline earth metal complex, a Zn complex, or any combination thereof. In an embodiment, the host may include a Be complex (for example, Compound H55), an Mg complex, a Zn complex, or a combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof, but embodiments of the present disclosure are not limited thereto:

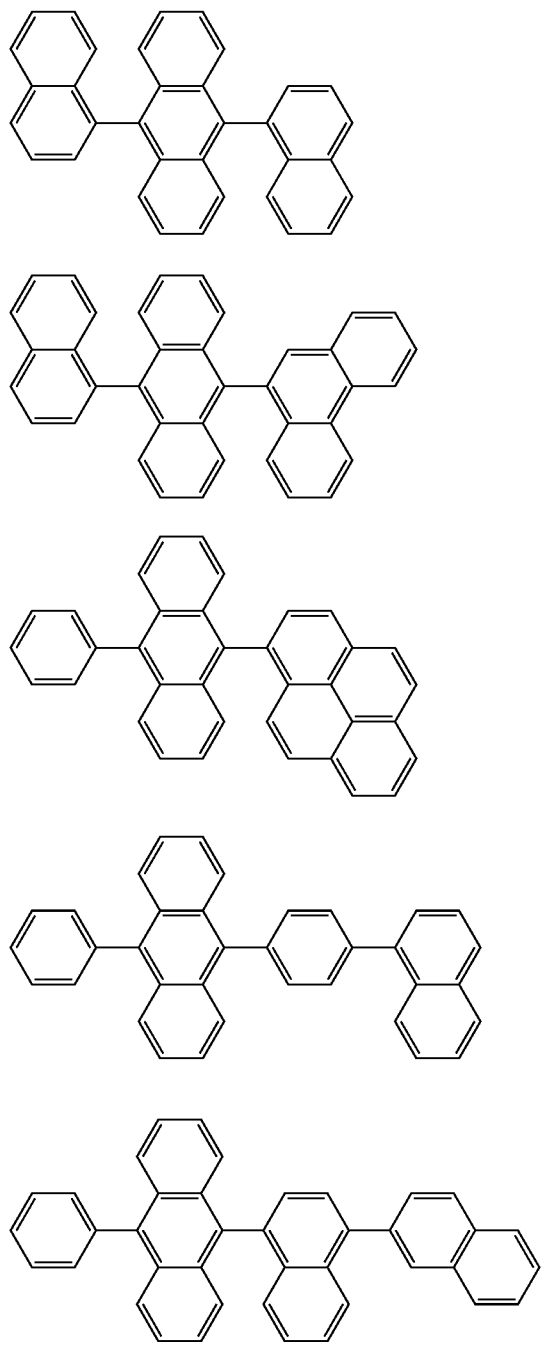
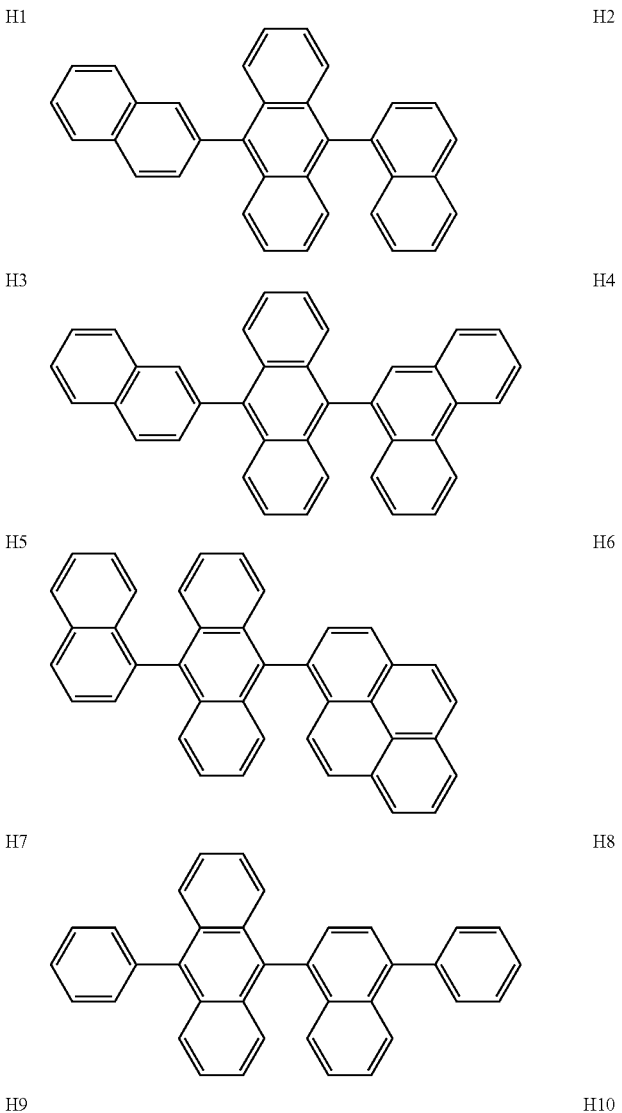

-continued
H11
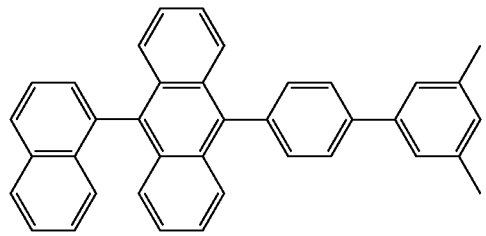
H12
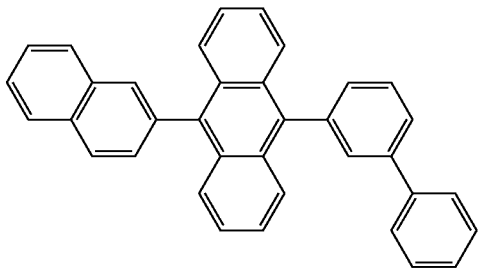
H13
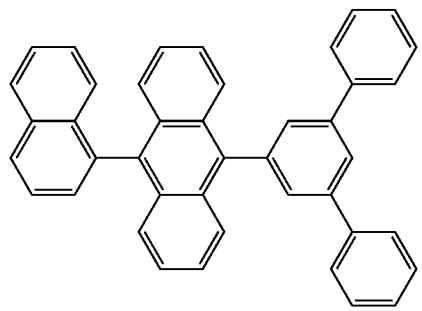
H14
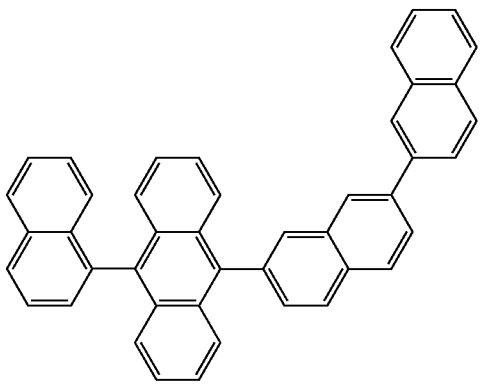
H15
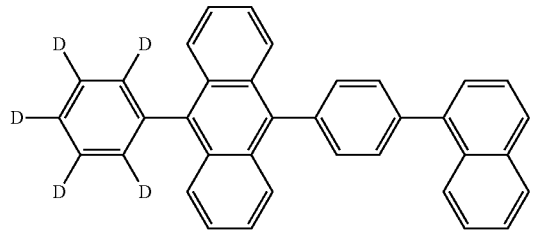
H16
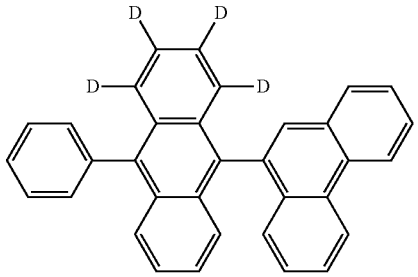
H17
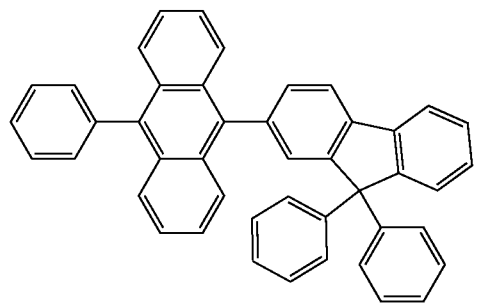
H18
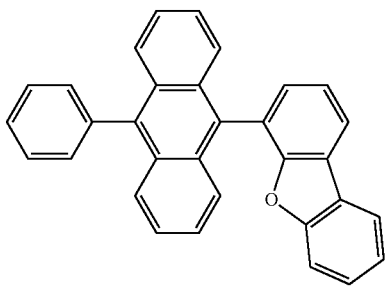
H19
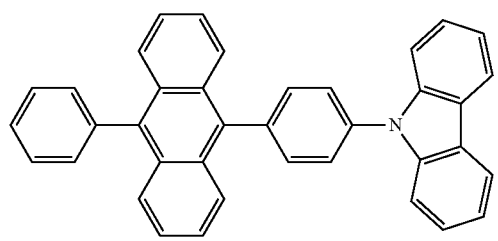
H20
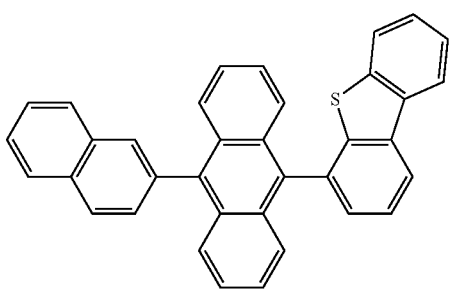

-continued
H21
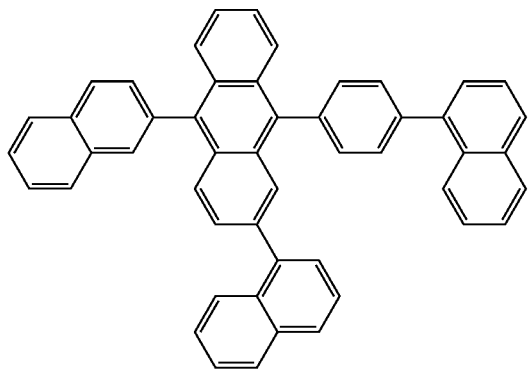
H22
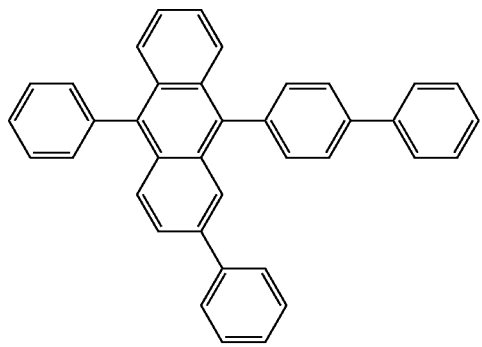
H23
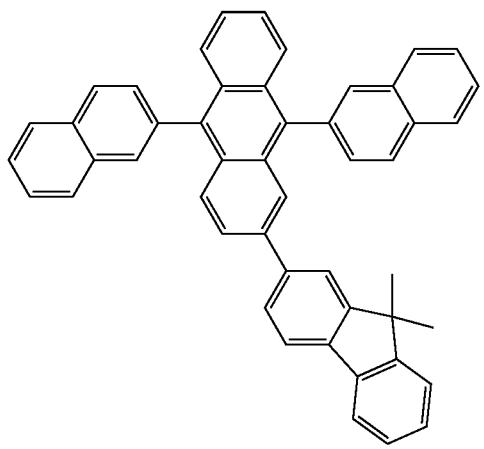
H24
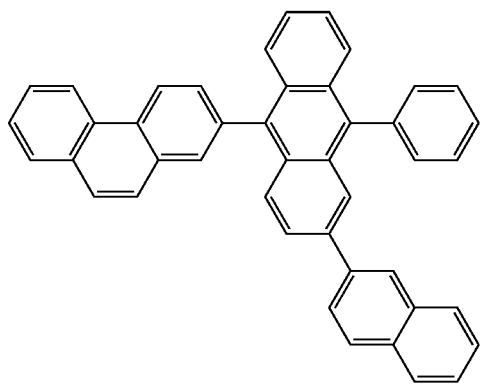
H25
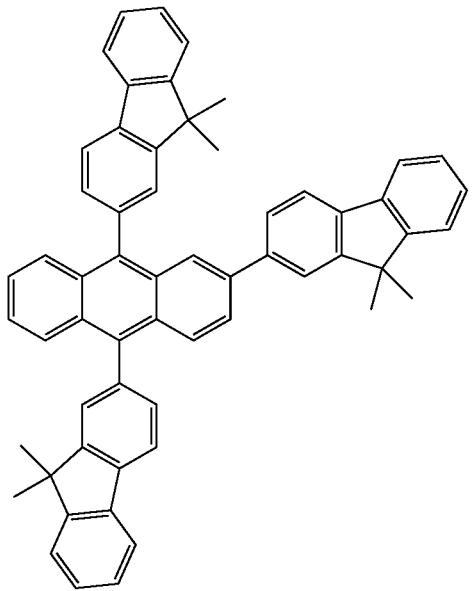
H26
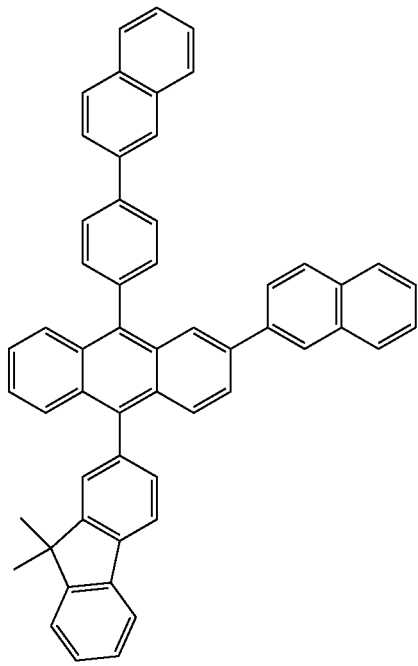

-continued
H27
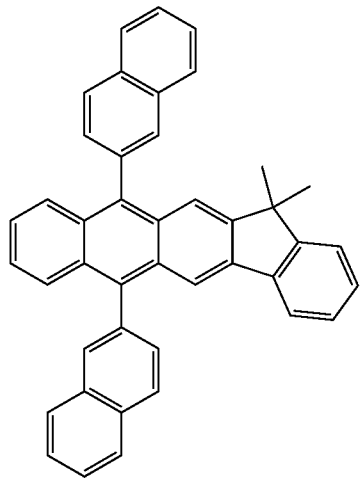
H28
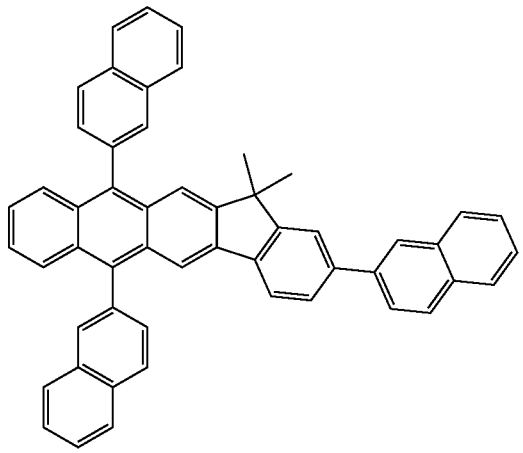
H29
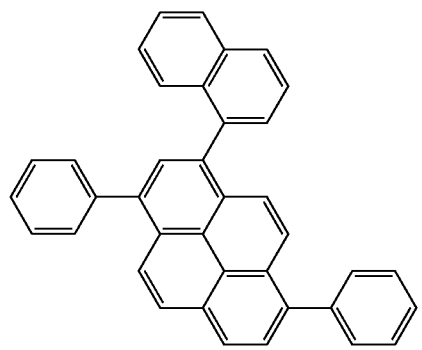
H30
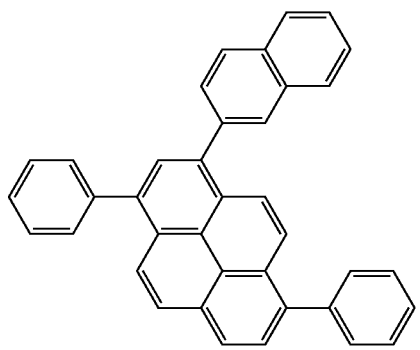
H31
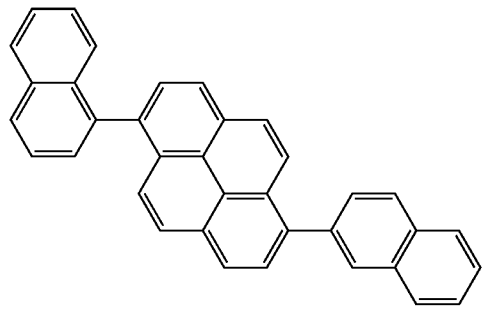
H32
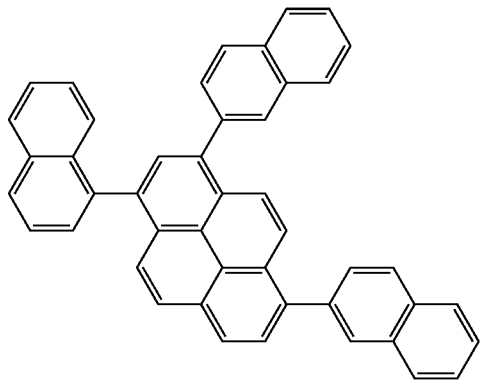
H33
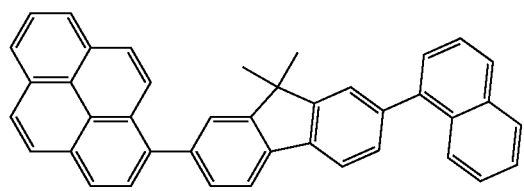

-continued
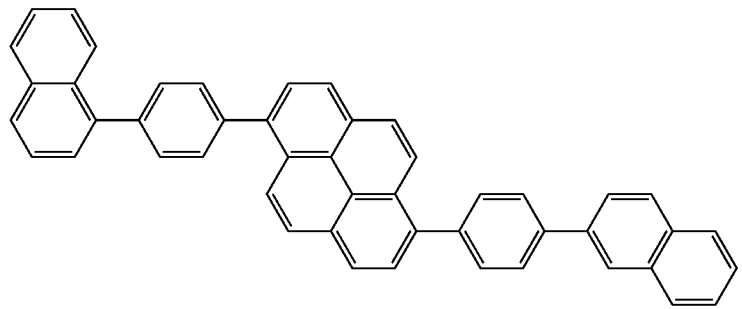
H34
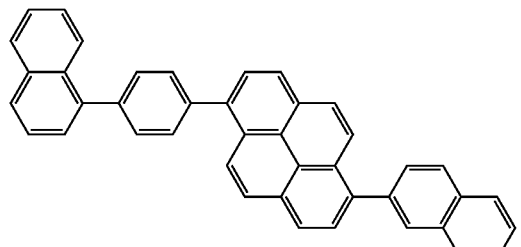
H35
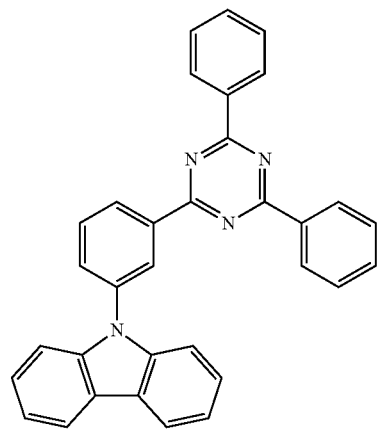
H36
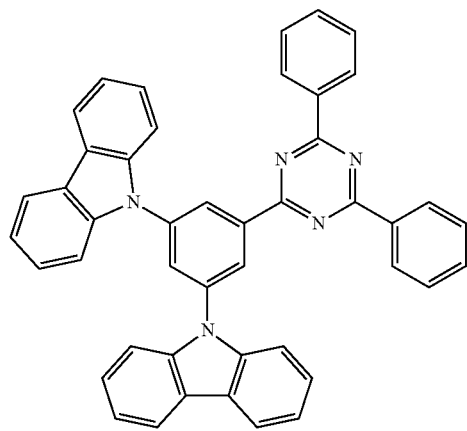
H37
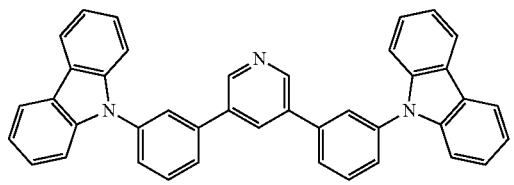
H38

-continued
H39
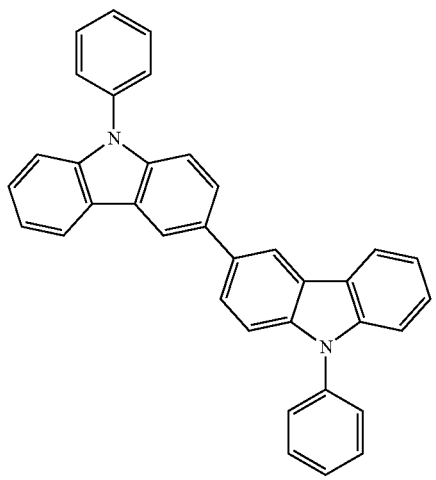
H40
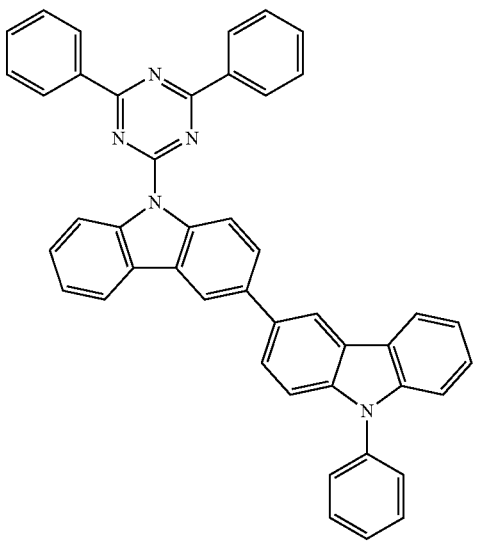
H41
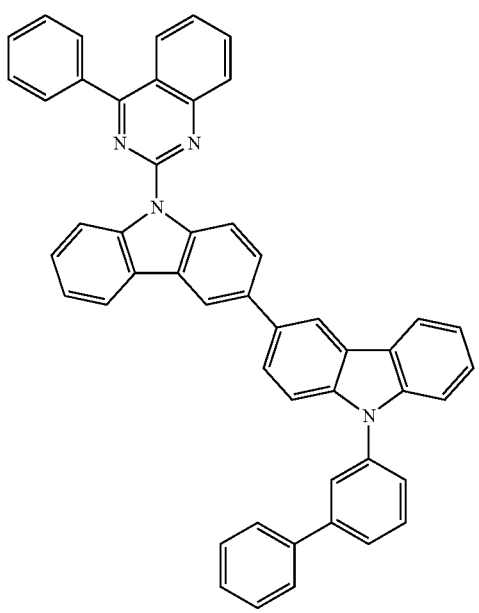
H42
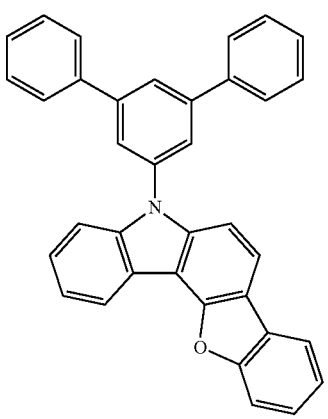
H43
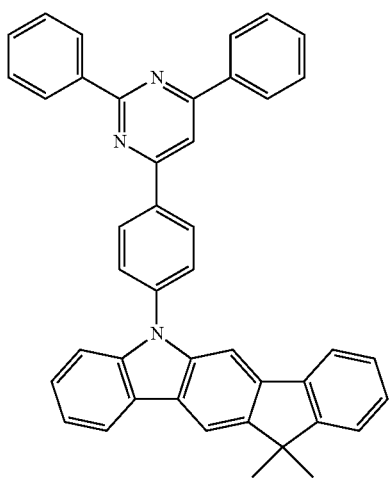
H44
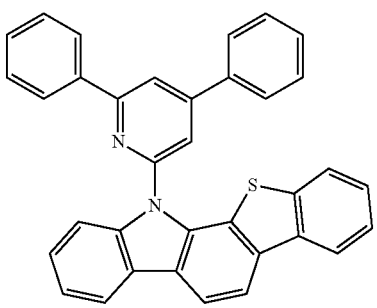

-continued
H45
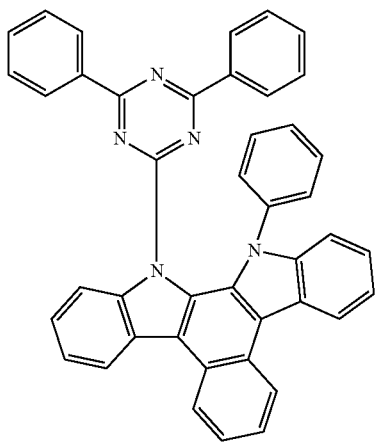
H46
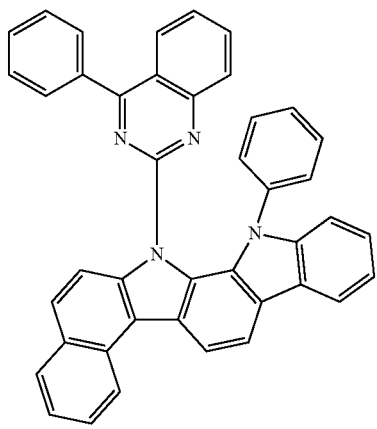
H47
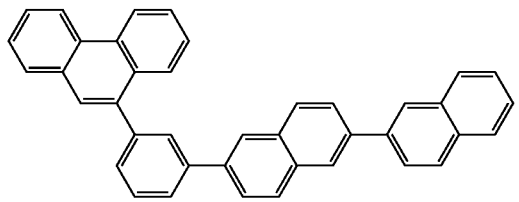
H48
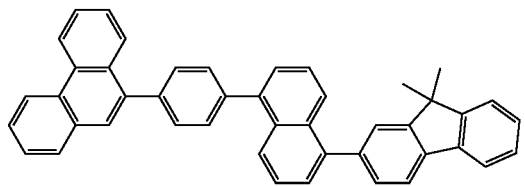
H49
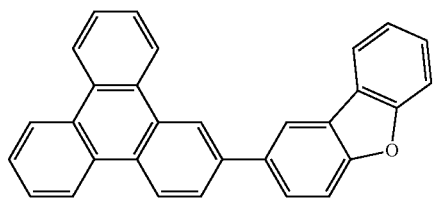
H50
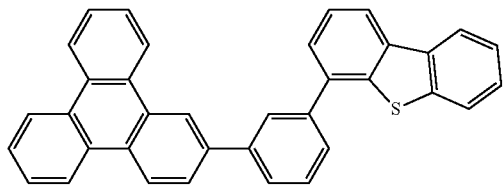
H51
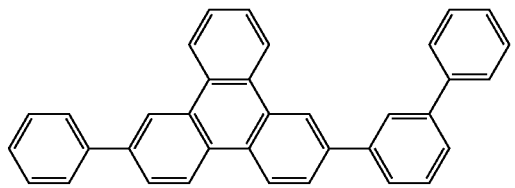
H52
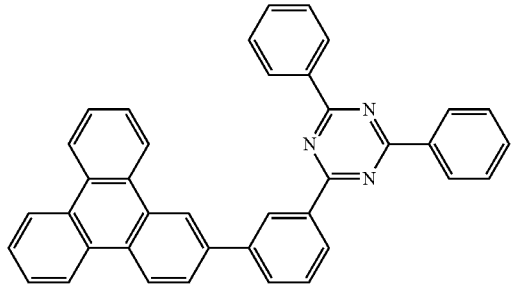
H53
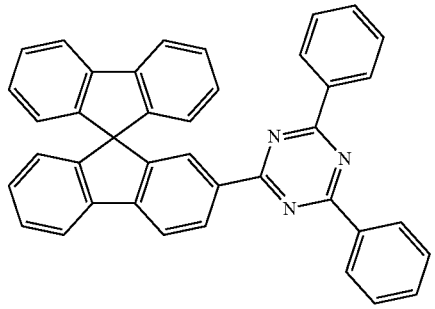

-continued
H54
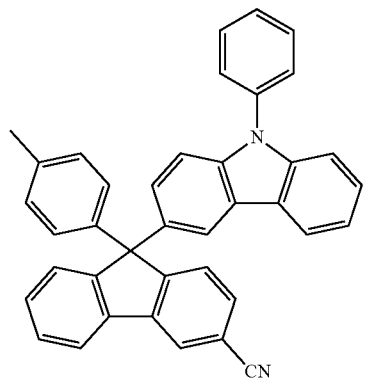
H55
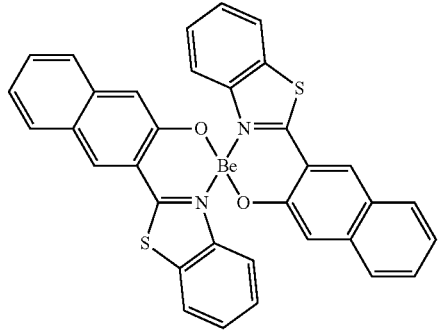
H56
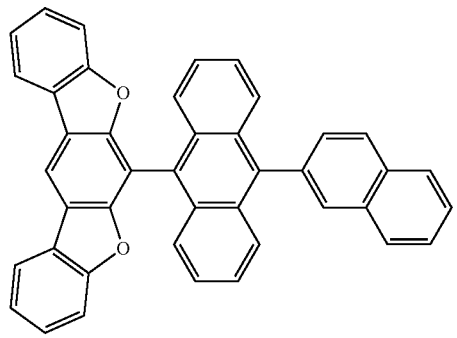
H57
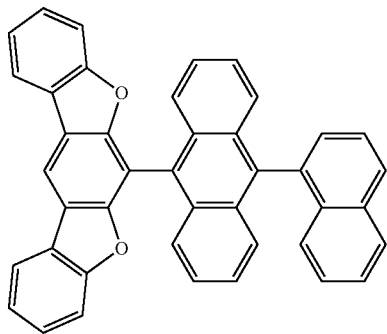
H58
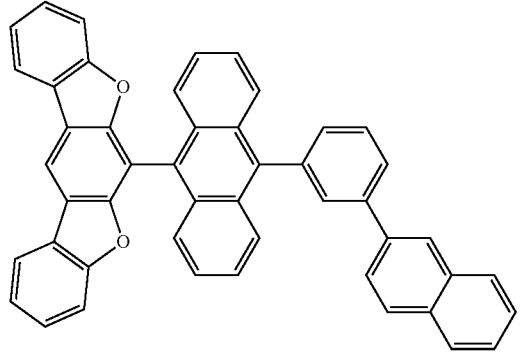
H59
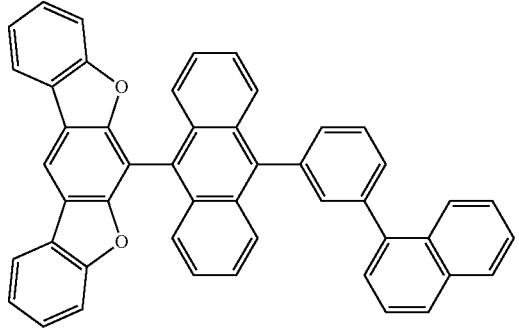
H60
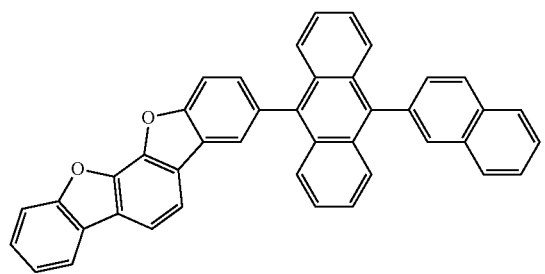
H61
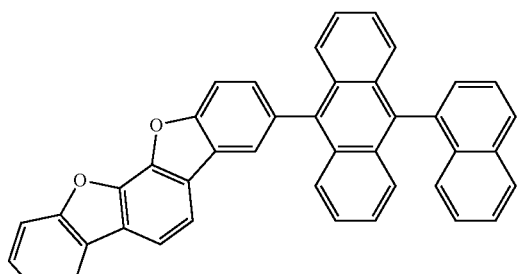

-continued
H62
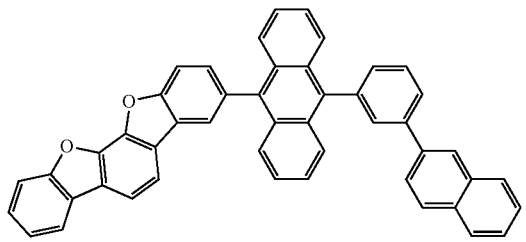
H63
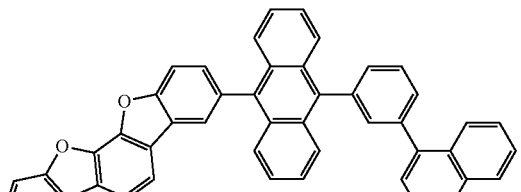
H64
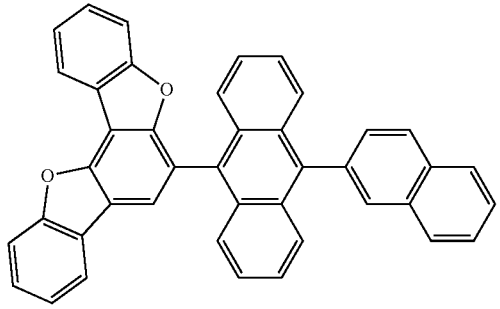
H65
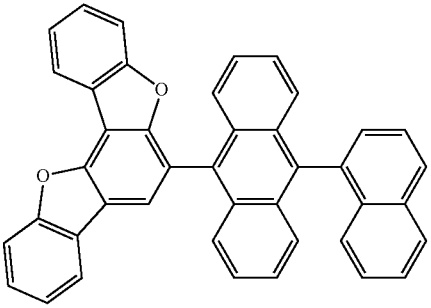
H66
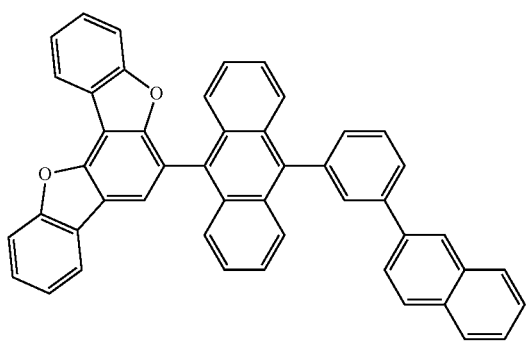
H67
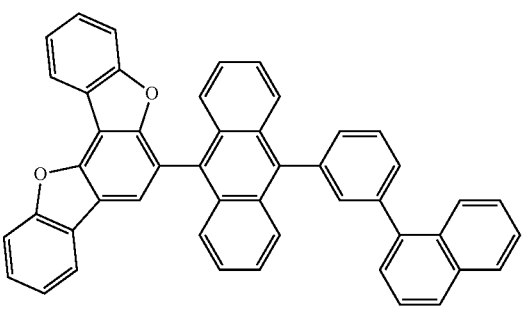
H68
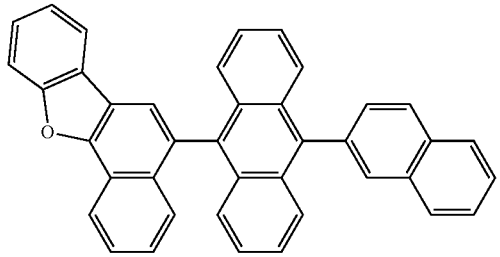
H69
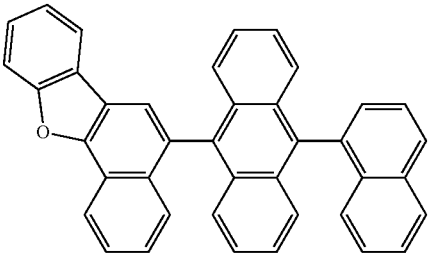
H70
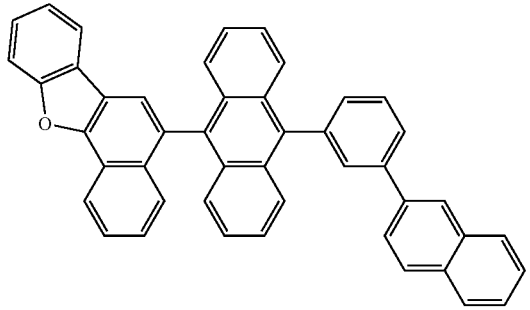
H71
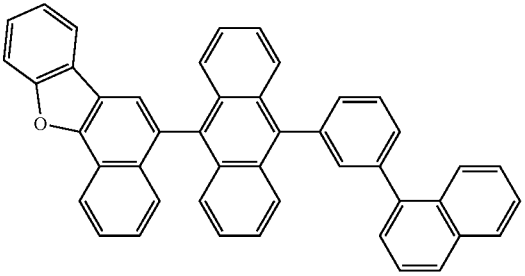

-continued
H72
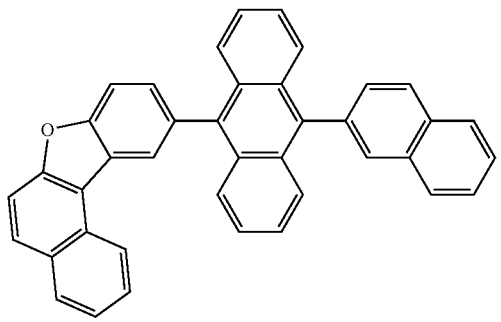
H73
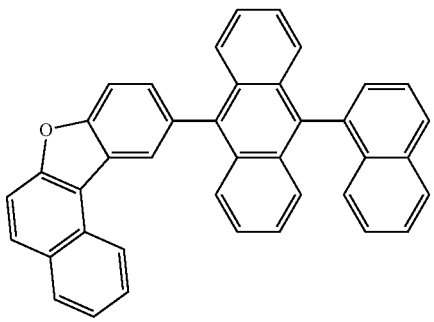
H74
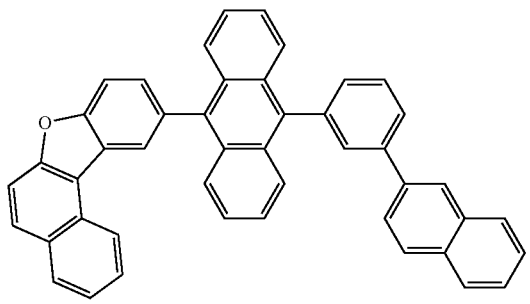
H75
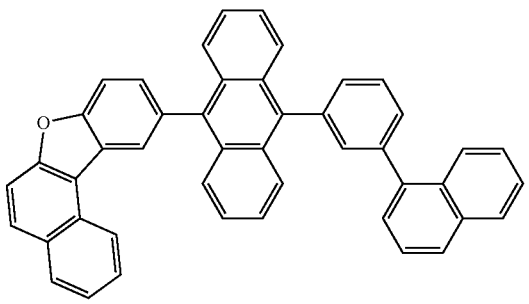
H76
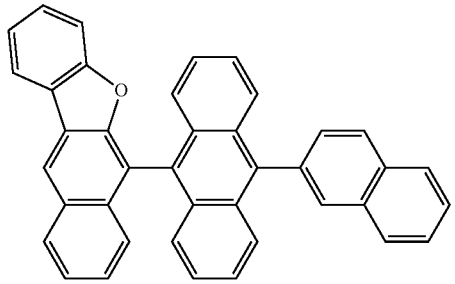
H77
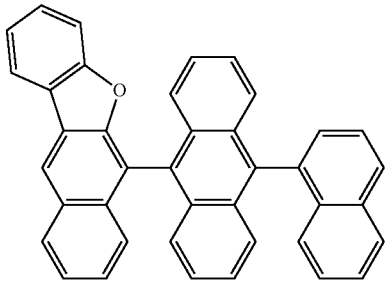
H78
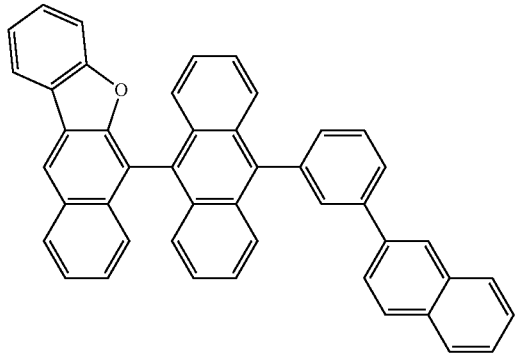
H79
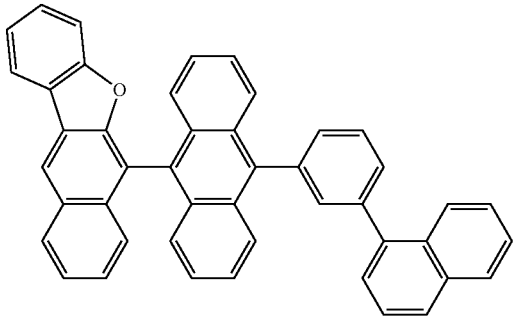

-continued
H80
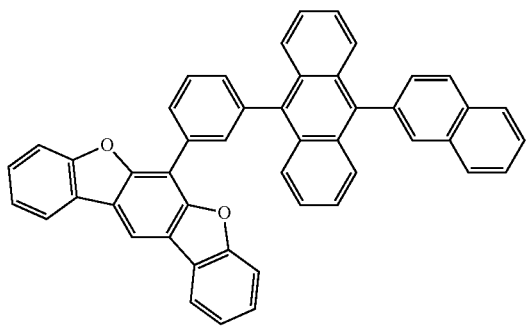
H81
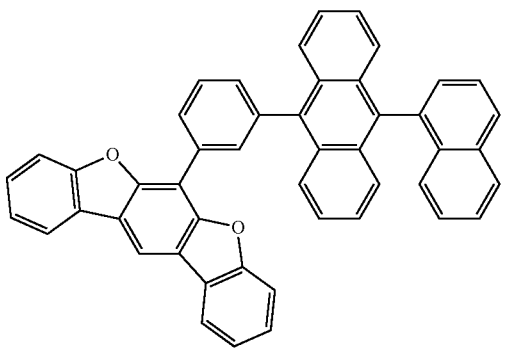
H82
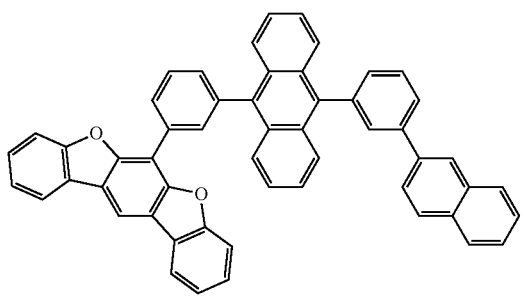
H83
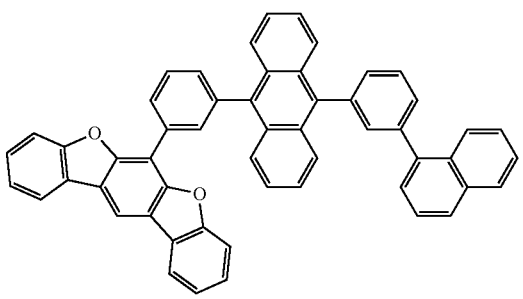
H84
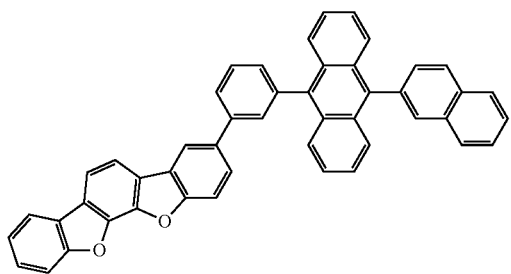
H85
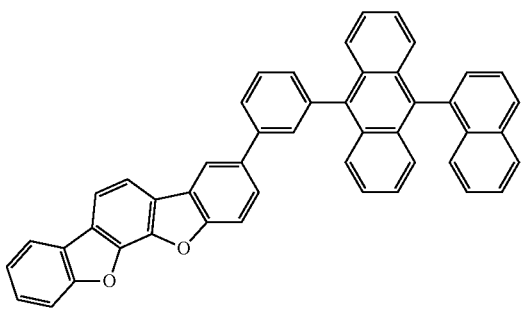
H86
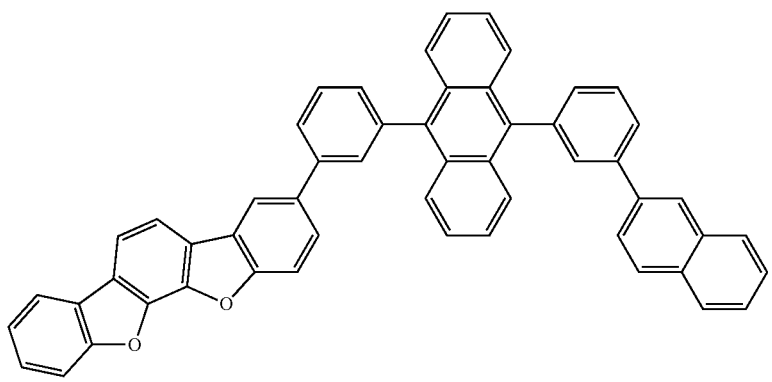

-continued
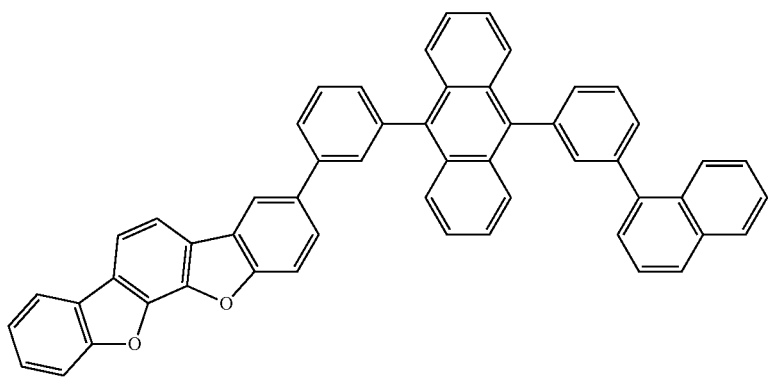
H87
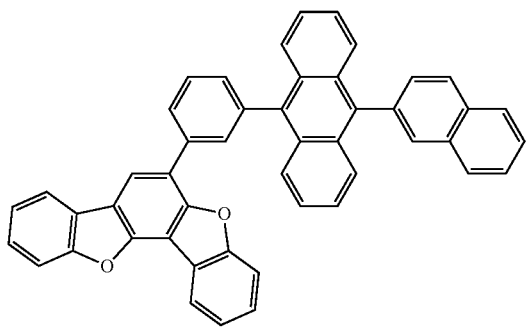
H88
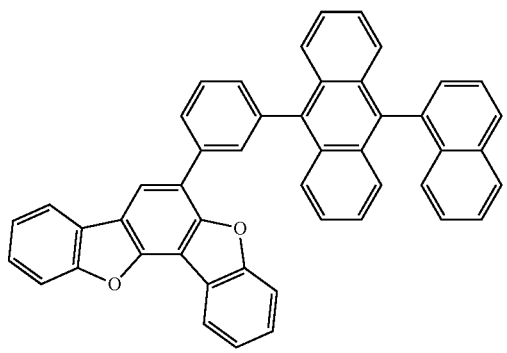
H89
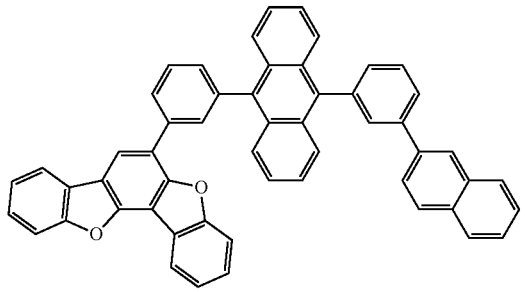
H90
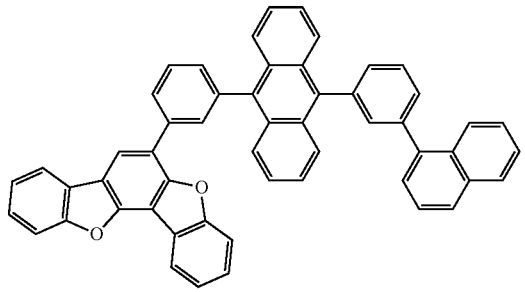
H91
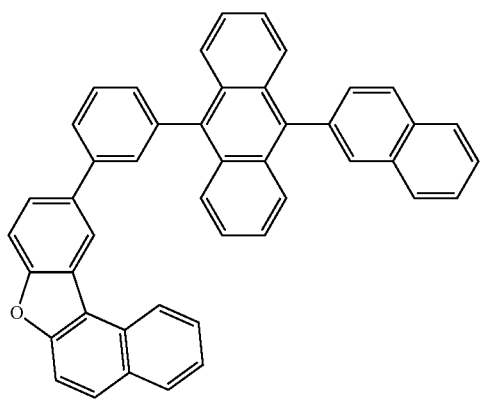
H92
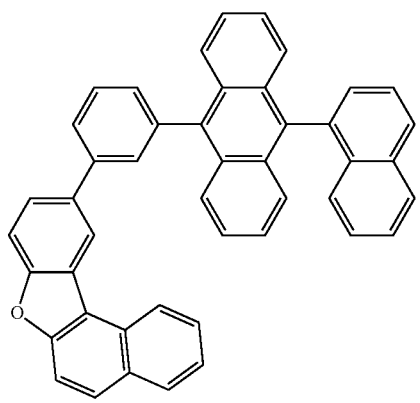
H93

-continued
H94
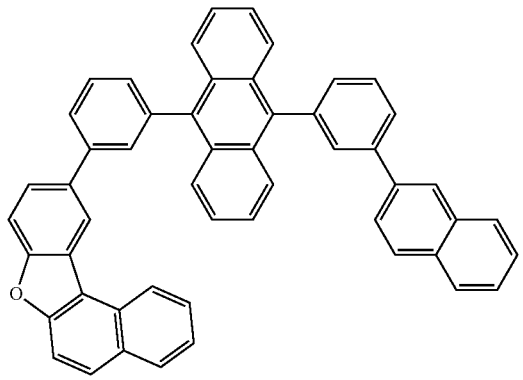
H95
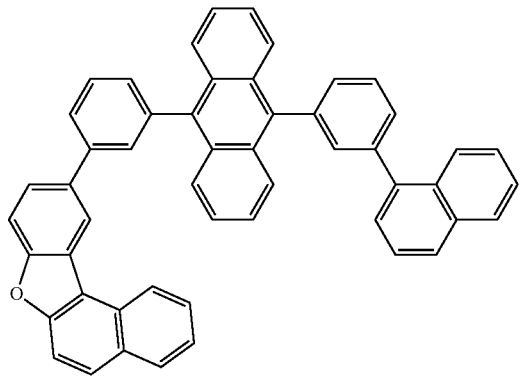
H96
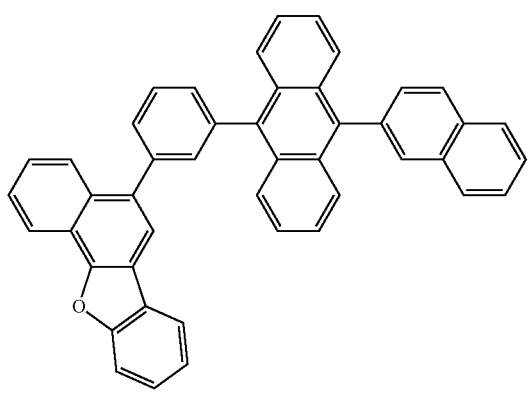
H97
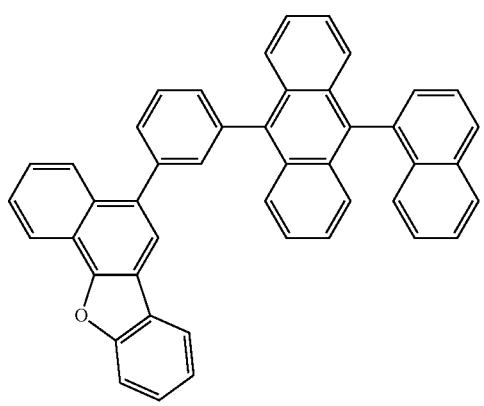
H98
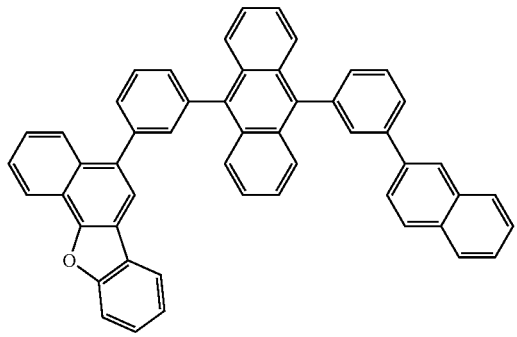
H99
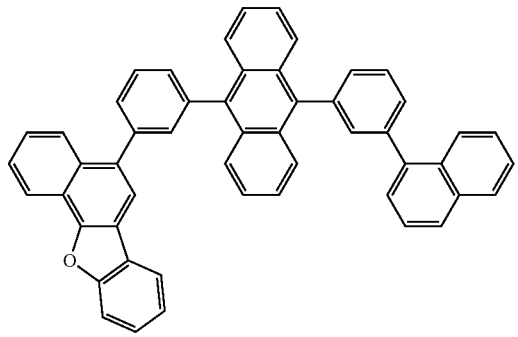
H100
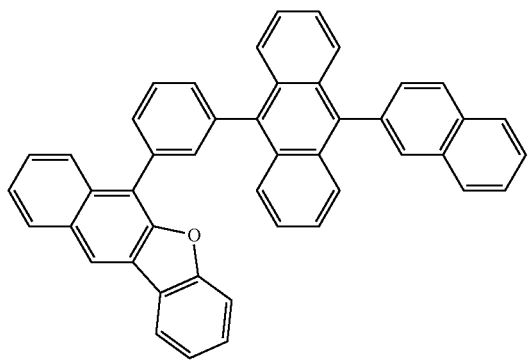
H101
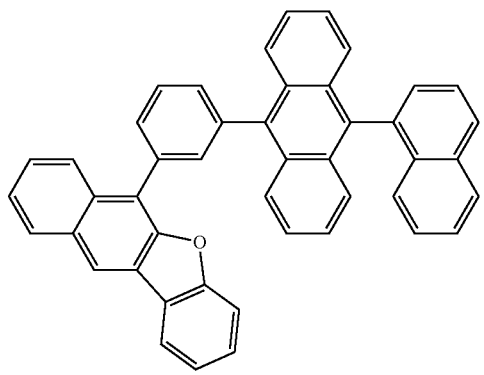

-continued
H102
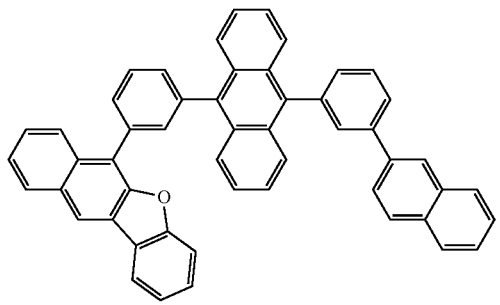
H103
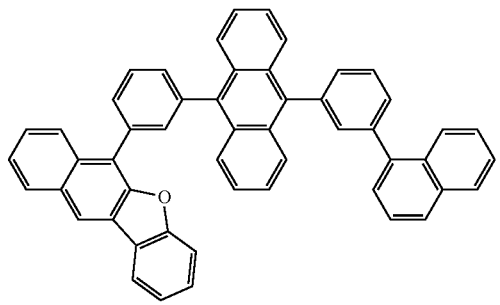
H104
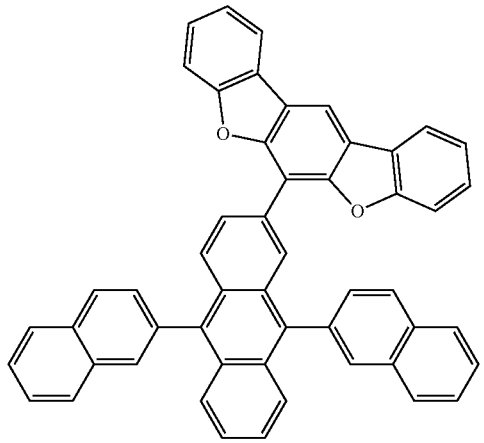
H105
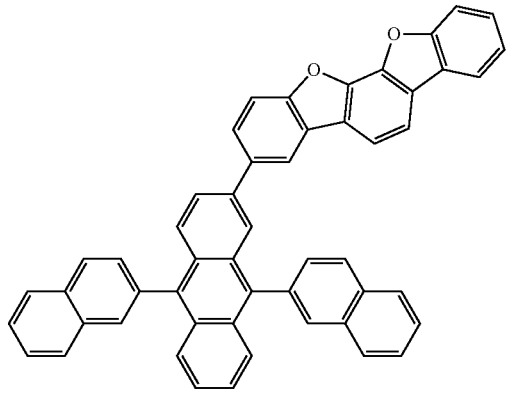
H106
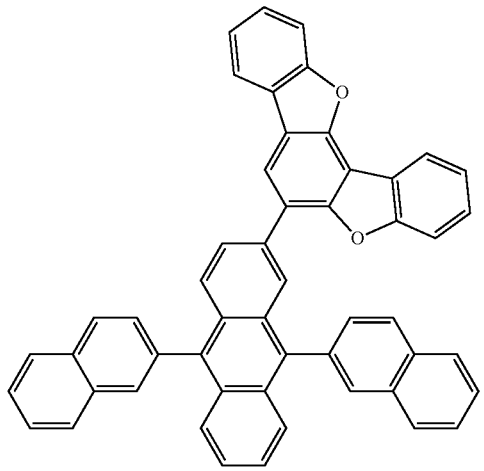
H107
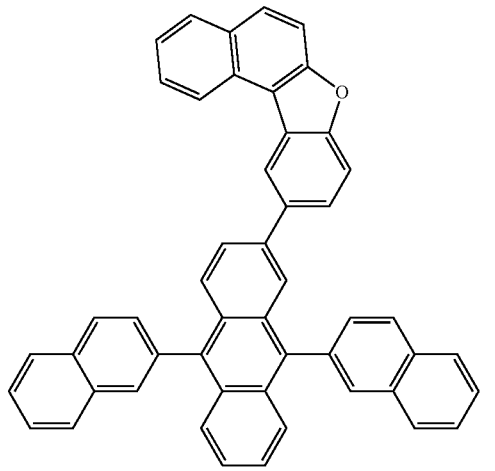
H108
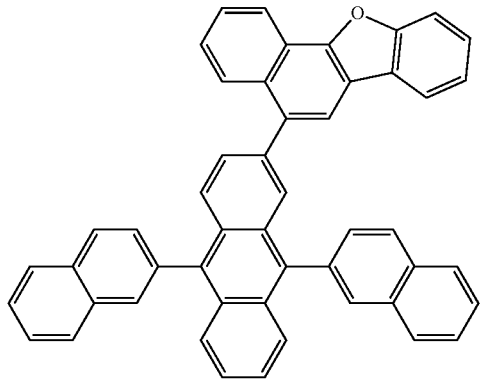
H109
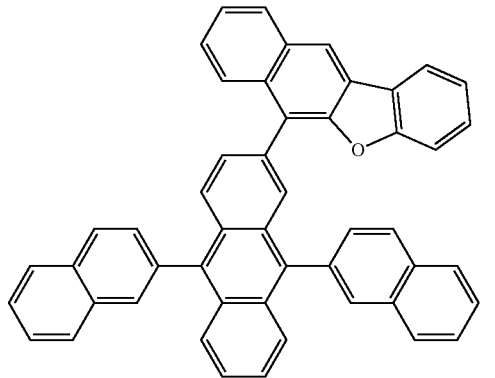

-continued
H110
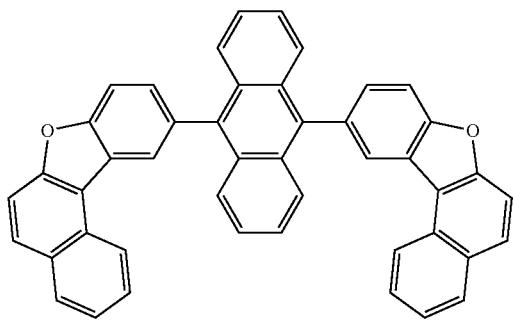
H111
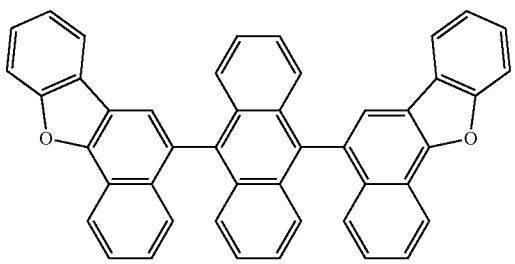
H112
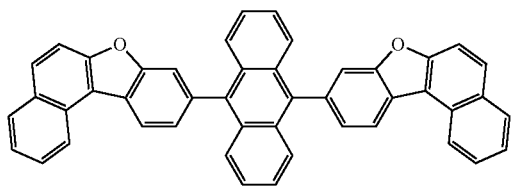
H113
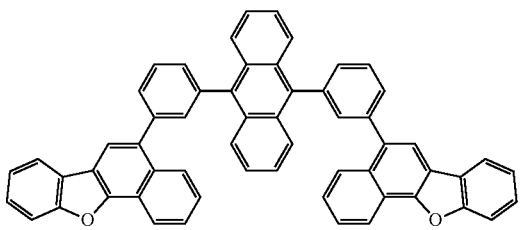
H114
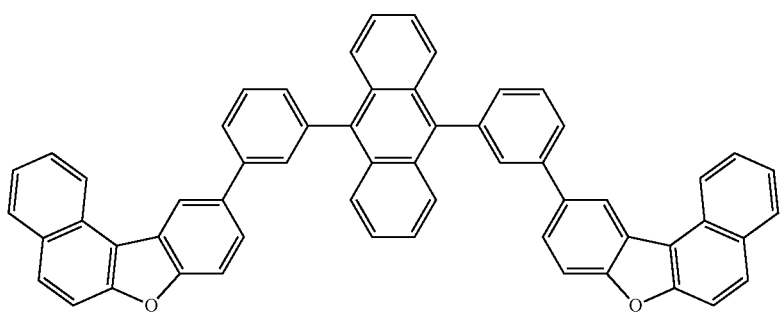
H115
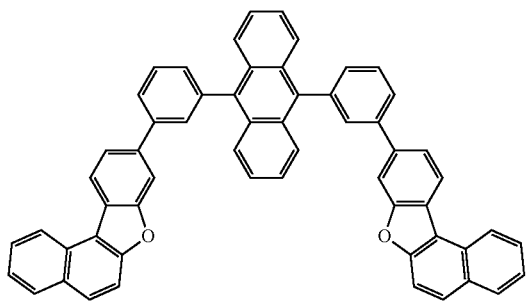
H116
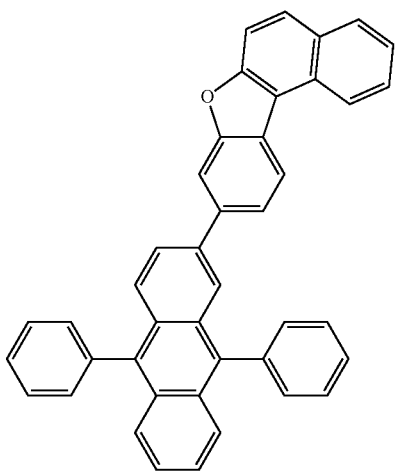

-continued
H117
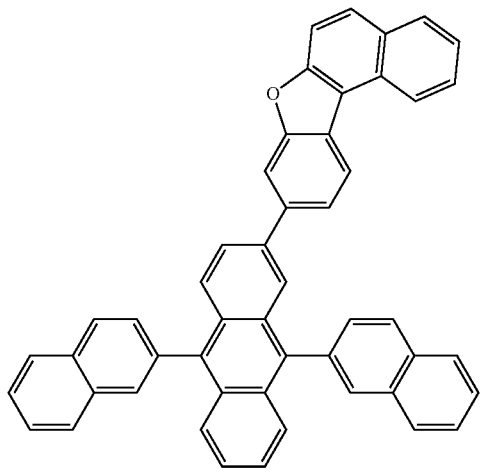
H118
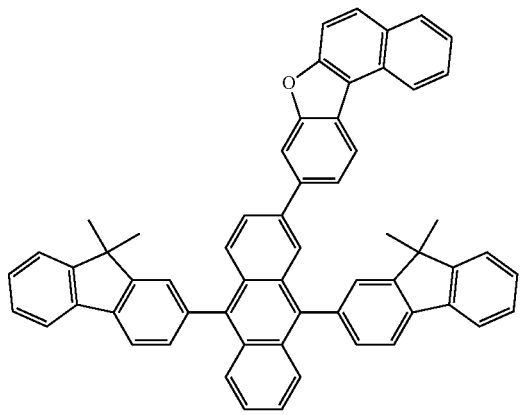
H119
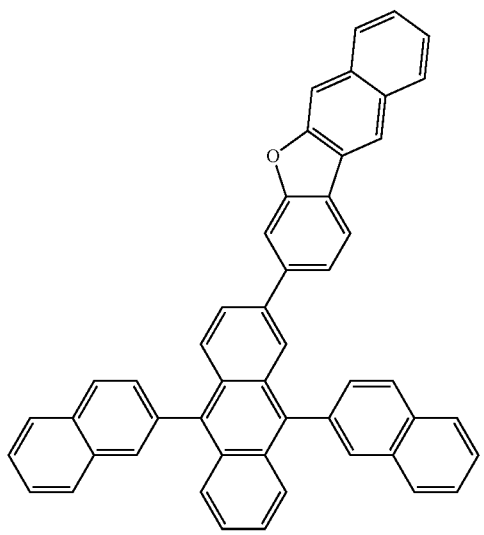
H120
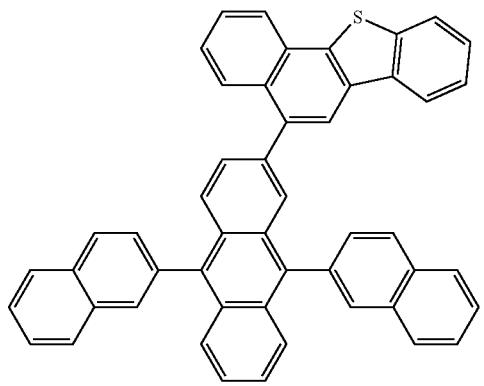
H121
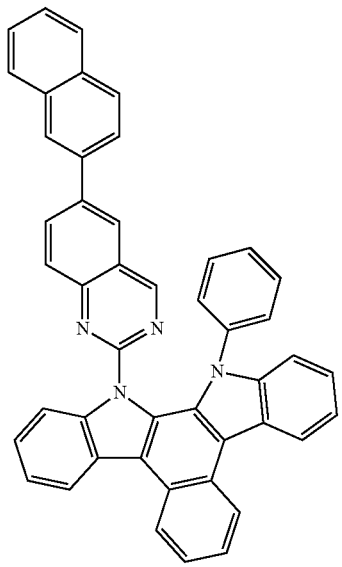
H122
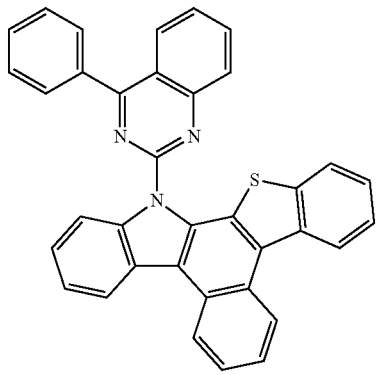

H123

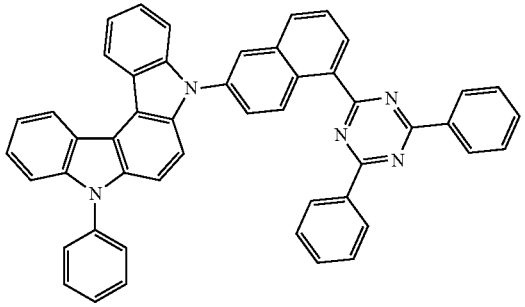

H124

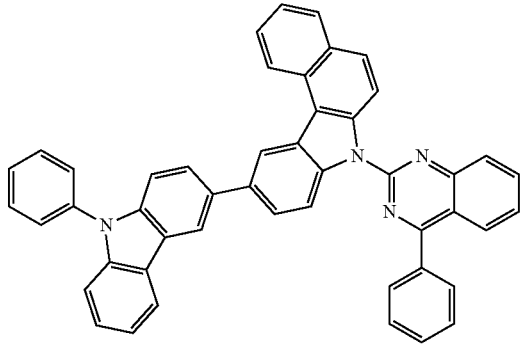

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

Formula 401

$M(L_{401})_{xc1}(L_{402})_{xc2}$

Formula 402

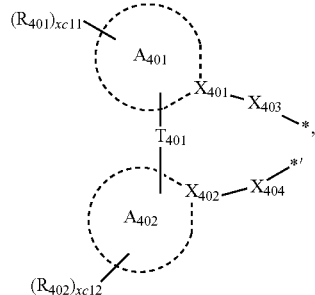

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is 2 or more, two or more of $L_{401}$(s) may be identical to or different from each other, $L_{402}$ may be an organic ligand, and xc2 may be 0, 1, 2, 3, or 4, wherein when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—C(=O)—*', *—N($Q_{411}$)-*', *—C($O_{411}$)($Q_{412}$)-*', *—C($O_{411}$)=C($Q_{412}$)-*', *—C($Q_{411}$)=, or *=C=*', $X_{403}$ and $X_{404}$ may each independently be a chemical bond (for example, a covalent bond or a coordination bond), O, S, N($Q_{413}$), B($Q_{413}$), P($O_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($O_{401}$)($O_{402}$), $Q_{401}$ to $Q_{403}$ may each independently be the same as described in connection with $Q_1$, xc11 and xc12 may each independently be an integer selected from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 402 is 2 or more, two ring $A_{401}$ in two or more of $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

The phosphorescent dopant may include, for example, one of compounds PD1 to PD25 or any combination thereof:

PD1 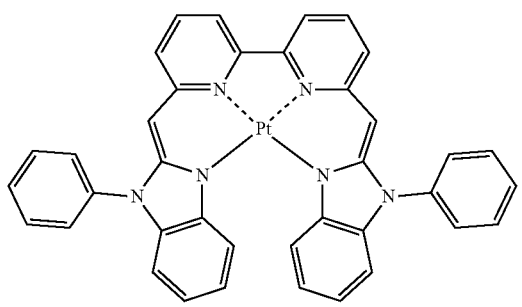
PD2 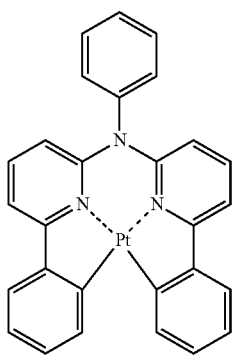
PD3 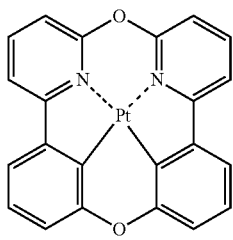
PD4 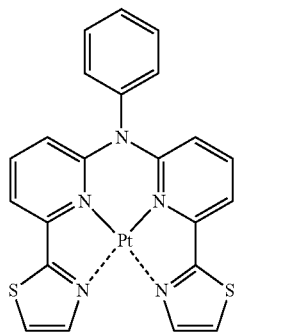
PD5 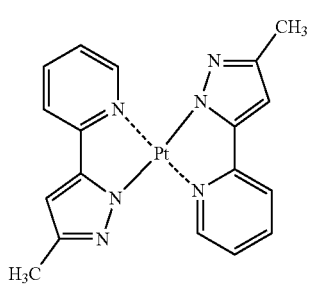
PD6 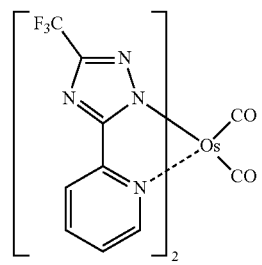
PD7 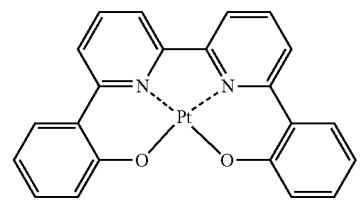
PD8 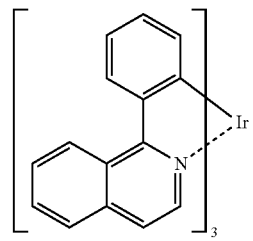
PD9 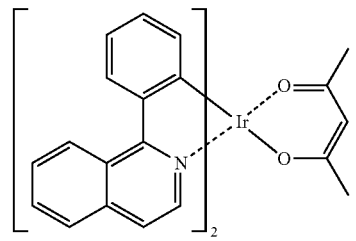
PD10 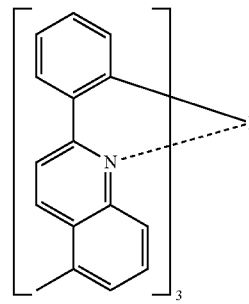
PD11 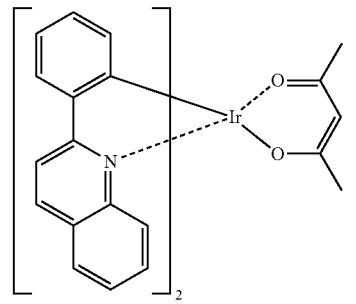

PD12 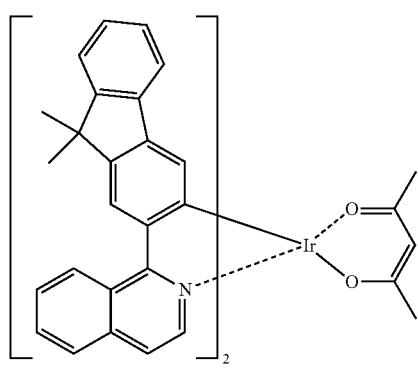
PD13 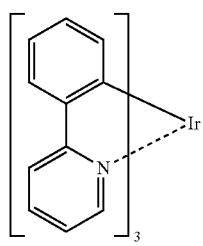
PD14 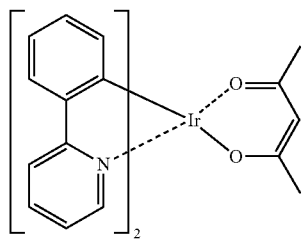
PD15 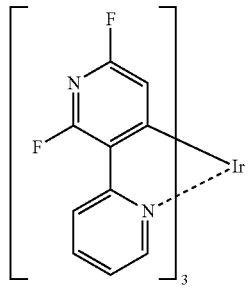
PD16 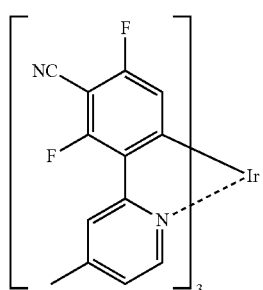
PD17 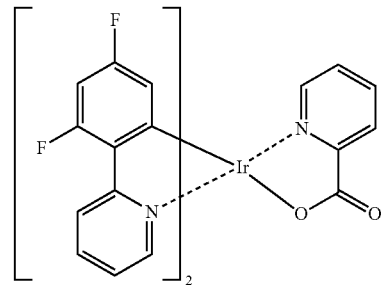
PD18 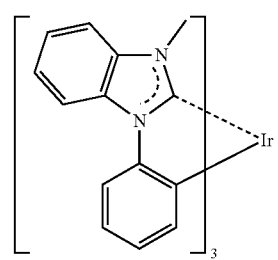
PD19 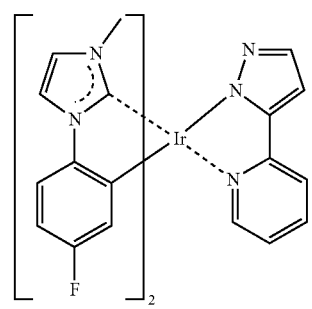
PD20 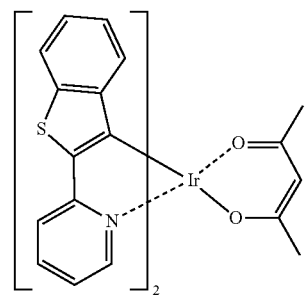

PD21

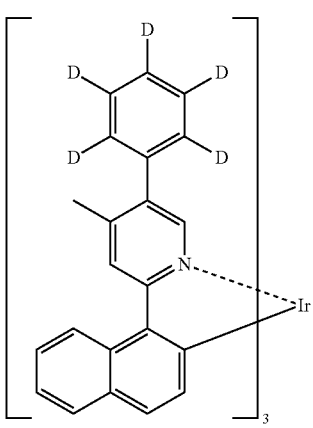

PD22

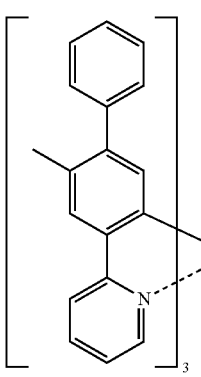

PD23

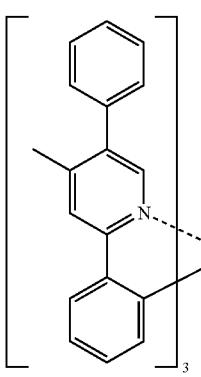

PD24

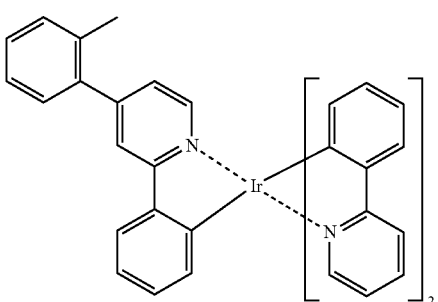

PD25

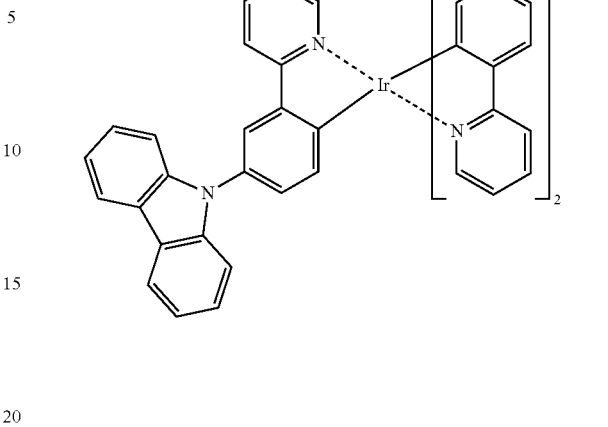

Fluorescent Dopant

The fluorescent dopant may include an amine group-containing compound, a styryl group-containing compound, or any combination thereof.

In an embodiment, the fluorescent dopant may include a compound represented by Formula 501:

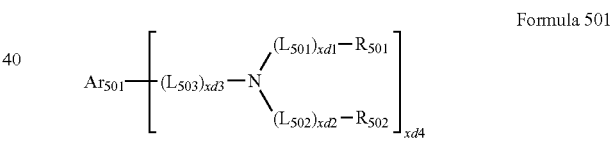

Formula 501

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In an embodiment, the fluorescent dopant may include one of Compounds FD1 to FD37, DPVBi, DPAVBi, or any combination thereof:

81
82
FD1
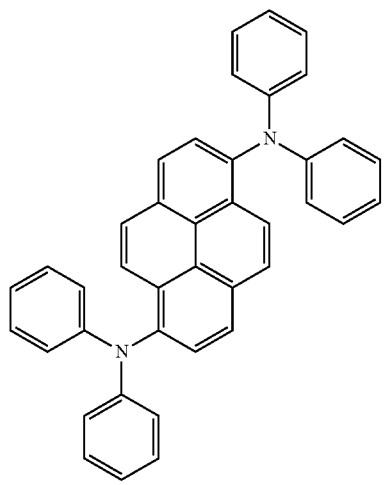
FD2
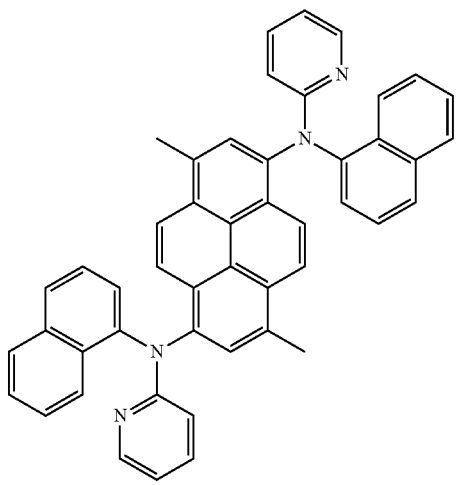
FD3
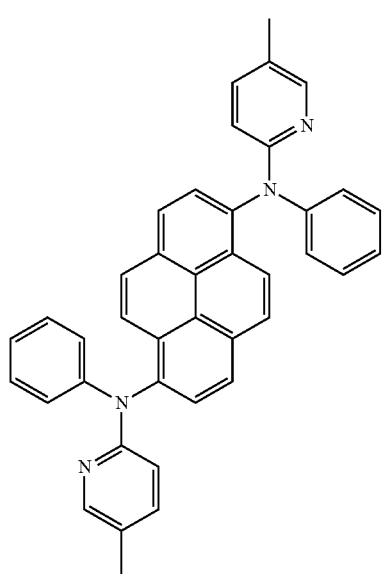
FD4
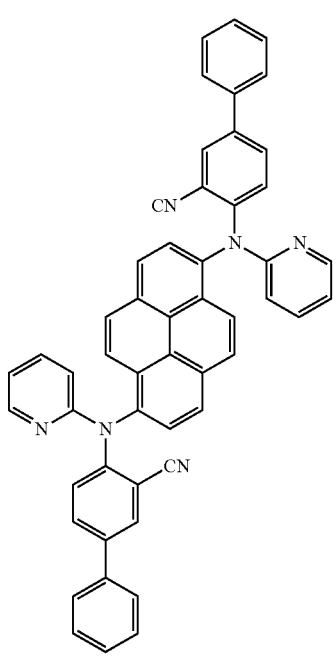
FD5
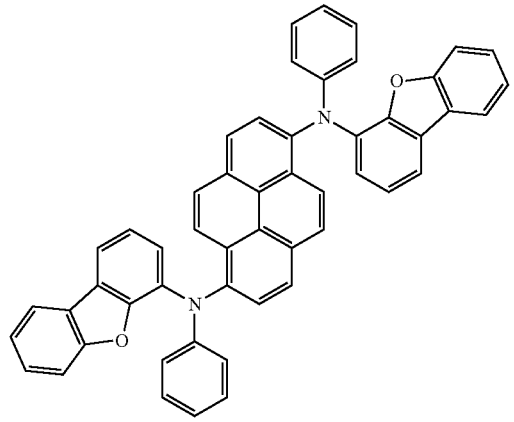
FD6
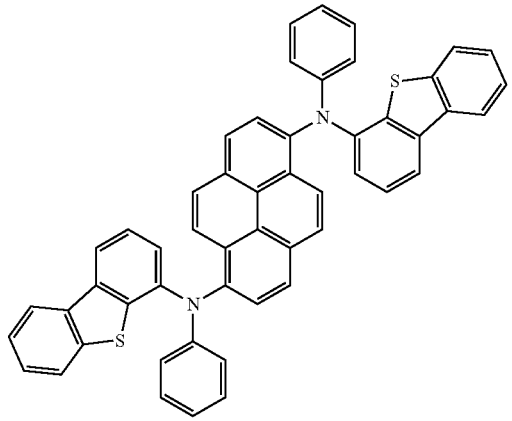

-continued
FD7
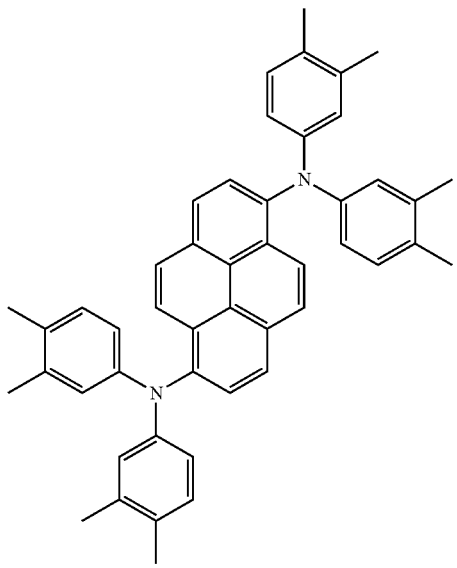
FD8
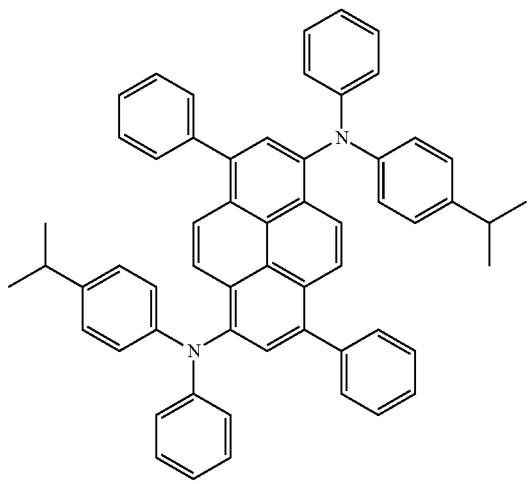
FD9
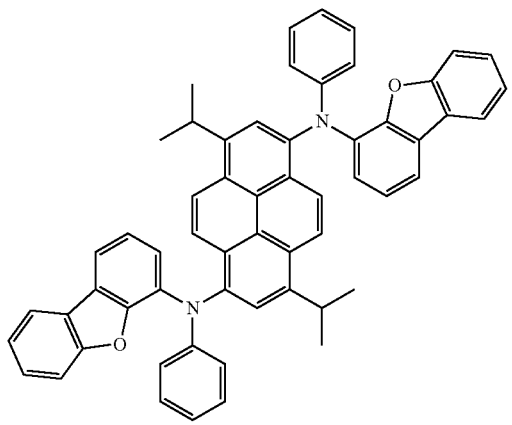
FD10
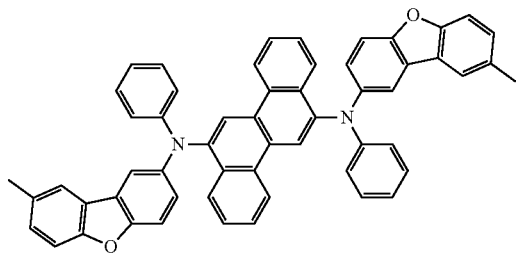
FD11
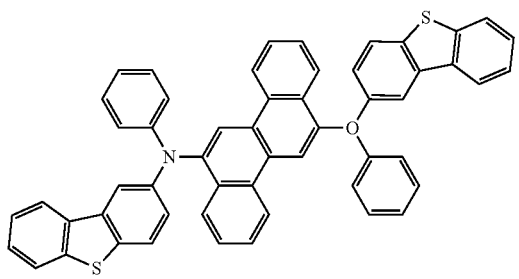
FD12
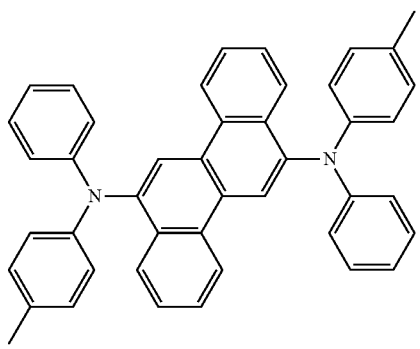

-continued
FD13
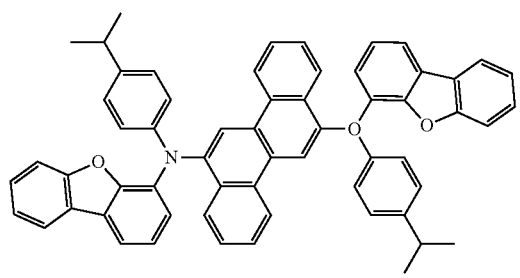
FD14
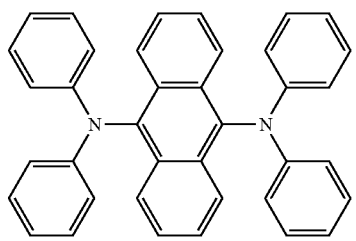
FD15
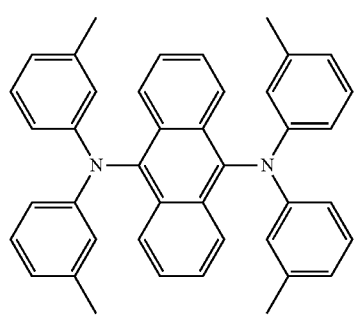
FD16
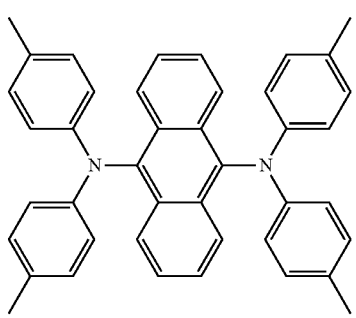
FD17
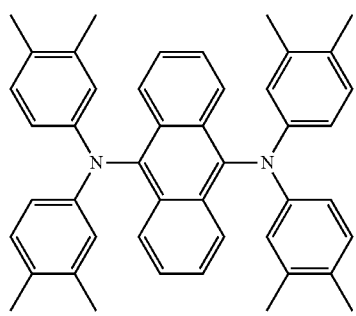
FD18
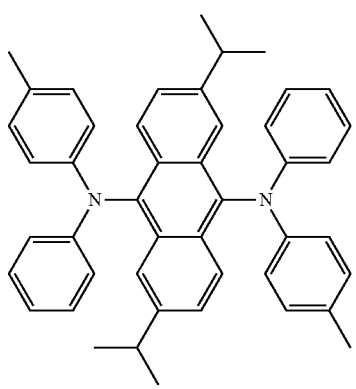
FD19
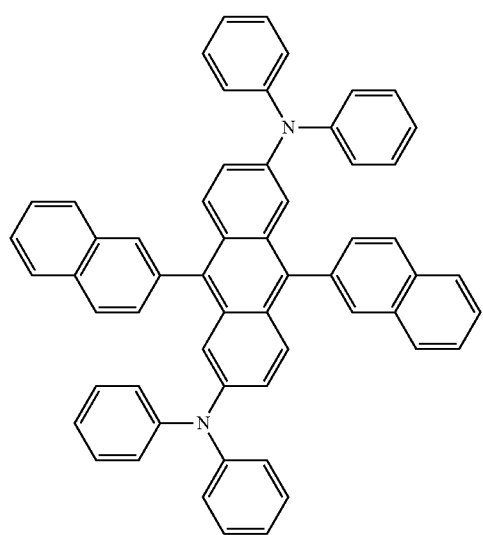
FD20
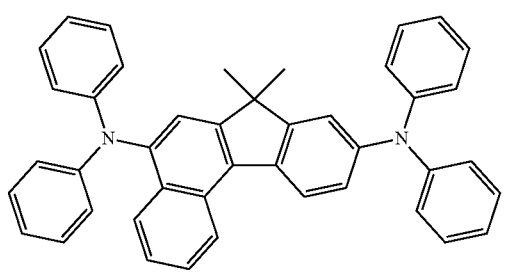

-continued
FD21
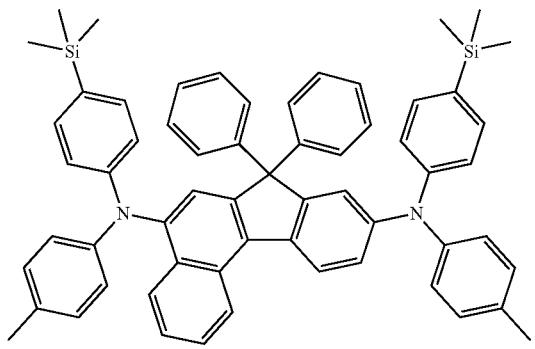
FD22
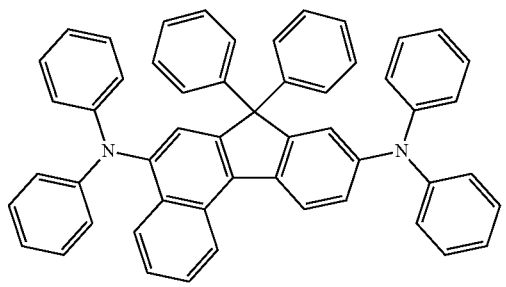
FD23
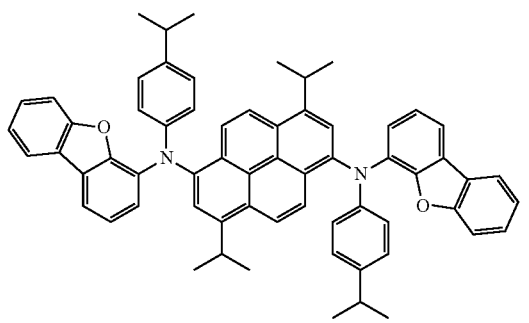
FD24
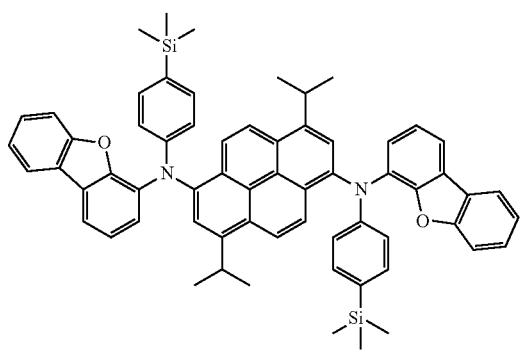
FD25
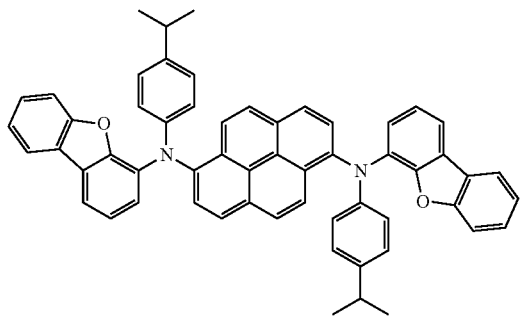
FD26
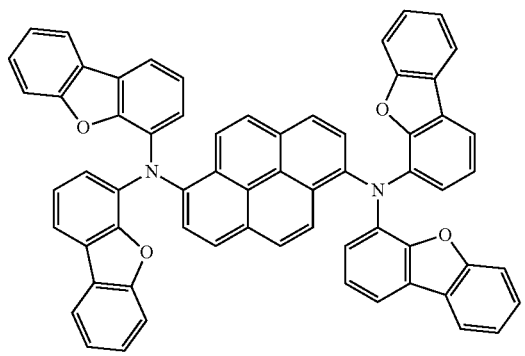
FD27
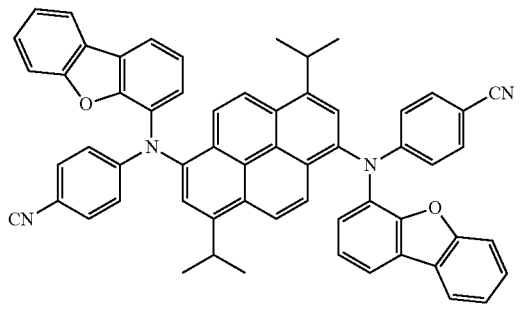
FD28
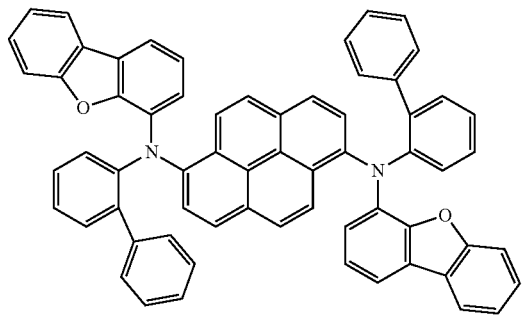

-continued
FD29
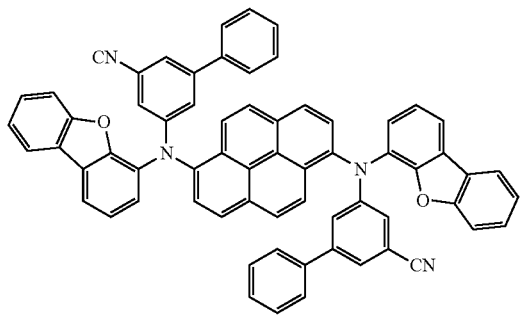
FD30
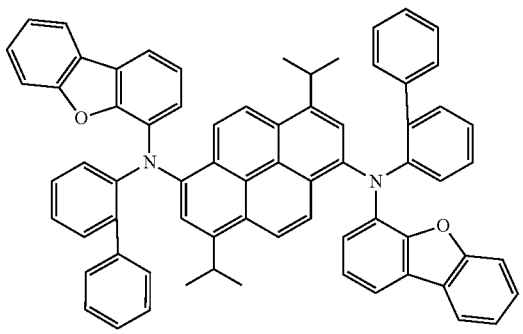
FD31
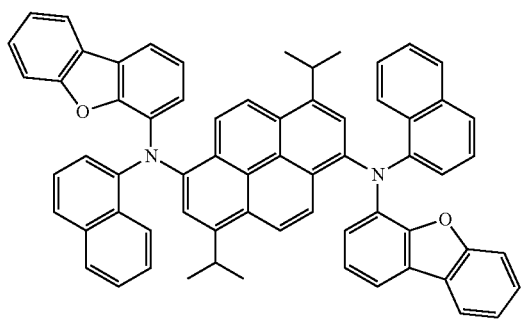
FD32
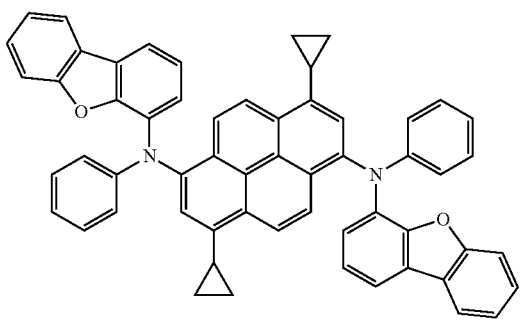
FD33
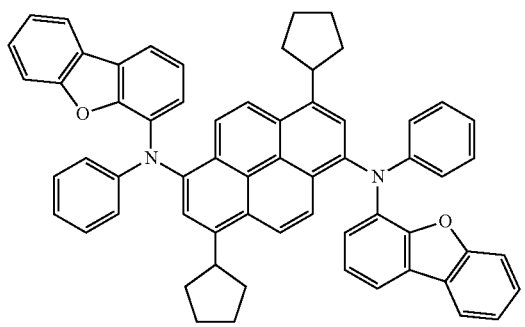
FD34
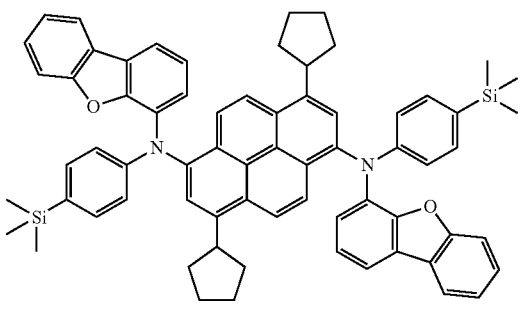
FD35
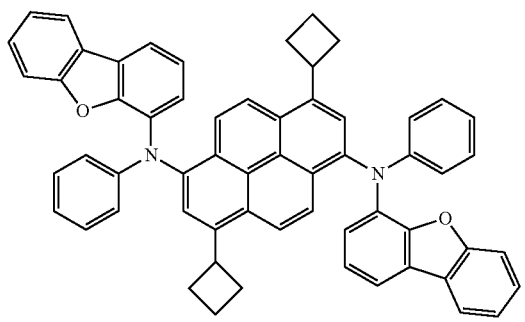
FD36
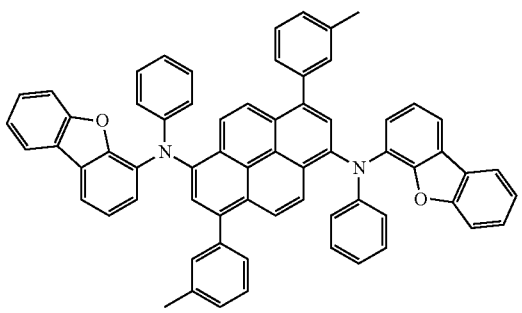

FD37

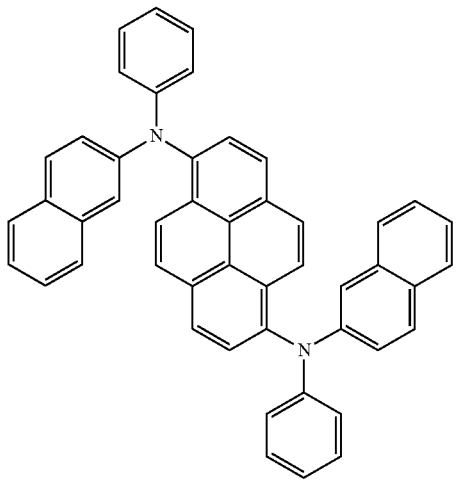

DPVBi

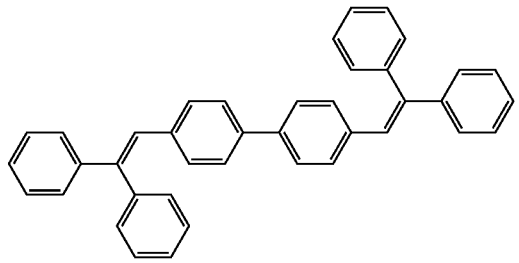

DPAVBi

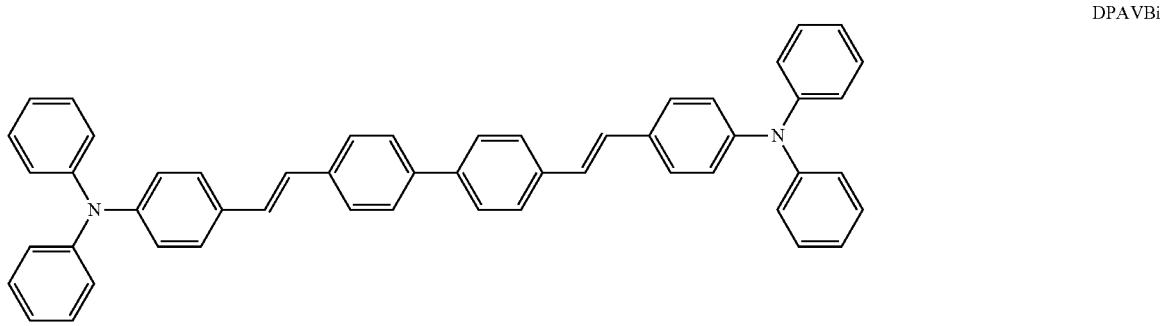

Delayed Fluorescence Material

The emission layer may include a delayed fluorescence material.

In the present specification, the delayed fluorescence material may be selected from compounds capable of emitting delayed fluorescence based on a delayed fluorescence emission mechanism.

The delayed fluorescence material included in the emission layer may act as a host or a dopant depending on the kind (e.g., type) of other materials included in the emission layer.

In an embodiment, the delayed fluorescence material may emit light according to a triplet-triplet fusion (e.g., TTF) mechanism utilizing a phenomenon in which a singlet exciton is generated by collision of two triplet excitons.

In an embodiment, a difference between a triplet energy level (eV) of the delayed fluorescence material and a singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and/or ii) a material including a $C_8$-$C_{60}$ polycyclic group in which two or more cyclic groups are condensed while sharing boron (B).

Non-limiting examples of the delayed fluorescence material may include at least one of the following Compounds DF1 to DF9:

DF1

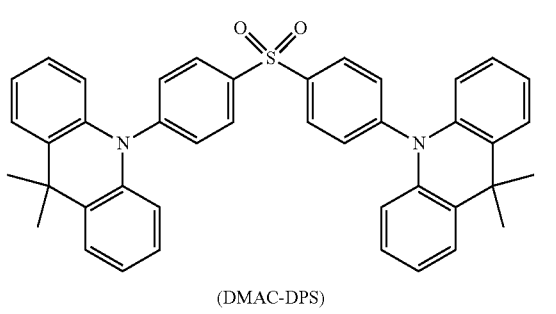

(DMAC-DPS)

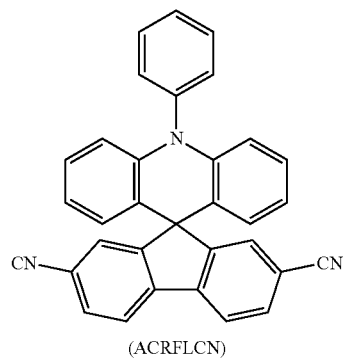
(ACRFLCN)
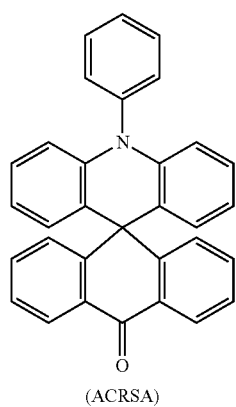
(ACRSA)
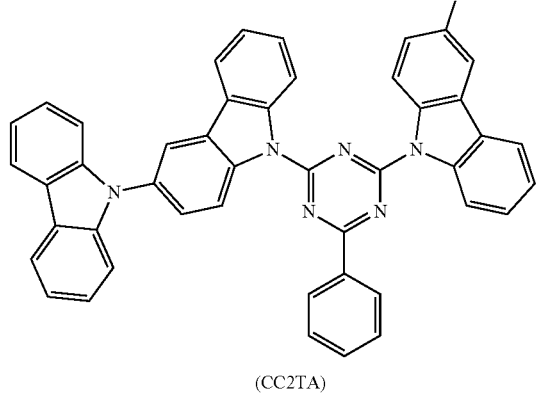
(CC2TA)
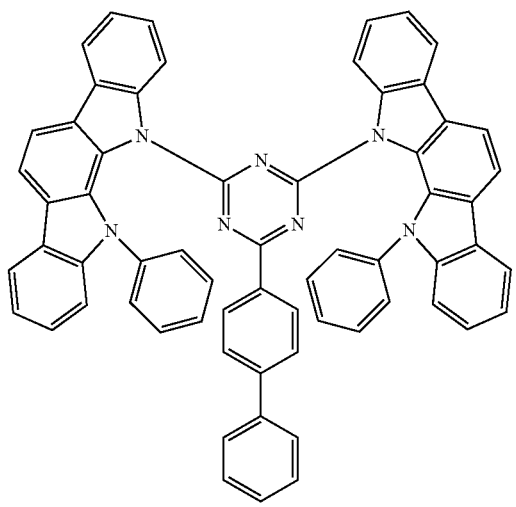
(PIC-TRZ)
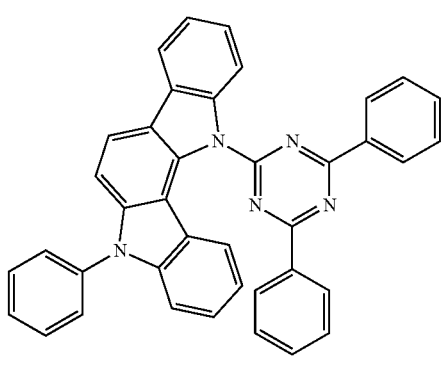
(PIC-TRZ2)
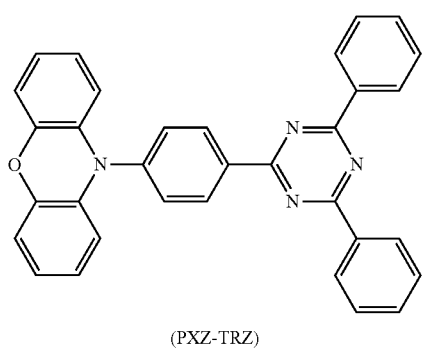
(PXZ-TRZ)
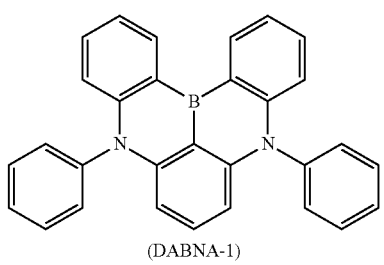
(DABNA-1)

-continued

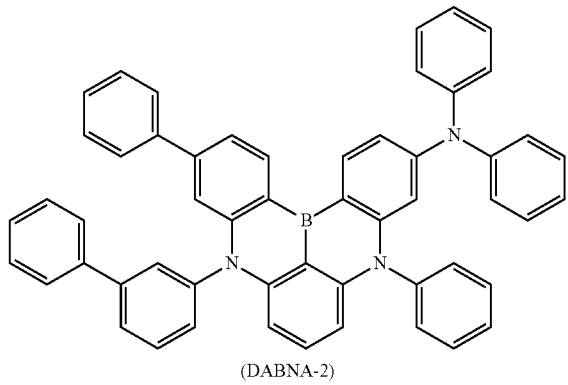

(DABNA-2)

Quantum Dot

The emission layer may include a quantum dot.

In the present specification, a quantum dot refers to a crystal of a semiconductor compound, and may include any material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic (e.g., organometallic) chemical vapor deposition process, a molecular beam epitaxy process, or any process similar thereto (e.g., similar to these processes).

In the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed at low costs compared to vapor deposition methods, such as metal organic chemical vapor deposition (MOCVD) and/or molecular beam epitaxy (MBE).

The quantum dot may include: a Group II-VI semiconductor compound; a Group III-V semiconductor compound; a Group III-VI semiconductor compound; a Group semiconductor compound; a Group IV-VI semiconductor compound; a Group IV element or compound; or any combination thereof.

Non-limiting examples of the Group II-VI semiconductor compound may include: a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Non-limiting examples of the Group III-V semiconductor compound may include: a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, GaAlNP, and/or the like; or any combination thereof. In an embodiment, the Group III-V semiconductor compound may further include a Group II element. Non-limiting examples of the Group III-V further including a Group II element may include InZnP, InGaZnP, InAlZnP, etc.

Non-limiting examples of the Group III-VI semiconductor compound may include: a binary compound, such as GaS, GaSe, $Ga_2Se_3$, GaTe, InS, $In_2S_3$, InSe, $In_2Se_3$, and/or InTe; a ternary compound, such as $InGaS_3$, and/or $InGaSe_3$; or any combination thereof.

Non-limiting examples of the Group semiconductor compound may include: a ternary compound, such as AgInS, $AgInS_2$, CuInS, $CuInS_2$, $CuGaO_2$, $AgGaO_2$, and/or $AgAlO_2$; or any combination thereof.

Non-limiting examples of the Group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include: a single element compound, such as Si and/or Ge; a binary compound, such as SiC and/or SiGe; or any combination thereof.

Each element included in a multi-element compound, such as the binary compound, the ternary compound, and/or the quaternary compound, may exist in a particle with a uniform concentration or non-uniform concentration.

In an embodiment, the quantum dot may have a single structure (e.g., each element included in the corresponding quantum dot is distributed uniformly throughout the particle) or a dual core-shell structure. In the case of the quantum dot having a single structure, the concentration of each element included in the corresponding quantum dot is uniform. In an embodiment, the material contained in the core and the material contained in the shell may be different from each other.

The shell of the quantum dot may act as a protective layer to prevent or reduce chemical degeneration of the core to maintain semiconductor characteristics and/or as a charging layer to impart electrophoretic characteristics to the quantum dot. The shell may be a single layer or a multi-layer. The interface between the core and the shell may have a concentration gradient in which the concentration of elements existing in the shell decreases toward the center.

Non-limiting examples of the shell of the quantum dot may be an oxide of a metal or a non-metal, a semiconductor compound, or any combination thereof. Non-limiting examples of the oxide of a metal or a non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; or any combination thereof. Non-limiting examples of the semiconductor compound may include, as described herein: Group II-VI semiconductor compounds; Group III-V semiconductor compounds; Group III-VI semiconductor compounds; Group semiconductor compounds; Group IV-VI semiconductor compounds; or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, because the light emitted through the quantum dot is emitted in all directions, the wide viewing angle can be improved.

In addition, the quantum dot may be a spherical particle, a pyramidal particle, a multi-arm particle, a cubic nanoparticle, a nanotube particle, a nanowire particle, a nanofiber particle, or a nanoplate particle.

Because the energy band gap can be adjusted by controlling the size of the quantum dot, light having various suitable wavelength bands can be obtained from the quantum dot emission layer. Therefore, by utilizing quantum dots of different sizes, a light-emitting device that emits light of various suitable wavelengths may be implemented (e.g., produced). In an embodiment, the size of the quantum dot may be selected to emit red, green and/or blue light. In addition, the size of the quantum dot may be configured (e.g., selected) to emit white light by combining light of various suitable colors.

Electron Transport Region

Each of them emission units may include an electron transport region between the second electrode and the respective emission layer.

The electron transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from the emission layer in the respective stated order.

In an embodiment, the electron transport region may include a plurality of electron transport layers. In an embodiment, the electron transport region may include a first electron transport layer and a second electron transport layer.

The electron transport region (for example, the buffer layer, the hole blocking layer, the electron control layer, and/or the electron transport layer in the electron transport region) may include a metal-free compound including at least one 7 electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21}$$  Formula 601

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be air electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked together via a single bond.

In an embodiment, $Ar_{601}$ in Formula 601 may be a substituted or unsubstituted anthracene group.

In an embodiment, the electron transport region may include a compound represented by Formula 601-1:

Formula 601-1

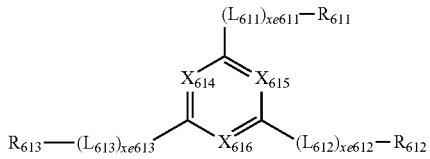

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group substituted or unsubstituted at least one $R_{10a}$.

In an embodiment, xe1 and xe611 to xe613 in Formulae 601 and 601-1 may each independently be 0, 1, or 2.

The electron transport region may include one of Compounds ET1 to ET50, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:

ET1

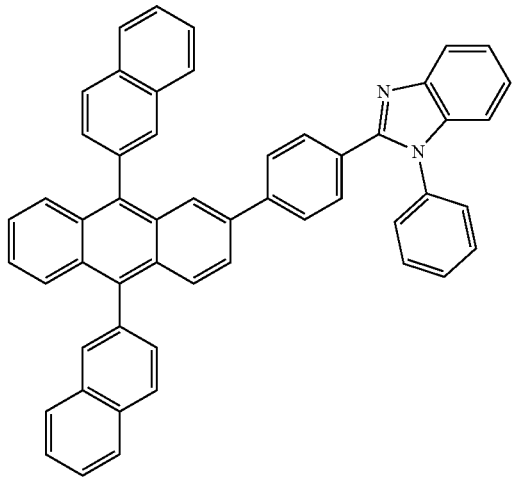

ET2
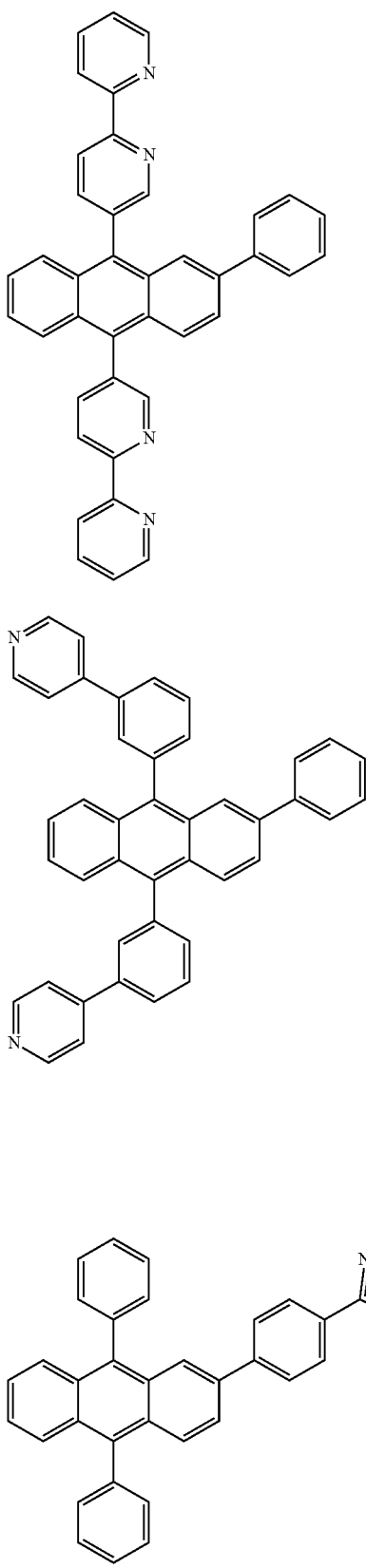
ET3
ET4
ET5
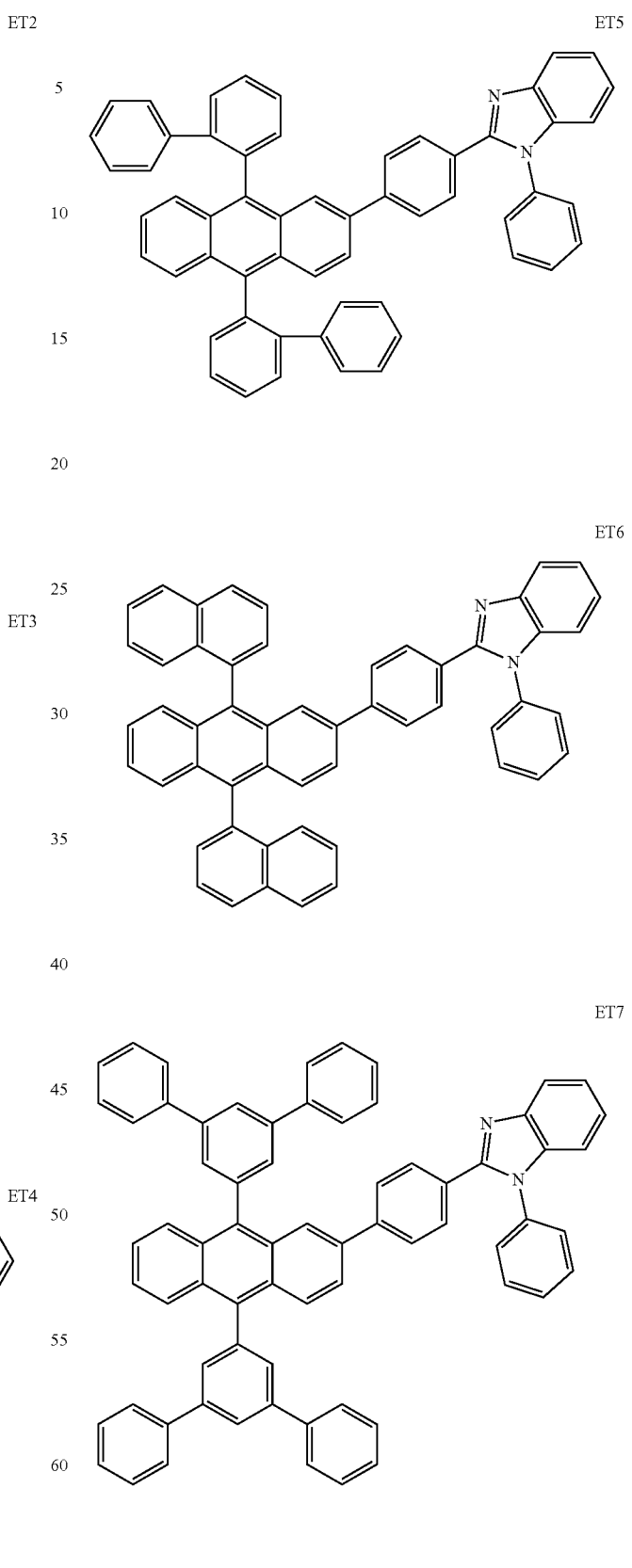
ET6
ET7

ET8
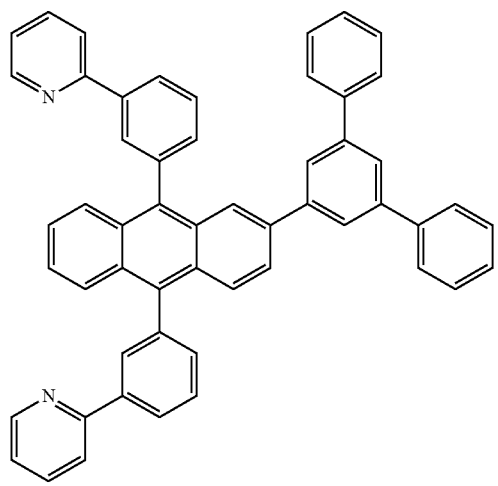
ET9
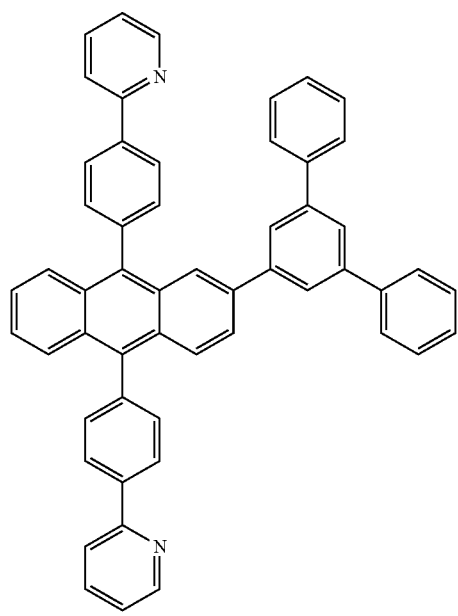
ET10
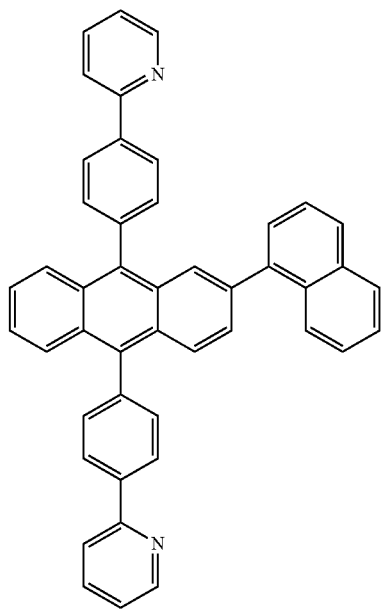
ET11
ET12
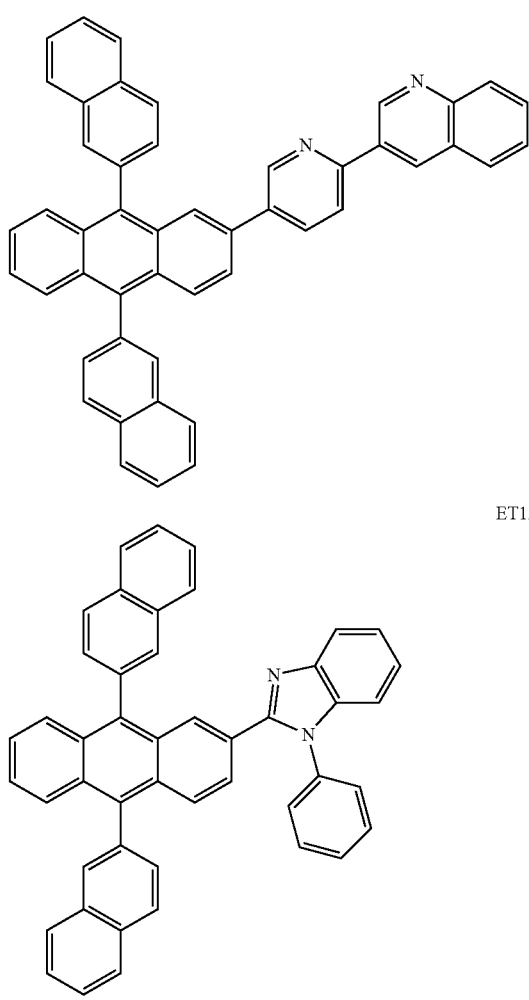

ET13
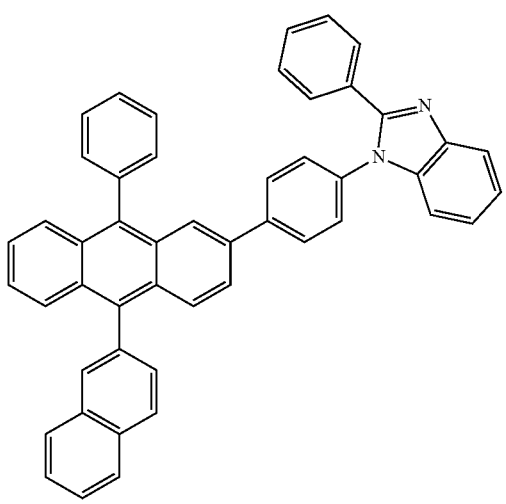
ET14
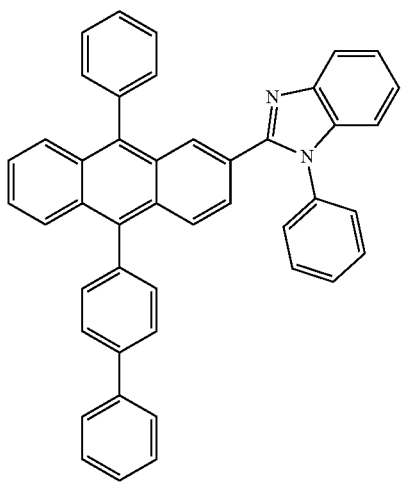
ET15
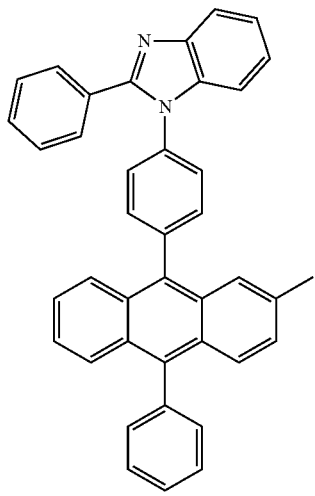
ET16
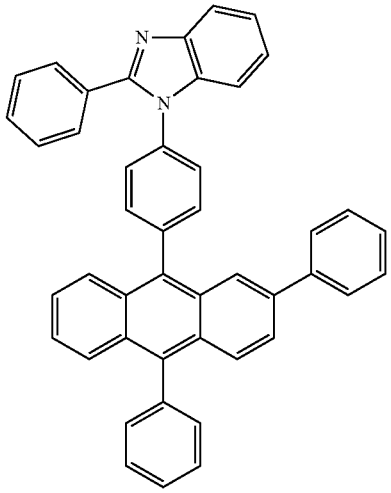
ET17
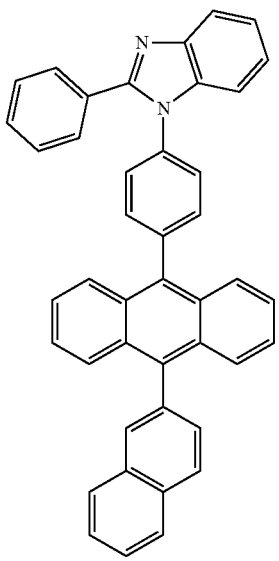
ET18
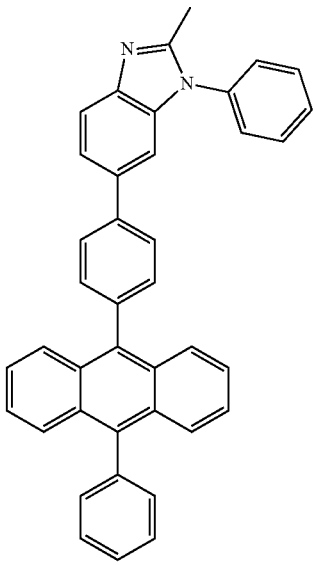

-continued
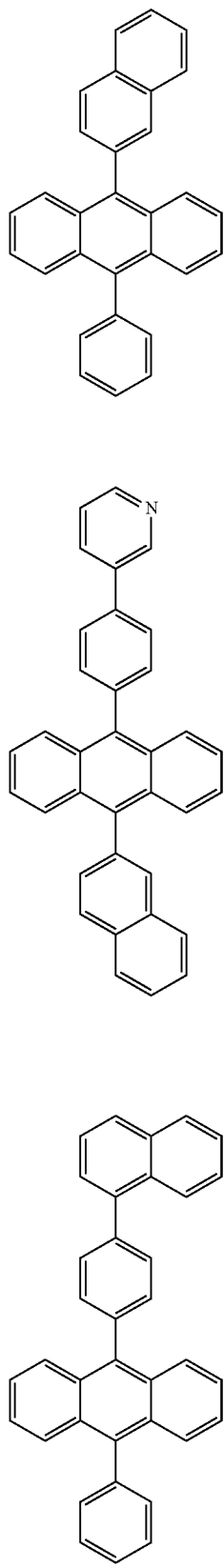
-continued
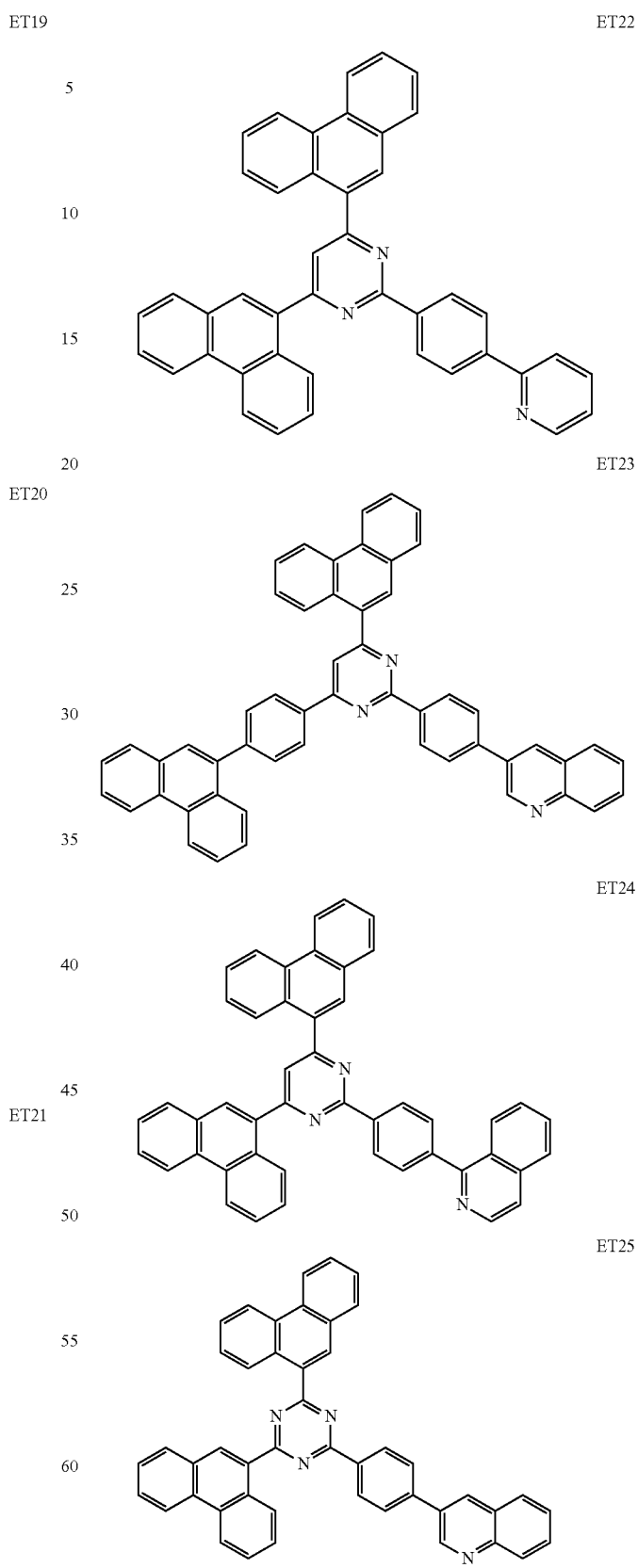

ET26
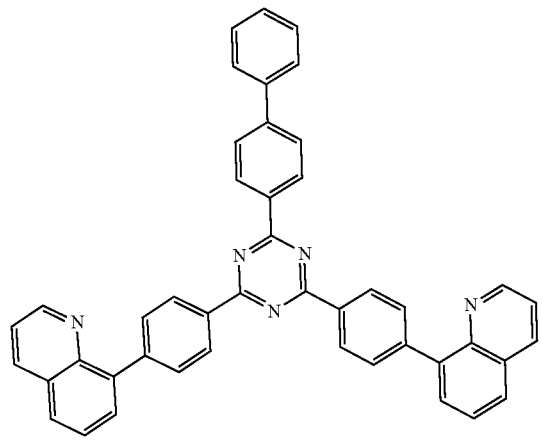
ET27
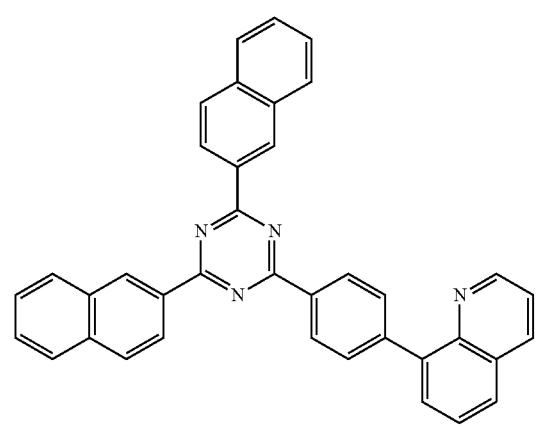
ET28
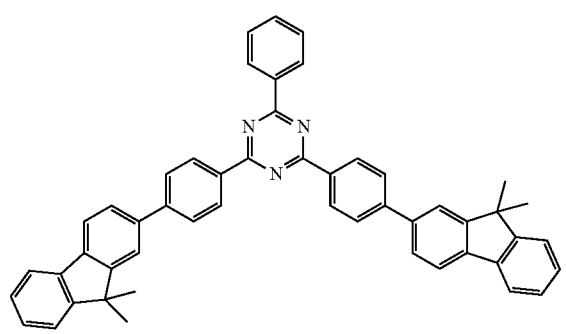
ET29
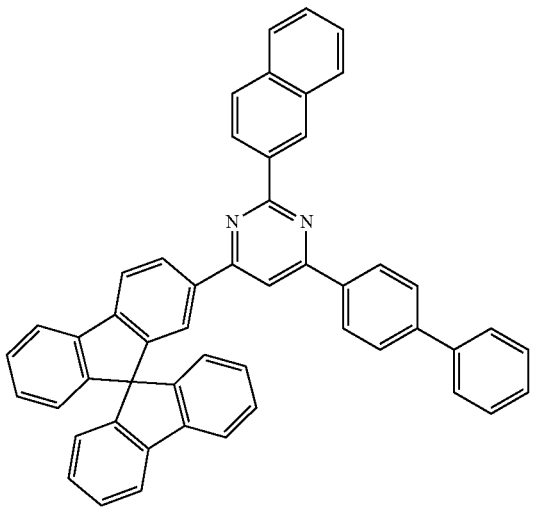
ET30
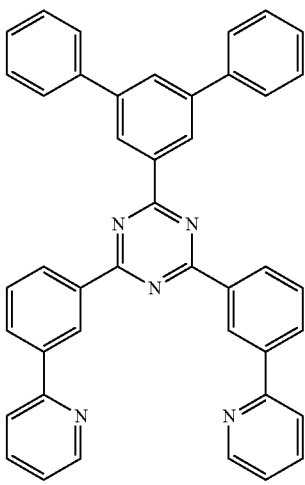
ET31
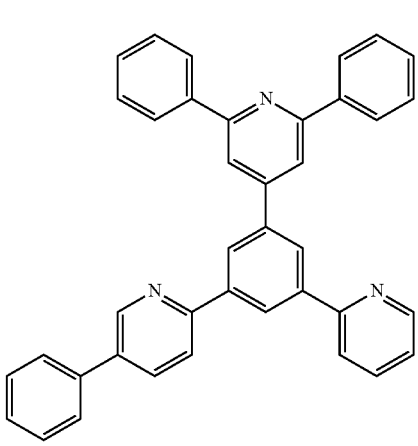

ET32
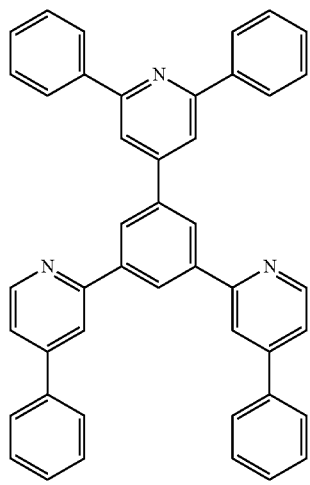
ET35
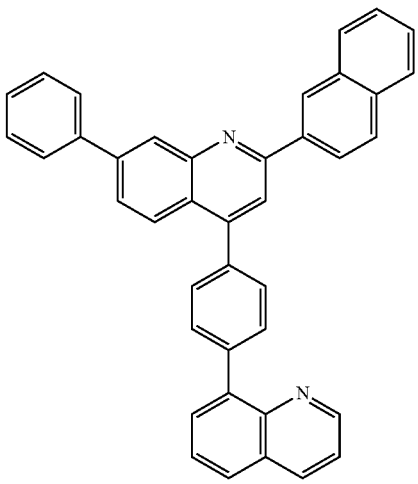
ET33
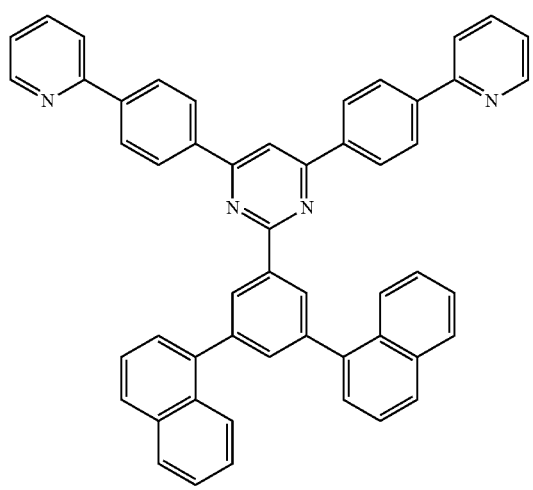
ET36
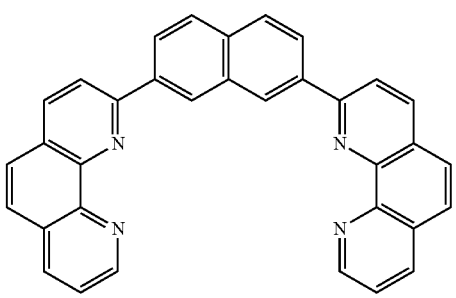
ET37
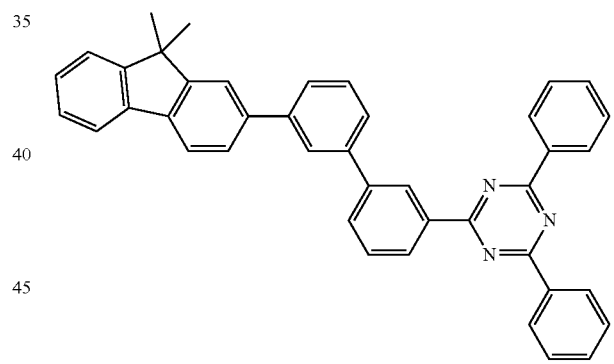
ET34
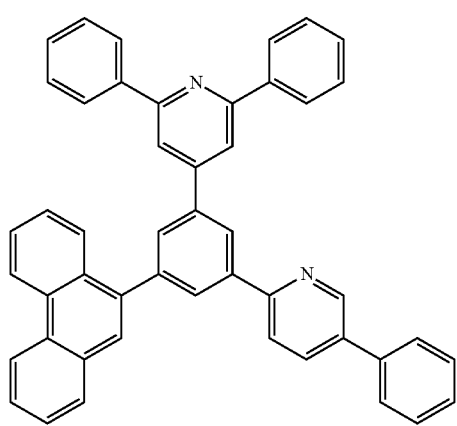
ET38
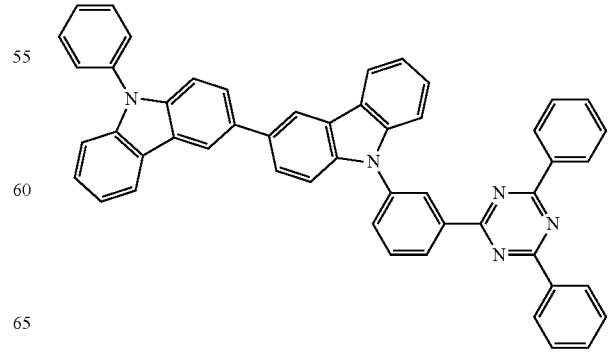

ET39
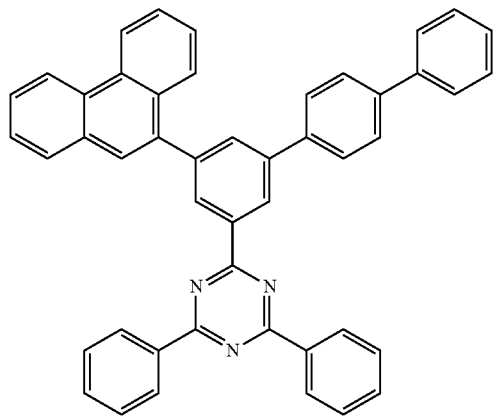
ET40
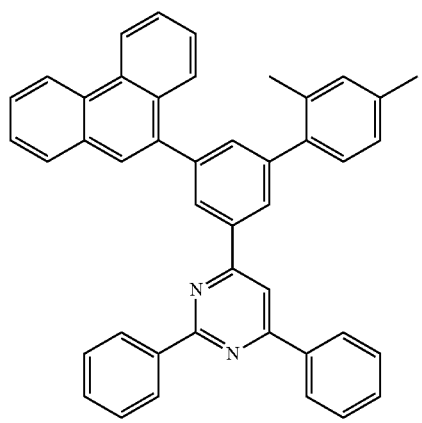
ET41
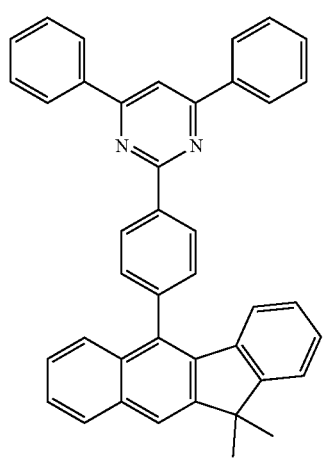
ET42
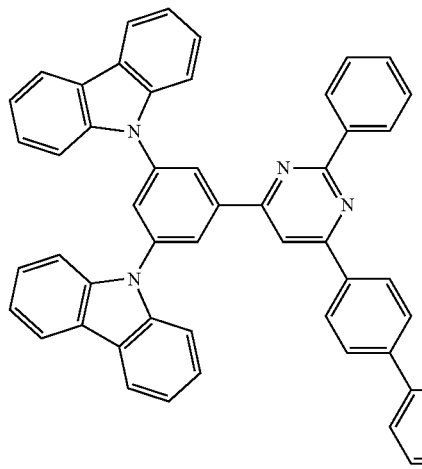
ET43
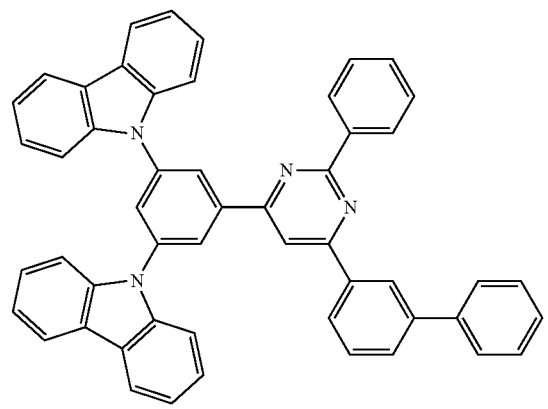
ET44
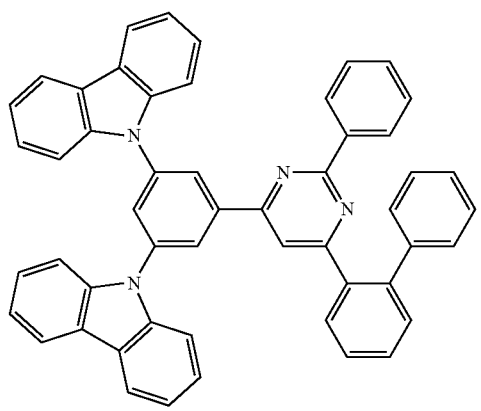
ET45
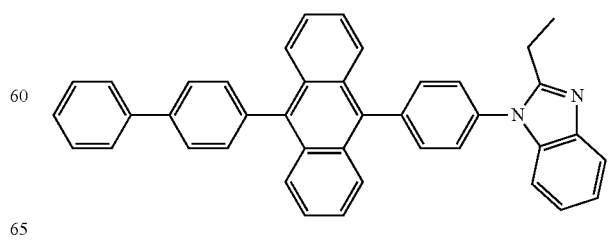

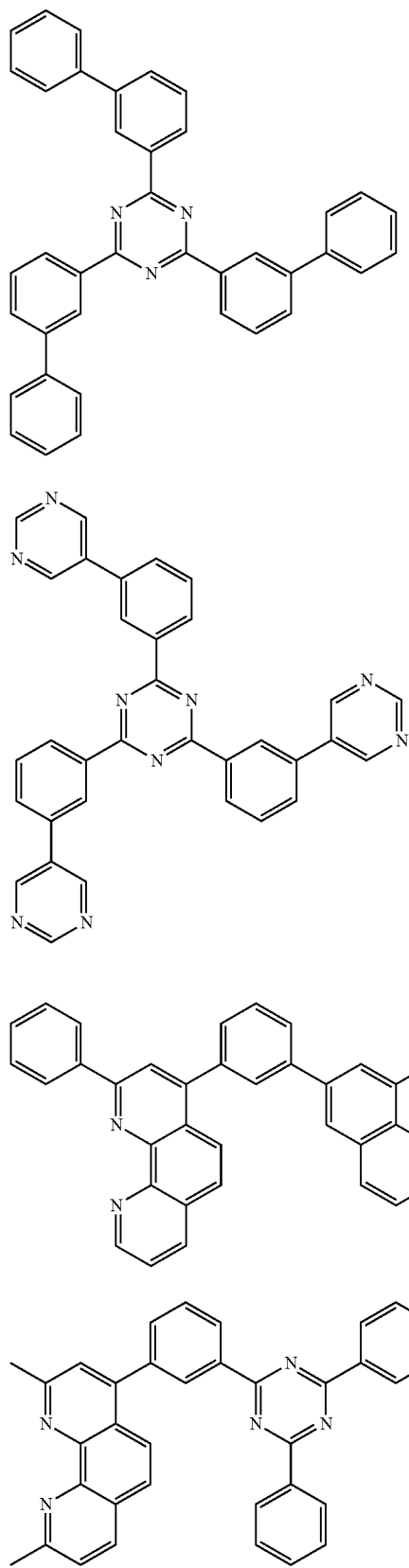

ET46

ET47

ET48

ET49

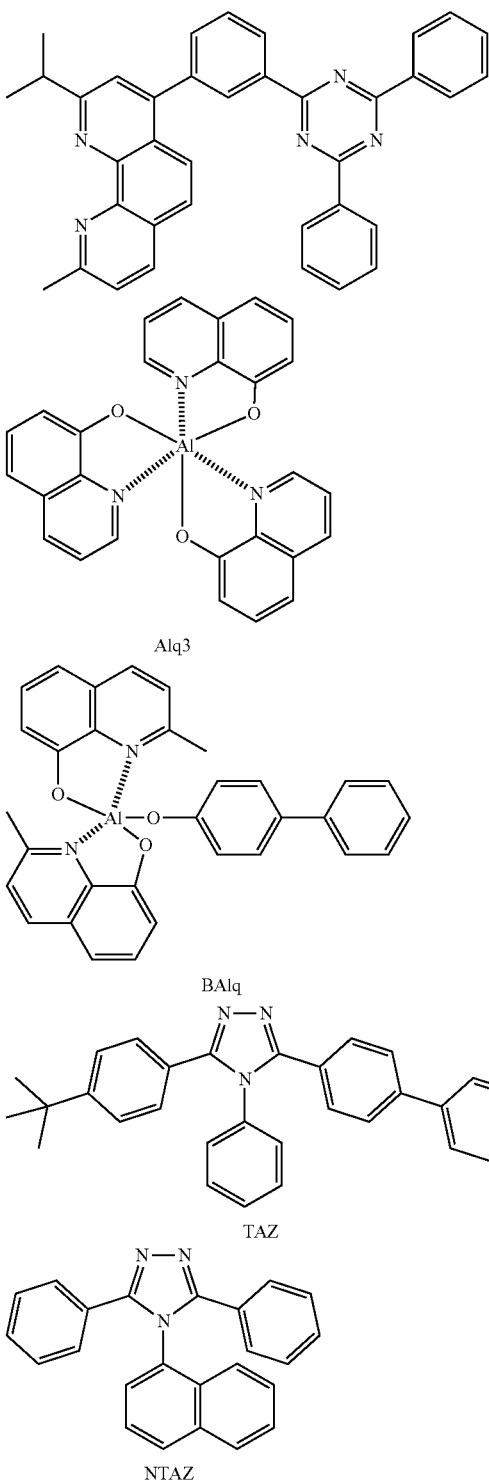

ET50

Alq3

BAlq

TAZ

NTAZ

A thickness of the electron transport region may be from (e.g., in a range of) about 50 Å to about 5,000 Å, for example, about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be from (e.g., in a range of) about 20 Å to about 1,000 Å, for example, about 30 Å to about 300 Å, and a thickness of the electron transport layer may be from (e.g., in a range of) about 100 Å to about 1,000 Å, for example, about 150 Å to about 500 Å. When the thicknesses of the buffer layer, the hole blocking layer, the electron control layer, and/or the electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, and/or a Cs ion, and a metal ion of the alkaline earth metal complex may be a Be ion, a Mg ion, a Ca ion, a Sr ion, and/or a Ba ion. A ligand coordinated with the metal ion of the alkali metal complex or the alkaline earth metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

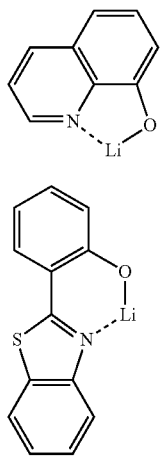

ET-D1

ET-D2

The electron transport region may include an electron injection layer that facilitates the injection of electrons from the second electrode 190 or a charge generation layer. The electron injection layer may be in direct contact with the second electrode 190 or the charge generation layer.

The electron injection layer may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, and/or iodides), and/ortellurides of the alkali metal, the alkaline earth metal, and the rare earth metal, or any combination thereof.

The alkali metal-containing compound may include alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Non-limiting examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, etc.

The alkali metal complex, the alkaline earth-metal complex, and the rare earth metal complex may include i) one of the metal ions of the alkali metal, the alkaline earth metal, and the rare earth metal, and ii) as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), and/or ii) a) an alkali metal-containing compound (for example, an alkali metal halide) and b) an alkali metal, an alkaline earth metal, a rare earth metal, or any combination thereof. In an embodiment, the electron injection layer may be a KI:Yb co-deposited layer, an RbI:Yb co-deposited layer, and/or the like.

In an embodiment, the light-emitting device 10 or 20 may include an electron injection layer located between the second electrode 190 and the $n^{th}$ emission layer and/or located between the n−1th charge generation layer and an n−1th emission layer.

The electron injection layer may include an inorganic insulating material or may include an inorganic insulating material and a first metal including an alkali metal, an alkaline earth metal, a lanthanide metal, or any combination thereof. The inorganic insulating material is the same as described above.

In an embodiment, the inorganic insulating material may include NaI, KI, RbI, CsI, NaCl, KCl, RbCl, CsCl, NaF, KF, RbF, CsF, or any combination thereof, and the first metal may include La, Ce, Pr, Nd, Pm, Sm, Eu, Gd, Tb, Dy, Ho, Er, Tm, Yb, Lu, or any combination thereof.

When the electron injection layer includes an inorganic insulating material and a first metal, a volume ratio of the inorganic insulating material to the first metal may be in a range of about 99:1 to about 90:10.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the ranges described above, satisfactory electron injection characteristics may be obtained without a substantial increase in driving voltage.

Second Electrode 190

The second electrode 190 may be located on the $m^{th}$ emission unit ELU(m) as described above. The second electrode 190 may be a cathode, which is an electron injection electrode, and as the material for forming the second electrode 190, a metal, an alloy, an electrically conductive compound, or any combination thereof, each having a low work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 190 may be a transmissive electrode, a semi-transmissive electrode, or a reflective electrode.

The second electrode 190 may have a single-layered structure or a multi-layered structure including two or more layers.

Capping Layer

A first capping layer may be located outside the first electrode 110 (e.g., on the side (of the first electrode 110) opposite to the side facing the second electrode 190), and/or a second capping layer may be located outside the second electrode 190 (e.g., on the side (of the second electrode 190) opposite to the side facing the first electrode 110). In an embodiment, the light-emitting device 10 or 20 may have a structure in which the first capping layer, the first electrode 110, the interlayer, and the second electrode 190 are sequentially stacked in this stated order, a structure in which the first electrode 110, the interlayer, the second electrode 190, and the second capping layer are sequentially stacked in this stated order, or a structure in which the first capping layer, the first electrode 110, the interlayer, the second electrode 190, and the second capping layer are sequentially stacked in this stated order.

Light generated in the emission layer of the light-emitting device 10 or 20 may be extracted (e.g., emitted) toward the outside through the first electrode 110, which is a semi-transmissive electrode or a transmissive electrode, and the first capping layer, and/or light generated in the emission layer of the light-emitting device 10 or 20 may be extracted (e.g., emitted) toward the outside through the second electrode 190, which is a semi-transmissive electrode or a transmissive electrode, and the second capping layer.

The first capping layer and the second capping layer may increase external emission efficiency according to the principle of constructive interference. Accordingly, light extraction efficiency of the light-emitting device 10 or 20 may be increased, and thus luminescence efficiency of the light-emitting device 10 or 20 may be increased.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complexe, an alkaline earth metal complexe, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include one of (e.g., one compound selected from) Compounds HT28 to HT33, CP1 to CP6, β—NPB, or any combination thereof:

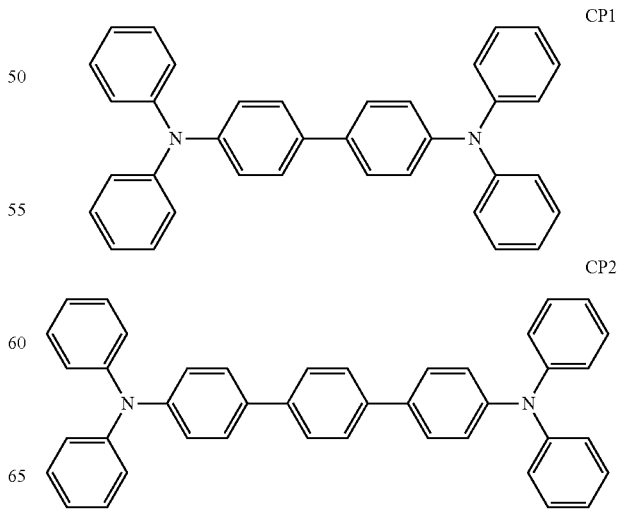

119
-continued

CP3

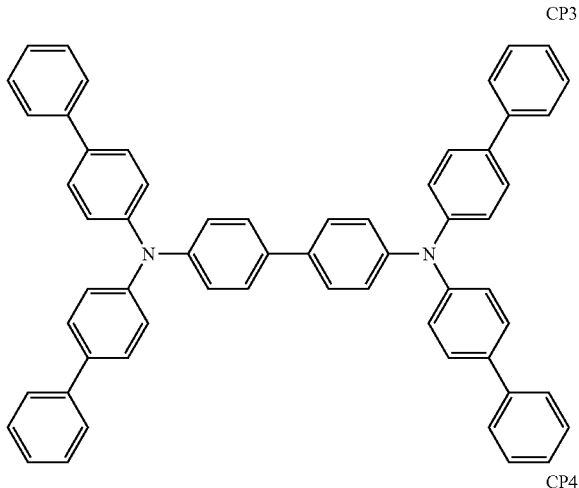

CP4

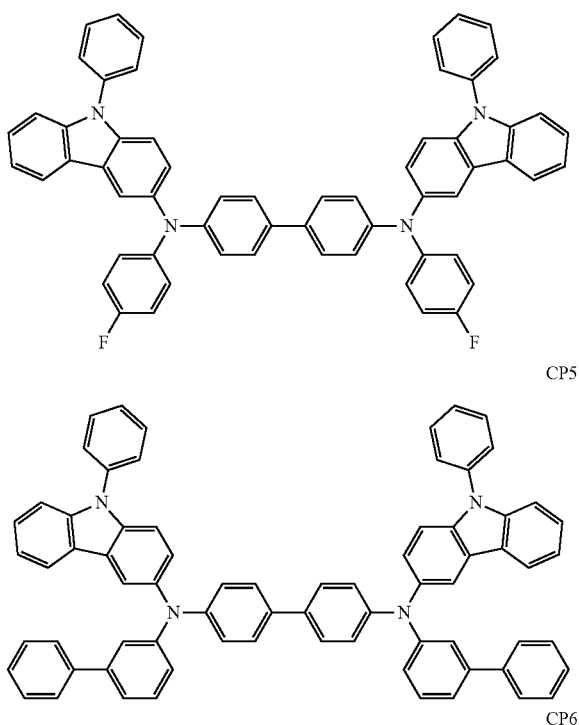

CP5

CP6

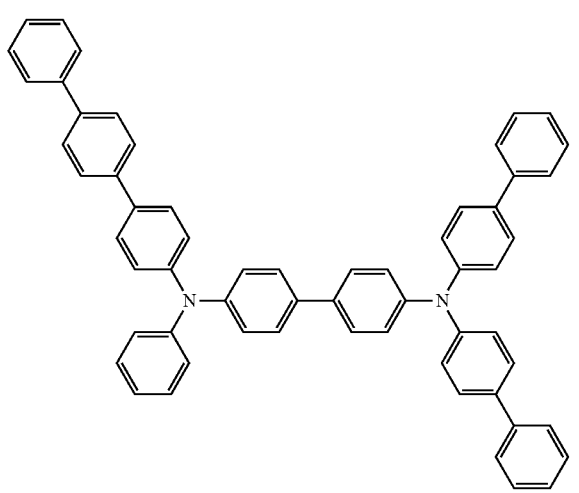

120
-continued

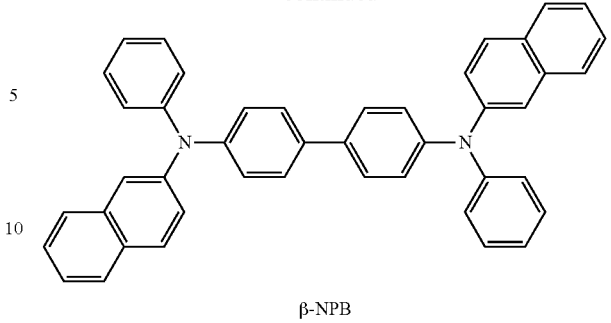

β-NPB

Electronic Apparatus

The light-emitting device may be included in various suitable electronic apparatuses. In an embodiment, the electronic apparatus including the light-emitting device may be a light-emitting apparatus, an authentication apparatus, and/or the like.

Figure 4:
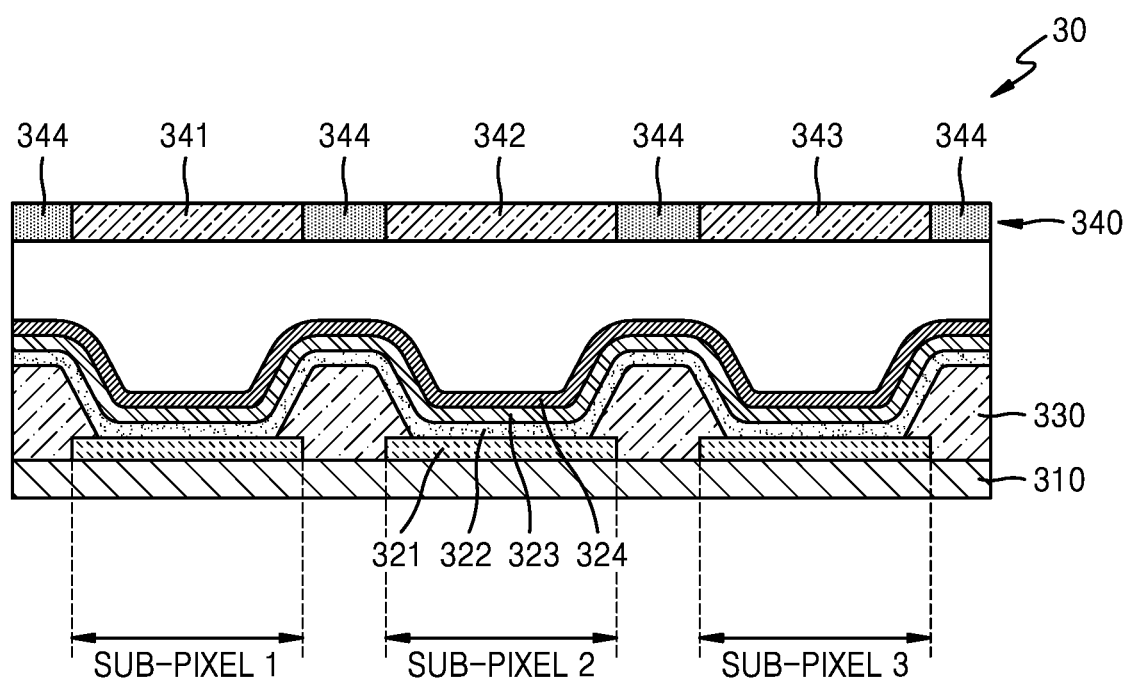
FIG. 4 is a schematic cross-sectional view of a light-emitting apparatus according to an embodiment of the present disclosure.

Referring to FIG. 4, a light-emitting apparatus 30 according to an embodiment of the present disclosure will be described in more detail.

The light-emitting apparatus 30 may include a color filter 340 located on at least one traveling direction of light emitted from the light-emitting device.

In an embodiment, the light-emitting device may include a first electrode 321, a first emission unit 322, a first charge generation layer, a second emission unit 323, and a second electrode 324. However, embodiments of the present disclosure are not limited thereto, and the light-emitting device may include three or more emission units. In an embodiment, the first emission unit 322 and the second emission unit 323 may each emit blue light, but embodiments of the present disclosure are not limited thereto.

A first substrate 310 of the light-emitting apparatus 30 may include a plurality of subpixel areas SUB-PIXEL 1, SUB-PIXEL 2, and SUB-PIXEL 3, and the color filter 340 may include a plurality of color filter areas 341, 342, and 343 corresponding to the plurality of subpixel areas SUB-PIXEL 1, SUB-PIXEL 2, and SUB-PIXEL 3. A pixel-defining film 330 may be formed between the plurality of subpixel areas SUB-PIXEL 1, SUB-PIXEL 2, and SUB-PIXEL 3 to define each of the subpixel areas SUB-PIXEL 1, SUB-PIXEL 2, and SUB-PIXEL 3. The color filter 340 may include light blocking patterns 344 between the plurality of color filter areas 341, 342, and 343.

The plurality of color filter areas 341, 342, and 343 may include a first color filter area emitting a first color light, a second color filter area emitting a second color light, and a third color filter area emitting a third color light, and the first color light, the second color light, and the third color light may have different maximum emission wavelengths. In an embodiment, the first color light may be red light, the second color light may be green light, and the third color light may be blue light, but embodiments of the present disclosure are not limited thereto.

In an embodiment, the plurality of color filter areas 341, 342, and 343 may each include a quantum dot, or only some of the plurality of color filter areas 341, 342, and 343 may include a quantum dot.

In an embodiment, the first color filter area may include a red quantum dot (e.g., red light emitting quantum dot), the second color filter area may include a green quantum dot (e.g., green light emitting quantum dot), and the third color filter area may not include a quantum dot. In this case, the light-emitting device may emit a first light, the first color filter area may absorb the first light to emit a first first-color light, the second color filter area may absorb the first light to emit a second first-color light, and the third color filter area may transmit the first light without any change. In this regard, the first first-color light, the second first-color light, and the first light may have different maximum emission wavelengths. For example, the first light may be blue light, the first first-color light may be red light, and the second first-color light may be green light, but embodiments of the present disclosure are not limited thereto.

In one or more embodiments, the first color filter area may include a red quantum dot (e.g., red light emitting quantum dot), the second color filter area may include a green quantum dot (e.g., green light emitting quantum dot), and the third color filter area may include a blue quantum dot (e.g., blue light emitting quantum dot).

In this case, the light-emitting device may emit a first light, the first color filter area may absorb the first light to emit a first first-color light, the second color filter area may absorb the first light to emit a second first-color light, and the third color filter area may absorb the first light to emit a third first-color light. In this regard, the first first-color light, the second first-color light, and the third first-color light may have different maximum emission wavelengths. In an embodiment, the first light may be blue light, the first first-color light may be red light, the second first-color light may be green light, and the third first-color light may be blue light, but embodiments of the present disclosure are not limited thereto.

The quantum dot is the same as described in the present specification.

The first color filter area, the second color filter area, and the third color filter area may each include a scatterer, but embodiments of the present disclosure are not limited thereto.

The light-emitting apparatus 30 may further include a thin-film transistor in addition to the light-emitting device as described above. The thin-film transistor may include a source electrode, a drain electrode, and an activation layer (e.g., active layer), and one of the source electrode and the drain electrode may be electrically connected to one of the first electrode 321 and the second electrode 324 of the light-emitting device.

The thin-film transistor may further include a gate electrode, a gate insulating film, etc.

The activation layer may include a crystalline silicon, an amorphous silicon, an organic semiconductor, an oxide semiconductor, and/or the like.

The light-emitting apparatus 30 may further include a sealing portion (e.g., a sealing layer) for sealing the light-emitting device. The sealing portion may be located between the color filter 340 and the light-emitting device. The sealing portion allows light from the light-emitting device to be extracted (e.g., emitted) to the outside, while concurrently or simultaneously preventing or substantially preventing ambient (e.g., external) air and/or moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter 340, according to the usage of the electronic apparatus.

Non-limiting examples of the functional layer may include a touch screen layer, a polarizing layer, and/or the like. The touch screen layer may be a pressure-sensitive touch screen layer, a capacitive touch screen layer, or an infrared touch screen layer.

The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Manufacture Method

Layers included in an emission unit and layers constituting a charge generation layer may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers included in the emission unit and layers included in the charge generation layer are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account the material to be included in the layer to be formed and the structure of the layer to be formed.

Definition of Terms

The term "$C_3$-$C_{60}$ carbocyclic group" as used herein refers to a cyclic group that consists of only carbon as a ring-forming atom and has three to sixty carbon atoms, and the term "$C_1$-$C_{60}$ heterocyclic group" as used herein refers to a cyclic group that has one to sixty carbon atoms and further includes, in addition to carbon, a heteroatom as a ring-forming atom. The $C_3$-$C_{60}$ carbocyclic group and the $C_1$-$C_{60}$ heterocyclic group may each be a monocyclic group that consists of one ring or a polycyclic group in which two or more rings are condensed with each other. In an embodiment, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-form ing moiety, and the term "π-electron-deficient nitrogen-containing $C_1$-$C_{60}$ cyclic group" as used herein refers to a heterocyclic group that has one to sixty carbon atoms and also includes *—N=*' as a ring-forming moiety.

In an embodiment, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and/or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and/or a benzothienodibenzothiophene group), the π-electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and/or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the Tr-electron-deficient nitrogen-containing $C_1$-$C_{60}$ cyclic group" as used herein each refer to a group that is a monovalent group or a polyvalent group (for example, a divalent group, a trivalent group, a tetravalent group, and/or the like), that is condensed with (e.g., combined together with) a cyclic group, according to the structure of a formula described with corresponding terms. In an embodiment, the term "benzene group" may be a benzo group, a phenyl group, a phenylene group, and/or the like, which may be easily understood by one of ordinary skill in the art according to the structure of a formula including the "benzene group."

In an embodiment, non-limiting examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and non-limiting examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and/or a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and/or a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at a terminal end (e.g., the terminus) of a $C_2$-$C_{60}$ alkyl group, and non-limiting examples thereof include an ethenyl group, a propenyl group, and/or a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at a terminal end (e.g., the terminus) of a $C_2$-$C_{60}$ alkyl group, and non-limiting examples thereof include an ethynyl group and/or a propynyl group. The term "$C_2$-$C_{60}$ alkynylene group" as used herein refers to a divalent group having the same structure as the $C_2$-$C_{60}$ group.

The term "$C_1$-$C_{60}$ alkoxy group" as used herein refers to a monovalent group represented by —O$A_{101}$ (wherein $A_{101}$ is the $C_1$-$C_{60}$ alkyl group), and non-limiting examples thereof include a methoxy group, an ethoxy group, and/or an isopropyloxy group.

The term "$C_3$-$C_{10}$ cycloalkyl group" as used herein refers to a monovalent saturated hydrocarbon cyclic group having 3 to 10 carbon atoms, and non-limiting examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and/or a bicyclo[2.2.2] octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to 1 to 10 carbon atoms, at least one heteroatom as a ring-forming atom and non-limiting examples thereof include a 1,2,3,4-oxatriazolidinyl group, a tetrahydrofuranyl group, and/or a tetrahydrothienyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and non-limiting examples thereof include a cyclopentenyl group, a cyclohexenyl group, and/or a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to 1 to 10 carbon atoms, at least one heteroatom as a ring-forming atom, and at least one carbon-carbon double bond in the cyclic structure thereof. Non-limiting examples of the $C_1$-$C_{10}$ heterocycloalkenyl group include a 4,5-dihydro-1,2,3,4-oxatriazolylgroup, a 2,3-dihydrofuranyl group, and/or a 2,3-dihydrothienyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ group" as used herein refers to a divalent group having a carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and/or an ovalenyl group. When the $C_6$-$C_{60}$ aryl group and the $C_6$-$C_{60}$ arylene group each include two or more rings, the two or more rings may be condensed to each other.

The term "$C_1$-$C_{60}$ heteroaryl group" as used herein refers to a monovalent group having a heterocyclic aromatic system that has, in addition to 1 to 60 carbon atoms, at least one heteroatom as a ring-forming atom. The term "$C_1$-$C_{60}$ heteroarylene group" as used herein refers to a divalent group having a heterocyclic aromatic system that has, in addition to 1 to 60 carbon atoms, at least one heteroatom as a ring-forming atom. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiofuranyl group, and/or a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group having two or more rings condensed with each other, only carbon atoms (for example, 8 to 60 carbon atoms) as ring-forming atoms, and no aromaticity in its entire molecular structure when considered as a whole (e.g., the entire molecular structure is not aromatic). Non-limiting examples of the monovalent non-aromatic condensed polycyclic group include an indenyl group, a spiro-bifluorenyl group, a benzofluorenyl group, an indenophenanthrenyl group, an adamantyl group, and/or an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, 1 to 60 carbon atoms), as a ring-forming atom, and non-aromaticity in its molecular structure when considered as a whole (e.g., the entire molecular structure is not aromatic). Non-limiting examples of the monovalent non-aromatic condensed heteropolycyclic group include an azaadamantyl group, a 9,9-dihydroacridinyl group and/or a 9H-xanthenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to a monovalent group represented by —O$A_{102}$ (wherein $A_{102}$ is the $C_6$-$C_{60}$ aryl group), and the term "$C_6$-$C_{60}$ arylthio group" as used herein refers to a monovalent group represented by —S$A_{103}$ (wherein $A_{103}$ is the $C_6$-$C_{60}$ aryl group).

The term "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{ii}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($O_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($O_{21}$)($O_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Non-limiting examples of the heteroatom include O, S, N, P, Si, B, Ge, Se, or any combination thereof.

The term "Ph" as used herein refers to a phenyl group, the term "Me" as used herein refers to a methyl group, the term "Et" as used herein refers to an ethyl group, the term "tert-Bu" or "But" as used herein refers to a tert-butyl group, and the term "OMe" as used herein refers to a methoxy group.

The term "biphenyl group" as used herein refers to "a phenyl group substituted with a phenyl group." The "biphenyl group" is a substituted phenyl group having a $C_6$-$C_{60}$ aryl group as a substituent.

The term "terphenyl group" as used herein refers to "a phenyl group substituted with a biphenyl group." The "terphenyl group" is a substituted phenyl group having, as a substituent, a $C_6$-$C_{60}$ aryl group substituted with a $C_6$-$C_{60}$ aryl group.

EXAMPLES

Example 1

A 15 $\Omega$/cm$^2$ (1,200 Å) ITO/Ag/ITO glass substrate (a product of Corning Inc.) was cut to a size of 50 mm×50 mm×0.7 mm, sonicated with isopropyl alcohol and pure water each for 5 minutes, and then cleaned by irradiation of ultraviolet rays and exposure of ozone thereto for 30 minutes. The resultant glass substrate was loaded onto a vacuum deposition apparatus.

Formation of First Emission Unit

CsI and CuI were co-deposited on the ITO/Ag/ITO anode of the glass substrate to a volume ratio of 9:1 to form a hole injection layer (inorganic mixed layer) having a thickness of 5 nm, HT3 was deposited on the inorganic mixed layer to form a first hole transport layer having a thickness of 30 nm, TCTA was deposited on the first hole transport layer to form a second hole transport layer having a thickness of 5 nm, H18 and FD37 were co-deposited on the second hole transport layer to a volume ratio of 98:2 to form an emission layer having a thickness of 17 nm, ET46 was deposited on the emission layer to form a first electron transport layer having a thickness of 5 nm, and ET47 and Liq were co-deposited on the first electron transport layer to a volume ratio of 1:1 to form a second electron transport layer having a thickness of 35 nm, thereby completing formation of a first emission unit.

Formation of First Charge Generation Layer

ET38 and Li were co-deposited on the first emission unit to a volume ratio of 99:1 to form an n-type charge generation layer having a thickness of 5 nm, and HT3 and NDP-9 were co-deposited thereon to a volume ratio of 93:7 to form a p-type charge generation layer having a thickness of 10 nm, thereby completing formation a first charge generation layer.

Formation of Second Emission Unit

HT3 and CuI were co-deposited on the first charge generation layer to a volume ratio of 97:3 to form a hole injection layer having a thickness of 7.5 nm. HT3 was deposited on the hole injection layer to form a first hole transport layer having a thickness of 54 nm, TCTA was deposited on the first hole transport layer to form a second hole transport layer having a thickness of 5 nm, H18 and FD37 were co-deposited on the second hole transport layer to a volume ratio of 98:2 to form an emission layer having a thickness of 17 nm, ET46 was deposited on the emission layer to form a first electron transport layer having a thickness of 5 nm, and ET47 and Liq were co-deposited on the first electron transport layer to a volume ratio of 1:1 to form a second electron transport layer having a thickness of 25 nm, thereby completing formation of a second emission unit.
Formation of Second Charge Generation Layer
ET38 and Li were co-deposited on the second emission unit to a volume ratio of 99:1 to form an n-type charge generation layer having a thickness of 5 nm, and HT3 and NDP-9 were co-deposited thereon to a volume ratio of 93:7 to form a p-type charge generation layer having a thickness of 10 nm, thereby completing formation a second charge generation layer.
Formation of Third Emission Unit
HT3 and CuI were co-deposited on the second charge generation layer to a volume ratio of 97:3 to form a hole injection layer having a thickness of 7.5 nm. HT3 was deposited on the hole injection layer to form a first hole transport layer having a thickness of 44.5 nm, TCTA was deposited on the first hole transport layer to form a second hole transport layer having a thickness of 5 nm, H18 and FD37 were co-deposited on the second hole transport layer to a volume ratio of 98:2 to form an emission layer having a thickness of 17 nm, ET46 was deposited on the emission layer to form a first electron transport layer having a thickness of 5 nm, ET47 and Liq were co-deposited on the first electron transport layer to a volume ratio of 1:1 to form a second electron transport layer having a thickness of 35 nm, and KI and Yb were co-deposited on the second electron transport layer to a volume ratio of 9:1 to form an electron injection layer having a thickness of 1.1 nm, thereby completing formation of a third emission unit.

Ag and Mg were co-deposited on the third emission unit to a volume ratio of 9:1 to form a cathode having a thickness of 10 nm, thereby completing manufacture of a light-emitting device.

Comparative Example 1

A light-emitting device was manufactured in the same manner as in Example 1, except that, in forming the first emission unit, instead of CsI and CuI, HT3 was solely utilized in the hole injection layer.

Comparative Example 2

A light-emitting device was manufactured in the same manner as in Example 1, except that, in forming the first emission unit, instead of CsI, HT3 was utilized in the hole injection layer.

Comparative Example 3

A light-emitting device was manufactured in the same manner as in Example 1, except that, in forming the first emission unit, instead of CsI and CuI, CsI was solely utilized in the hole injection layer.

Evaluation Example 1

The initial driving voltage, change in the driving voltage, luminescence efficiency, lifespan, and CIE color coordinate of each of the light-emitting devices manufactured in Example 1 and Comparative Examples 1 to 3 were measured by utilizing Keithley SMU 236 and a luminance meter PR650, and results thereof are shown in Table 1. The lifespan ($T_{97}$) is a period of time that was taken until the luminance (@400 nit) was reduced to 97% from an initial luminance (100%) after a light-emitting device was driven. The change in the driving voltage is a difference between the initial driving voltage and the driving voltage measured after 500 hours of driving the light-emitting device.

TABLE 1

| | Hole injection layer | Initial driving voltage (V) | Change in driving voltage (V) | Luminescence efficiency (cd/A) | Lifespan ($T_{97}$) (hr) | Color coordinate (y) |
|---|---|---|---|---|---|---|
| Example 1 | CsI:CuI | 10.8 | 0.4 | 27.8 | 570 | 0.131 |
| Comparative Example 1 | HT3 | 12.5 | 3.5 | 23.4 | 300 | 0.121 |
| Comparative Example 2 | HT3:CuI | 11.3 | 1.1 | 22.1 | 450 | 0.125 |
| Comparative Example 3 | CsI | 12.2 | 1.5 | 22.5 | 360 | 0.132 |

From Table 1, the light-emitting device of Example 1 has a smaller change in the driving voltage and improved characteristics in terms of luminescence efficiency and lifespan, compared to the light-emitting devices of Comparative Examples 1 to 3.

The light-emitting device may easily adjust hole injection and may have high efficiency and long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:
1. A light-emitting device comprising:
a first electrode;
a second electrode facing the first electrode;
m emission units sequentially stacked between the first electrode and the second electrode and comprising an emission layer; and
m−1 charge generation layers each located between two neighboring emission units from among the m emission units,
wherein m is an integer of 2 or more, at least one of the m emission units comprises an inorganic mixed layer between the first electrode and the emission layer, the inorganic mixed layer comprises an inorganic insulating material and an inorganic semiconductor material, and at least another one of the m emission units comprises a hole injection layer comprising a hole transporting organic compound mixed together with an inorganic semiconductor material at a volume ratio of 99:1 to 80:20.

2. The light-emitting device of claim 1, wherein
the first electrode is an anode,
the second electrode is a cathode, and
a first emission unit, closest to the first electrode from among the m emission units, comprises the inorganic mixed layer.

3. The light-emitting device of claim 1, wherein
the first electrode is an anode,
the second electrode is a cathode,
a first emission unit closest to the first electrode from among the m emission units comprises a first emission layer and a first hole transport region between the first electrode and the first emission layer, and
the first hole transport region comprises the inorganic mixed layer.

4. The light-emitting device of claim 3, wherein the inorganic mixed layer is directly contacting the first electrode.

5. The light-emitting device of claim 3, wherein the first hole transport region further comprises a first hole transport layer and a second hole transport layer, which are between the first emission layer and the inorganic mixed layer, and
the second hole transport layer is between the first hole transport layer and the first emission layer.

6. A light-emitting device comprising:
a first electrode;
a second electrode facing the first electrode;
m emission units sequentially stacked between the first electrode and the second electrode and comprising an emission layer; and
m−1 charge generation layers each located between two neighboring emission units from among the m emission units,
wherein m is an integer of 2 or more,
at least one of the m emission units comprises an inorganic mixed layer between the first electrode and the emission layer,
the inorganic mixed layer comprises an inorganic insulating material and an inorganic semiconductor material,
the first electrode is an anode,
the second electrode is a cathode,
an $n^{th}$ emission unit from among the m emission units comprises the inorganic mixed layer, and
n is an integer satisfying 1<n≤m, and
at least another one of the m emission units comprises a hole injection layer comprising a hole transporting organic compound mixed together with an inorganic semiconductor material at a volume ratio of 99:1 to 80:20.

7. The light-emitting device of claim 1, wherein
the first electrode is an anode,
the second electrode is a cathode,
an $n^{th}$ emission unit from among the m emission units comprises an $n^{th}$ emission layer and an $n^{th}$ hole transport region between the first electrode and the $n^{th}$ emission layer,
n is an integer satisfying 1<n≤m, and
the $n^{th}$ hole transport region comprises the inorganic mixed layer.

8. The light-emitting device of claim 1, wherein the inorganic insulating material comprises a halide of an alkali metal, a halide of an alkaline earth metal, a halide of a lanthanide metal (III), a halide of a Group 13 post-transition metal, or any combination thereof.

9. The light-emitting device of claim 1, wherein the inorganic insulating material comprises a fluoride of an alkali metal, a chloride of an alkali metal, a bromide of an alkali metal, an iodide of an alkali metal, a fluoride of an alkaline earth metal, a chloride of an alkaline earth metal, a bromide of an alkaline earth metal, an iodide of an alkaline earth metal, a fluoride of a lanthanide metal (III), a chloride of a lanthanide metal (III), a bromide of a lanthanide metal (III), an iodide of a lanthanide metal (III), a fluoride of a Group 13 post-transition metal, a chloride of a Group 13 post-transition metal, a bromide of a Group 13 post-transition metal, an iodide of a Group 13 post-transition metal, or any combination thereof.

10. The light-emitting device of claim 1, wherein the inorganic semiconductor material comprises a halide of a transition metal; a halide of a Group 14, Group 15, or Group 16 post-transition metal; a halide of a lanthanide metal (II); tellurium (Te); a telluride of a transition metal; a telluride of a post-transition metal; a telluride of a lanthanide metal (II); selenium (Se); a selenide of a transition metal; a selenide of a post-transition metal; a selenide of a lanthanide metal (II); or any combination thereof.

11. The light-emitting device of claim 1, wherein a volume ratio of the inorganic insulating material to the inorganic semiconductor material is in a range of 99:1 to 50:50.

12. The light-emitting device of claim 1, wherein a thickness of the inorganic mixed layer is in a range of 1 Å to 200 Å.

13. The light-emitting device of claim 1, wherein
the m−1 charge generation layers each include an n-type charge generation layer and a p-type charge generation layer, the n-type charge generation layer comprises a first material and a second material,
the first material comprises an electron transporting organic compound, and
the second material comprises an alkali metal, an alkaline earth metal, a lanthanide metal, a transition metal, a post-transition metal, or any combination thereof.

14. The light-emitting device of claim 1, wherein
the m−1 charge generation layers each comprise an n-type charge generation layer and a p-type charge generation layer,
the p-type charge generation layer comprises a third material and a fourth material,
the third material comprises a hole transporting organic compound, and
the fourth material comprises a post-transition metal, an inorganic semiconductor material, a charge-generation material, or any combination thereof.

15. The light-emitting device of claim 1, wherein
the first electrode is an anode,
the second electrode is a cathode,
the m emission units each further comprise a hole transport region between the first electrode and the emission layer and an electron transport region between the emission layer and the second electrode, the hole transport region of each of the m emission units comprises a hole injection layer, a hole transport layer, an emission auxiliary layer, an electron blocking layer, or any combination thereof, and the electron transport region of each of the m emission units comprises a buffer layer, a hole blocking layer, an electron control layer, an electron transport layer, an electron injection layer, or any combination thereof.

16. The light-emitting device of claim 15, wherein at least another one of the hole transport regions of the m emission units comprises a hole injection layer, and the hole injection layer comprises a hole transporting organic compound or comprises a hole transporting organic compound and an inorganic semiconductor material.

17. The light-emitting device of claim 1, wherein m is 4, the m emission units comprise a first emission unit, a second emission unit, a third emission unit, and a fourth emission unit, which are sequentially stacked in a direction from the first electrode to the second electrode, three emission units from among the first to fourth emission units are to emit a first-color light, and a remaining emission unit is to emit a second-color light, and the first-color light and the second-color light have different maximum emission wavelengths.

18. An electronic apparatus comprising the light-emitting device of claim 1.

19. The electronic apparatus of claim 18, further comprising a thin-film transistor comprising a source electrode, a drain electrode, and an activation layer, wherein the first electrode of the light-emitting device is in electrical connection with one selected from the source electrode and the drain electrode of the thin-film transistor.

20. The electronic apparatus of claim 19, further comprising a color filter and/or a color conversion layer, each located on a path of light to be emitted from the light-emitting device.

* * * * *